United States Patent
Ichinose et al.

(10) Patent No.: US 10,143,074 B2
(45) Date of Patent: Nov. 27, 2018

(54) FILTER AND TARGET SUPPLY APPARATUS

(71) Applicant: GIGAPHOTON INC., Oyama-shi, Tochigi (JP)

(72) Inventors: Tomohide Ichinose, Oyama (JP); Fumio Iwamoto, Oyama (JP); Yutaka Shiraishi, Oyama (JP); Tsukasa Hori, Oyama (JP); Hideo Hoshino, Oyama (JP)

(73) Assignee: Gigaphoton Inc., Tochigi (JP)

( * ) Notice: Subject to any disclaimer, the term of this patent is extended or adjusted under 35 U.S.C. 154(b) by 154 days.

(21) Appl. No.: 14/992,477

(22) PCT Filed: Jun. 13, 2014

(86) PCT No.: PCT/JP2014/065683
§ 371 (c)(1),
(2) Date: Jan. 11, 2016

(87) PCT Pub. No.: WO2015/015922
PCT Pub. Date: Feb. 5, 2015

(65) Prior Publication Data
US 2016/0227637 A1 Aug. 4, 2016

(30) Foreign Application Priority Data

Aug. 1, 2013 (JP) ................................. 2013-160574

(51) Int. Cl.
*H05G 2/00* (2006.01)
*B01D 25/00* (2006.01)
(Continued)

(52) U.S. Cl.
CPC ............ *H05G 2/006* (2013.01); *B01D 25/16* (2013.01); *B01D 29/46* (2013.01); *B01D 46/406* (2013.01);
(Continued)

(58) Field of Classification Search
None
See application file for complete search history.

(56) References Cited

U.S. PATENT DOCUMENTS 5,437,651 A * 8/1995 Todd .................. A61M 1/0088
15/420
5,843,767 A 12/1998 Beattie
(Continued)

FOREIGN PATENT DOCUMENTS

JP 2001-089789 A 4/2001
JP 2002-361007 A 12/2002
(Continued)

OTHER PUBLICATIONS

International Preliminary Report on Patentability (Chapter I) and Translation of Written Opinion of the International Searching Authority; PCT/JP2014/065683 dated Feb. 2, 2016.
(Continued)

*Primary Examiner* — Benjamin M Kurtz
(74) *Attorney, Agent, or Firm* — Studebaker & Brackett PC

(57) ABSTRACT

A filter may include: a first member having a first surface provided with a channel; and a second member set with a second surface thereof covering the channel. The first member may include a first passable portion that allows a fluid to pass between the first surface and a first space, which is defined beside a surface of the first member opposite to the first surface, through a first area of the channel. The second member may include a second passable portion that allows the fluid to pass between the second surface and a second space, which is defined beside a surface of the second member opposite to the second surface, through a second area of the channel distanced from the first area.

22 Claims, 31 Drawing Sheets

(51) Int. Cl.
*B01D 46/40* (2006.01)
*B01D 29/46* (2006.01)
*G03F 7/20* (2006.01)

(52) U.S. Cl.
CPC ......... *G03F 7/70191* (2013.01); *H05G 2/005* (2013.01)

(56) References Cited

U.S. PATENT DOCUMENTS

| | | |
|---|---|---|
| 2006/0192155 A1 | 8/2006 | Algots et al. |
| 2006/0219627 A1* | 10/2006 | Rodgers ............. A61F 9/00781 210/498 |
| 2011/0139707 A1 | 6/2011 | Siwy et al. |
| 2012/0292527 A1 | 11/2012 | Fomenkov et al. |

FOREIGN PATENT DOCUMENTS

| | | |
|---|---|---|
| JP | 2013-070040 A | 4/2013 |
| JP | 2013-140771 A | 7/2013 |

OTHER PUBLICATIONS

International Search Report and Written Opinion—PCT/JP2014/065683 dated Aug. 5, 2014.
An Office Action; mailed by the Japanese Patent Office dated Mar. 7, 2018, which corresponds to Japanese Patent Application No. 2015-529445 and is related to U.S. Appl. No. 14/992,477; with its English translation.

\* cited by examiner

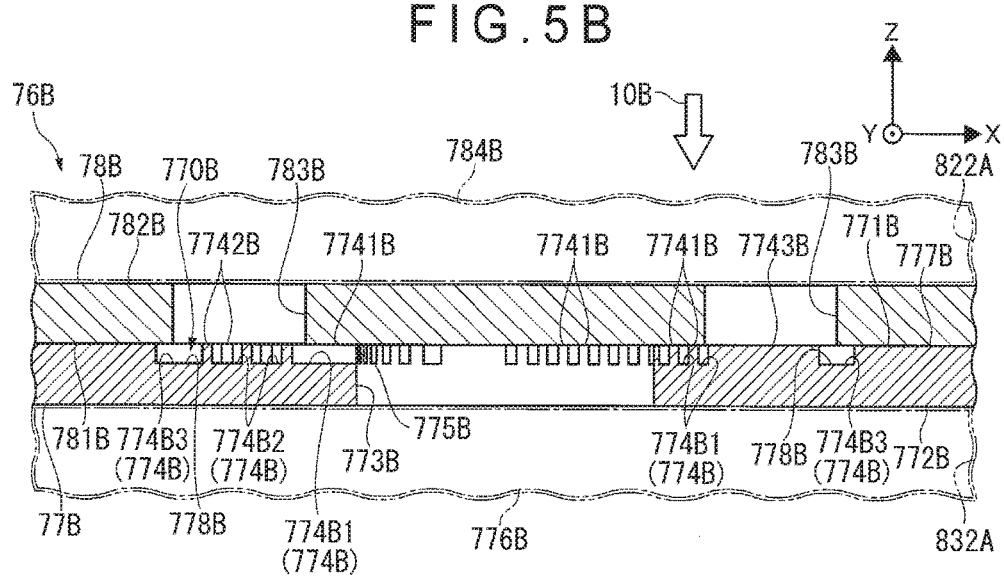
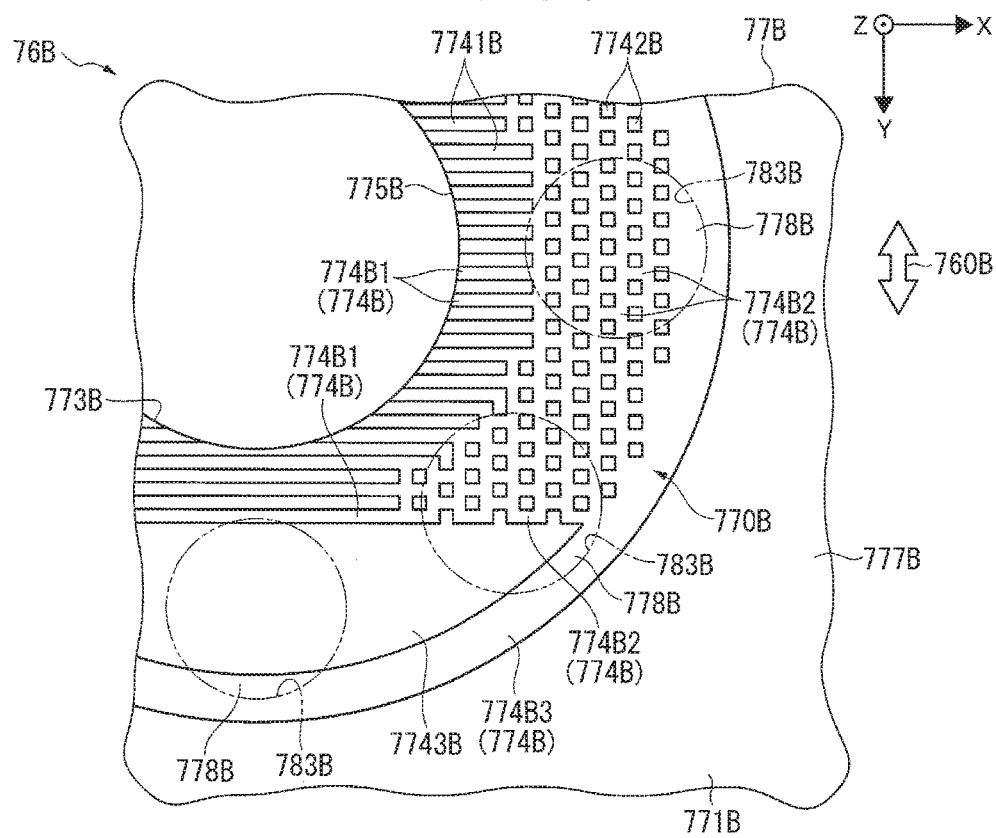

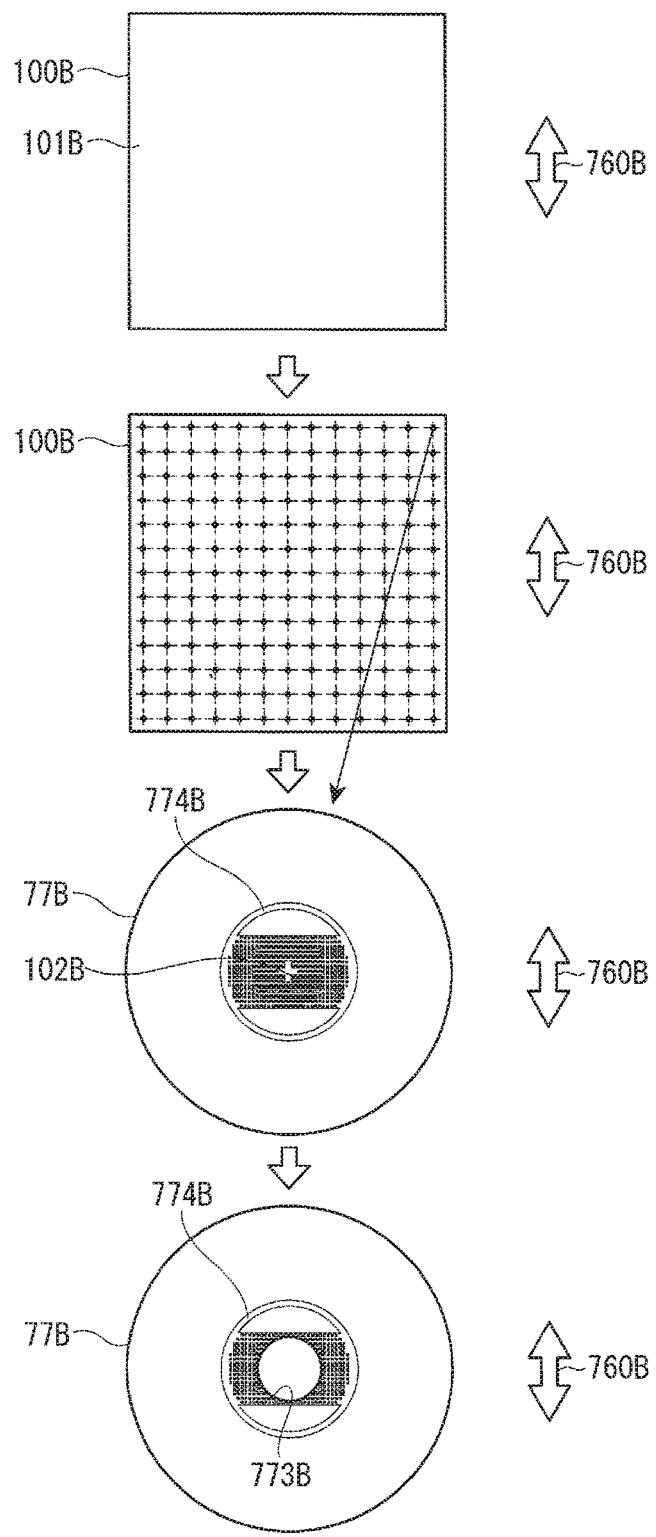

FILTER AND TARGET SUPPLY APPARATUS

CROSS-REFERENCE TO RELATED APPLICATIONS

This application claims priority to Application No. PCT/JP2014/065683 filed on Jun. 13, 2014, which application claims priority to Japanese Application No. 2013-160574 filed on Aug. 1, 2013. The entire contents of the above applications are incorporated herein by reference in their entireties.

BACKGROUND

1. Technical Field

The present disclosure relates to a filter and a target supply device.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 70 nm to 45 nm and, further, microfabrication with feature sizes of 32 nm or less will be required Accordingly, in order to meet the demand for microfabrication with feature sizes of 32 nm or less, for example, an exposure apparatus is needed in which a system for generating an extreme ultraviolet light (hereinafter, occasionally referred to as "EUV light") at a wavelength of approximately 13 nm is combined with a reduced projection reflective optical system.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used to generate plasma.

SUMMARY

According to a first aspect of the present disclosure, a filter may include: a first member having a first surface provided with a channel; and a second member set with a second surface thereof covering the channel, the first member including a first passable portion that allows a fluid to pass between the first surface and a first space, which is defined beside a surface of the first member opposite to the first surface, through a first area of the channel, the second member including a second passable portion that allows the fluid to pass between the second surface and a second space, which is defined beside a surface of the second member opposite to the second surface, through a second area of the channel distanced from the first area.

According to a second aspect of the present disclosure, a target supply device may include: a target generator including a nozzle provided with a nozzle hole through which a target material is outputted, the target generator being configured to contain a target material; and a filter being disposed in the target generator to restrain the nozzle hole from being clogged with a foreign material contained in the target material, the filter including: a first member having a first surface provided with a channel; and a second member set with a second surface thereof covering the channel, the first member including a first passable portion that allows the target material to pass between the first surface and a first space, which is defined beside a surface of the first member opposite to the first surface, through a first area of the channel, the second member including a second passable portion that allows the target material to pass between the second surface and a second space, which is defined beside a surface of the second member opposite to the second surface, through a second area of the channel distanced from the first area.

BRIEF DESCRIPTION OF THE DRAWINGS

Hereinafter, selected exemplary embodiments of the present disclosure will be described with reference to the accompanying drawings.

FIG. 5B is a sectional view taken along the line B-B in FIG. 5A.

FIG. 5C schematically illustrates a channel in the second filter in the +Z direction.

FIG. 6 schematically illustrates a manufacturing method of a first member.

DETAILED DESCRIPTION

Contents

Figure 1:
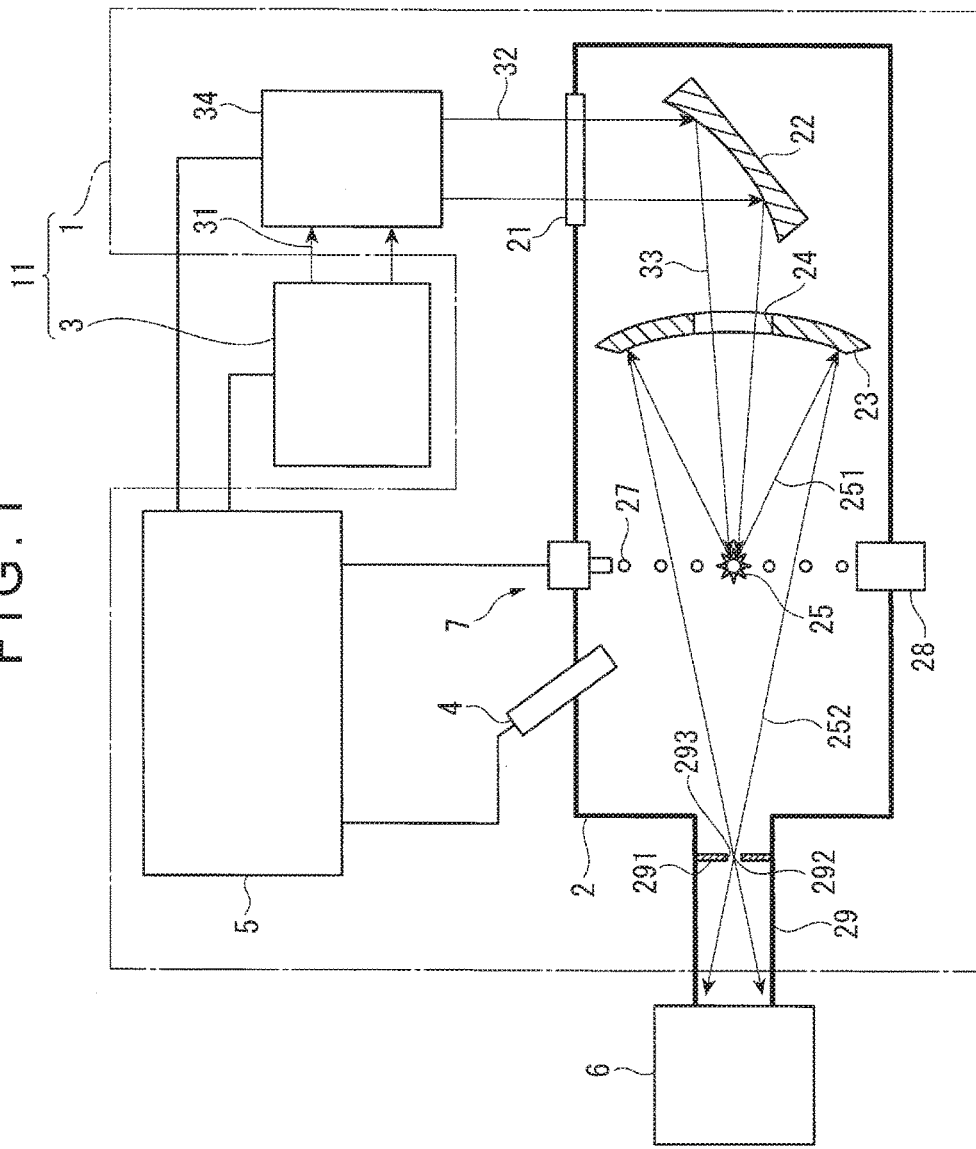
FIG. 1 schematically illustrates a configuration of an LPP-type EUV light generation apparatus.

1. Overview
2. Overall Description of EUV Light Generation Apparatus
2.1 Configuration
2.2 Operation
3. EUV Light Generation System Including Target Supply Device
3.1. Explanation of Terms
3.2 First Exemplary Embodiment
3.2.1 Overview
3.2.2 Configuration
3.2.3 Operation
3.2.3.1 Installation of Filter
3.2.3.2 Operation of Target Supply Device
3.3 Second Exemplary Embodiment
3.3.1 Overview
3.3.2 Configuration
3.3.3 Operation
3.3.3.1 Manufacturing Method of Filter and Installation of Filter
3.3.3.2 Operation of Target Supply Device
3.4 Third Exemplary Embodiment
3.4.1 Configuration
3.4.2 Operation
3.4.2.1 Manufacturing Method of Filter and Installation of Filter
3.4.2.2 Operation of Target Supply Device
3.5 Fourth Exemplary Embodiment
3.5.1 Overview
3.5.2 Configuration
3.5.3 Operation
3.5.3.1 Manufacturing Method of Filter and Installation of Filter
3.5.3.2 Operation of Target Supply Device
3.6 Fifth Exemplary Embodiment
3.6.1 Overview
3.6.2 Configuration
3.6.3 Operation
3.6.3.1 Manufacturing Method of Filter and Installation of Filter
3.6.3.2 Operation of Target Supply Device
3.7 Sixth Exemplary Embodiment
3.7.1 Overview
3.7.2 Configuration
3.7.3 Operation
3.7.3.1 Manufacturing Method of Filter and Installation of Filter
3.7.3.2 Operation of Target Supply Device
3.8 Seventh Exemplary Embodiment
3.8.1 Overview
3.8.2 Configuration
3.8.3 Operation
3.8.3.1 Installation of Filter
3.8.3.2 Operation of Target Supply Device
3.9 Eighth Exemplary Embodiment
3.9.1 Configuration
3.9.2 Operation
3.9.2.1 Installation of Filter
3.9.2.2 Operation of Target Supply Device
3.10 Ninth Exemplary Embodiment
3.10.1 Configuration
3.10.2 Operation
3.11 Tenth Exemplary Embodiment
3.11.1 Overview
3.11.2 Configuration
3.11.3 Operation
3.12 Modification(s)
3.12.1 First Modification
3.12.2 Second Modification
3.12.3 Third Modification 3.12.4 Fourth Modification
3.12.5 Fifth Modification
3.12.6 Sixth Modification
3.12.7 Seventh Modification
3.12.8 Eighth Modification
3.12.9 Other Modification(s)

Hereinafter, selected exemplary embodiments of the present disclosure will be described in detail with reference to the accompanying drawings. The exemplary embodiments to be described below are merely illustrative in nature and do not limit the scope of the present disclosure. Further, the configuration(s) and operation(s) described in each embodiment are not all essential in implementing the present disclosure. In describing exemplary embodiments with reference to the drawings except FIG. 1, components shown in FIG. 1 but unessential for the present disclosure are occasionally not shown in these drawings. Note that like elements are referenced by like reference numerals and characters, and duplicate descriptions thereof will be omitted herein.

1. Overview

In the exemplary embodiments of the present disclosure, a filter may include: a first member having a first surface defining a channel; and a second member having a second surface covering the channel. The first member may include a first passable portion that allows a fluid to flow between the first surface and a first space, which is defined beside a surface of the first member opposite to the first surface, through a first area of the channel. The second member may include a second passable portion that allows the fluid to flow between the second surface and a second space, which is defined beside a surface of the second member opposite to the second surface, through a second area of the channel distanced from the first area.

In the exemplary embodiments of the present disclosure, the target supply device may include: a nozzle provided with a nozzle hole through which a target material is discharged; a target generator containing the target material therein; and a filter provided in the target generator to prevent a foreign substance in the target material from becoming stuck in the nozzle hole. The filter may include a first member and a second member. The first member may include a first passable portion that allows a fluid to flow between the first surface and a first space, which is defined beside a surface of the first member opposite to the first surface, through a first area of the channel. The second member may include a second passable portion that allows a fluid to flow between the second surface and a second space, which is defined beside a surface of the second member opposite to the second surface, through a second area of the channel distanced from the first area.

2. Overall Description of EUV Light Generation Apparatus

2.1 Configuration

FIG. 1 schematically illustrates an exemplary configuration of an LPP-type EUV light generation system. An EUV light generation apparatus 1 may be used with at least one laser apparatus 3. Herein, a system that includes the EUV light generation apparatus 1 and the laser apparatus 3 may be referred to as EUV light generation system 11. As shown in FIG. 1 and described in detail below, the EUV light generation apparatus 1 may include a chamber 2 and a target supply device 7. The chamber 2 may be sealed airtight. The target supply device 7 may be mounted through a wall of the chamber 2. A target material to be supplied by the target supply device 7 may include, but not limited to, any one of tin, terbium, gadolinium, lithium and xenon, or a combination of any two or more of them.

The wall of the chamber 2 may be provided with at least one through-hole. The through-hole may be provided with a window 21, through which a pulse laser beam 32 outputted from the laser apparatus 3 may pass. An EUV collector mirror 23 having, for example, a spheroidal reflective surface may be provided in the chamber 2. The EUV collector mirror 23 may have a first focus and a second focus. The EUV collector mirror 23 may have a surface provided with a multi-layered reflective film formed by alternately laminating molybdenum and silicon layers. The EUV collector mirror 23 may preferably be disposed so that the first focus lies in a plasma generation region 25, and the second focus lies in an intermediate focus (IF) 292. The EUV collector mirror 23 may have a through-hole 24 formed at the center thereof, and a pulse laser beam 33 may travel through the through-hole 24.

The EUV light generation apparatus 1 may further include, for instance, an EUV light generation control unit 5 and a target sensor 4. The target sensor 4 may have an imaging function, and may detect, for instance, the existence, locus, position and speed of a droplet (target) 27.

Further, the EUV light generation apparatus 1 may include a connection part 29 for bringing the interior of the chamber 2 in communication with the interior of an exposure apparatus 6. A wall 291 having an aperture 293 may be provided in the connection part 29. The wall 291 may be disposed so that the second focus of the EUV collector mirror 23 lies in the aperture 293 of the wall 291.

Further, the EUV light generation apparatus 1 may also include a laser beam direction control unit 34, a laser beam focusing mirror 22, and a target collector 28 for collecting the droplet 27. The laser beam direction control unit 34 may include an optical element for determining a travel direction of the laser beam, and an actuator for adjusting, for instance, the position and/or posture of the optical element.

2.2 Operation

With continued reference to FIG. 1, a pulse laser beam 31 outputted from the laser apparatus 3 may pass through the laser beam direction control unit 34, and be outputted therefrom as the pulse laser beam 32 through the window 21 into the chamber 2. The pulse laser beam 32 may travel inside the chamber 2 along at least one beam path, be reflected by the laser beam focusing mirror 22, and strike at least one droplet 27 as the pulse laser beam 33.

The target supply device 7 may output the droplet 27 to the plasma generation region 25 inside the chamber 2. The droplet 27 may be irradiated with at least one pulse of the pulse laser beam 33. Upon being irradiated with the pulse laser beam 33, the droplet 27 may be turned into plasma, from which radiation light 251 may be emitted. EUV light 252 contained in the radiation light 251 may be selectively reflected by the EUV collector mirror 23. The EUV light 252 reflected by the EUV collector mirror 23 may be focused on the intermediate focus 292 and be outputted to the exposure apparatus 6. Here, the droplet 27 may be irradiated with multiple pulses included in the pulse laser beam 33.

The EUV light generation control unit 5 may integrally control the EUV light generation system 11. The EUV light generation control unit 5 may process, for instance, image data of the droplet 27 captured by the target sensor 4. The EUV light generation control unit 5 may control, for instance, the timing when the target 27 is outputted and/or the direction where the target 27 is outputted. The EUV light generation control unit 5 may also control, for instance, the timing when the laser apparatus 3 oscillates, the direction where the pulse laser beam 32 travels, and/or the position at which the pulse laser beam 33 is focused. It should be appreciated that the various controls described above are merely examples, and other controls may be added as necessary.

3. EUV Light Generation System Including Target Supply Device

3.1. Explanation of Terms

In the description hereinafter with reference to the drawings except FIG. 1, a direction is occasionally defined based on an X-, Y- and Z-axes shown in the drawings.

It should be noted that the above expression has nothing to do with a relationship with a gravity direction 10B.

3.2 First Exemplary Embodiment

3.2.1 Overview

In a nozzle of the first exemplary embodiment of the present disclosure, a first passable portion may be provided by a first through-hole penetrating through a first member.

In the nozzle of the first exemplary embodiment of the present disclosure, the first through-hole may penetrate through a substantial center of the first member.

In the nozzle of the first exemplary embodiment of the present disclosure, a second passable portion may be a second through-hole penetrating through a second member.

In the nozzle of the first exemplary embodiment of the present disclosure, a channel may be in the form of a groove provided to a first surface.

3.2.2 Configuration

Figure 2:
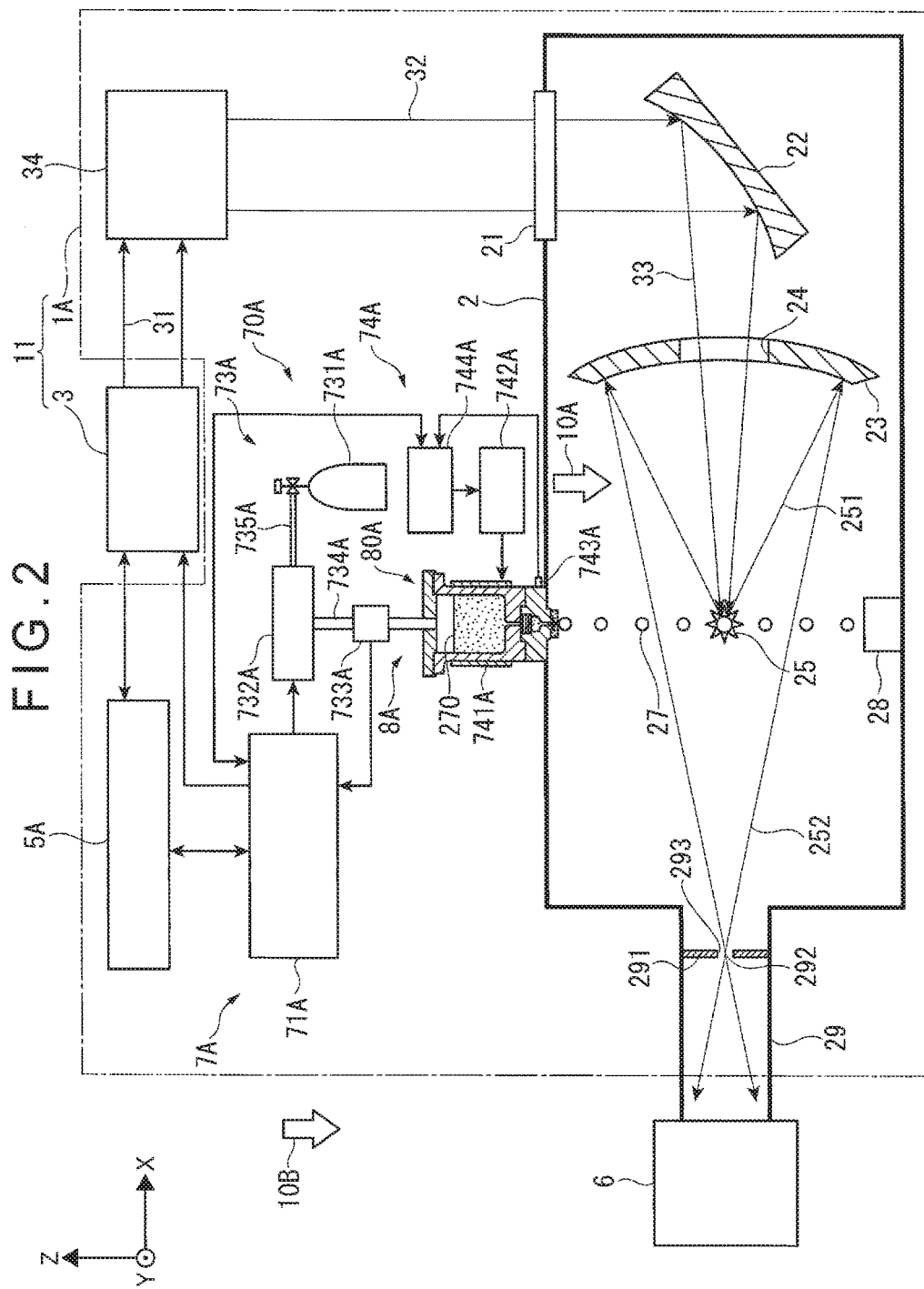
FIG. 2 schematically illustrates a configuration of an EUV light generation apparatus including a target supply device according to a first exemplary embodiment.
Figure 3:
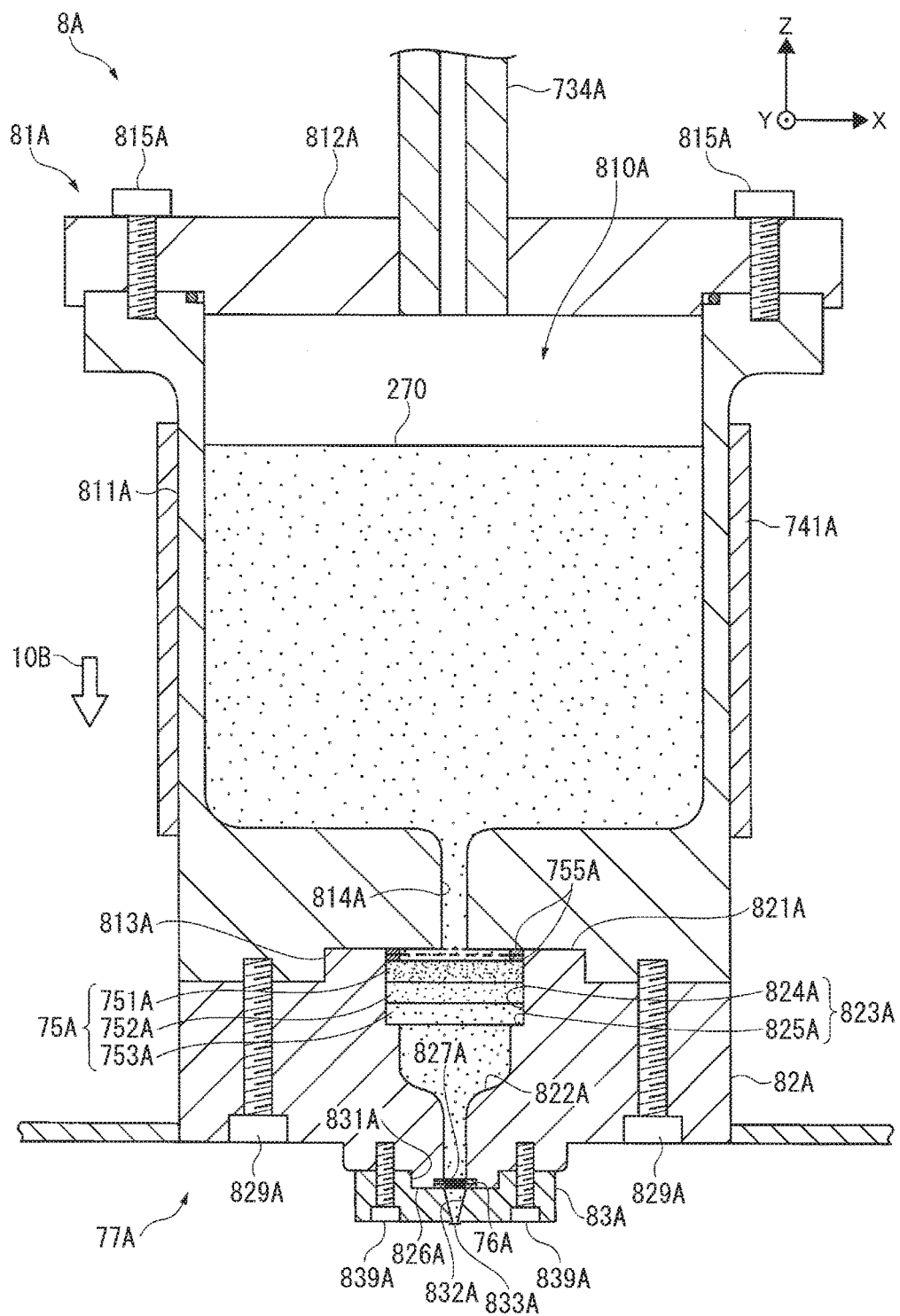
FIG. 3 schematically illustrates a configuration of the target supply device.
Figure 4:
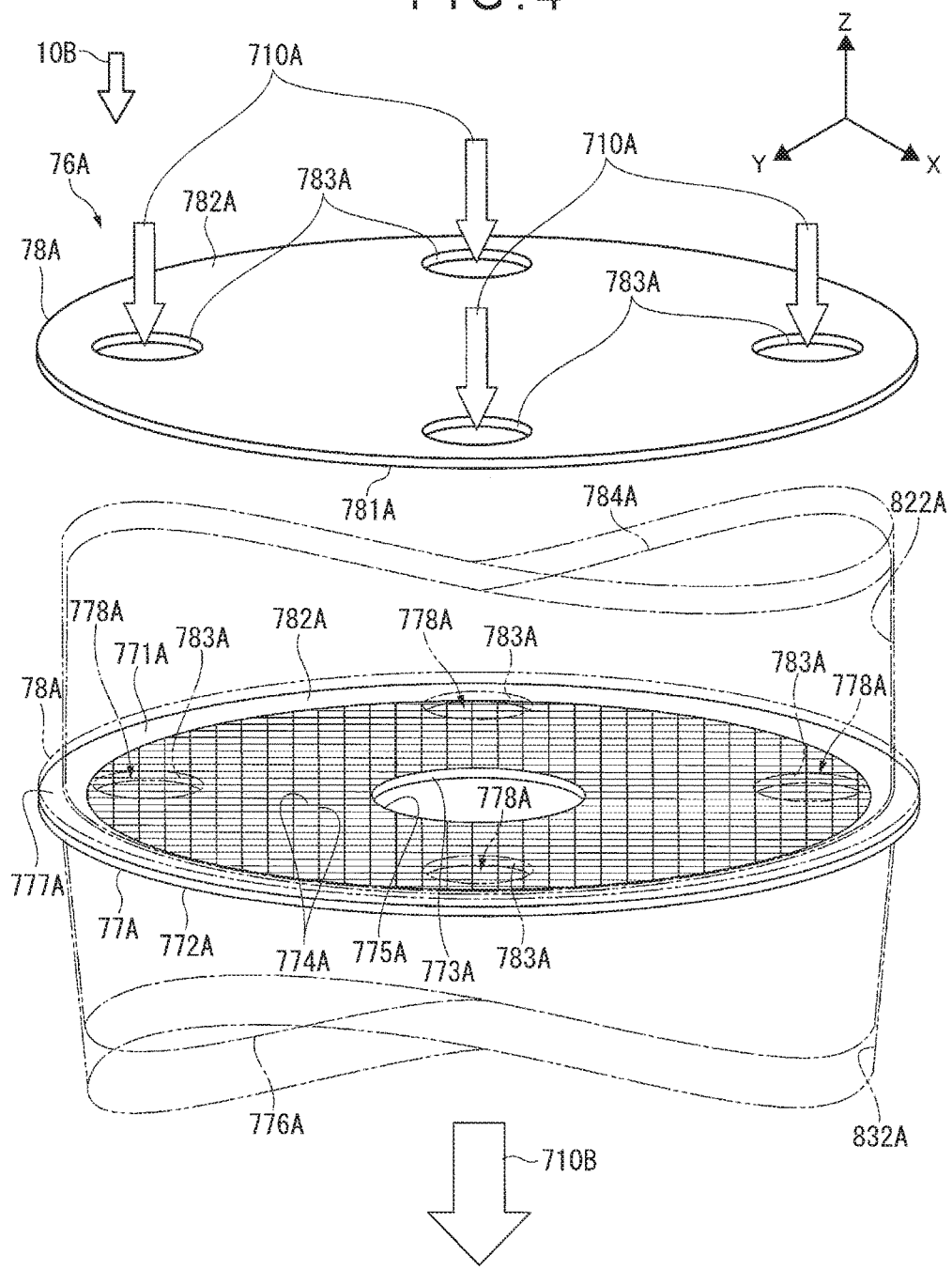
FIG. 4 is a perspective view schematically illustrating a second filter.

FIG. 2 schematically illustrates a configuration of an EUV light generation apparatus including a target supply device according to the first exemplary embodiment. FIG. 3 schematically illustrates a configuration of the target supply device. FIG. 4 is a perspective view schematically illustrating a second filter.

As shown in FIG. 2, an EUV light generation apparatus 1A may include the chamber 2 and a target supply device 7A. The target supply device 7A may include a target generator 70A and a target controller 71A. The target controller 71A may be electrically connected to the laser apparatus 3 and an EUV light generation control unit 5A.

As shown in FIGS. 2 and 3, the target generator 70A may include a target generator 8A, a pressure control unit 73A, a temperature control unit 74A, a first filter 75A and a second filter 76A.

The target generator 8A may include a tank 81A, a nozzle base portion 82A and a nozzle distal portion 83A. The tank 81A, the nozzle base portion 82A and the nozzle distal portion 83A may be made of, for instance, a material unlikely to react with a target material 270 (e.g., molybdenum).

The tank 81A may include a tank body 811A and a cover 812A.

The tank body 811A may be substantially cylindrical and have a second surface facing in a −Z direction in the form of a wall surface. A hollow space in the tank body 811A may serve as a containing space 810A. The second surface of the tank body 811A may be provided with a recessed portion 813A at the center thereof, the recessed portion 813A being recessed in the +Z direction substantially in a circle. The recessed portion 813A may be provided with a first through-hole 814A at the center thereof, the first through-hole 814A being in communication with the containing space 810A.

The cover 812A may be substantially in the shape of a circular plate, and close a first surface of the tank body 811A defined in the +Z direction. The cover 812A may be fixed to the first surface of the tank body 811A with a plurality of bolts 815A.

The nozzle base portion 82A may be substantially in a columnar shape. The nozzle base portion 82A may have a first surface facing in the +Z direction, the first surface being provided with a first projected portion 821A shaped to fit with the recessed portion 813A of the tank body 811A. The nozzle base portion 82A may be fixed to the second surface of the tank body 811A with a plurality of bolts 829A.

The nozzle base portion 82A may be provided with a second through-hole 822A at the center thereof, the second through-hole 822A penetrating in a Z-axis direction. The second through-hole 822A may be in communication with the first through-hole 814A. A housing portion 823A may be defined at a +Z side of the second through-hole 822A. The first filter 75A and a shim 755A may be housed in the housing portion 823A. The housing portion 823A may include a first contact portion 824A and a second contact portion 825A.

A second surface of the nozzle base portion 82A facing in the −Z direction may be provided with a second projected portion 826A. The second projected portion 826A may project in the −Z direction substantially in the shape of a circular plate. The second projected portion 826A may be provided with a recessed portion 827A at the center thereof, the recessed portion 827A being recessed in the +Z direction substantially in a circle. An opening of the second through-hole 822A may be inside the recessed portion 827A. The second filter 76A may be inserted in the recessed portion 827A.

The nozzle distal portion 83A may be substantially in the shape of a circular plate. A first surface of the nozzle distal portion 83A may be provided with a recessed portion 831A at the center thereof, the recessed portion 831A being recessed in the −Z direction substantially in a circle. The second projected portion 826A of the nozzle base portion 82A may be fitted in the recessed portion 831A. Simultaneously, the recessed portion 831A may be brought into contact with the second filter 76A. The nozzle distal portion 83A may be fixed to the second surface of the nozzle base portion 82A with a plurality of bolts 839A penetrating through the nozzle distal portion 83A.

The nozzle base portion 83A may be provided with a third through-hole 832A at the center thereof, the third through-hole 832A penetrating in the Z-axis direction. The third through-hole 832A may be in communication with the second through-hole 822A. A diameter of the third through-hole 832A may be reduced in the −Z direction. An end of the third through-hole 832A facing in the −Z direction may be provided with a nozzle hole 833A. The nozzle hole 833A may be a circular opening with a diameter in a range from 1 μm to 3 μm. The nozzle distal portion 83A may be in the form of a nozzle provided with the nozzle hole 833A.

Hereinafter, a member provided with a nozzle hole is occasionally simply referred to as "nozzle".

The nozzle distal portion 83A may be made of a material allowing a contact angle between the nozzle distal portion 83A and the target material 270 to be 90 degrees or more. Alternatively, at least a surface of the nozzle distal portion 83A may be coated with the material allowing for the contact angle of 90 degrees or more. For instance, when the target material 270 is tin, examples of the material allowing for the contact angle of 90 degrees or more include SiC, $SiO_2$, $Al_2O_3$, molybdenum and tungsten.

The tank 81A, the nozzle base portion 82A and the nozzle distal portion 83A may be made of an electrically insulating material. When these components are not made of an electrically insulating material but of a metal material such as molybdenum, an electrically insulating material (not shown) may be provided between the chamber 2 and the target generator 8A.

Depending on the layout of the chamber 2, a preset output direction of the droplet 27 may coincide with, for instance, a center axis direction of the nozzle hole 833A, i.e., the −Z direction shown in FIG. 3. The preset output direction of the droplet 27 is referred to as a preset output direction 10A. The preset output direction 10A does not necessarily coincide with the gravity direction 10B. The droplet 27 may be outputted obliquely to the gravity direction 10B. It should be noted that the chamber 2 may be disposed in a manner that the preset output direction 10A coincides with the gravity direction 10B in the first exemplary embodiment.

The pressure control unit 73A may include a pressure control device 732A and a pressure sensor 733A. The pressure control device 732A may be connected to a first end of the cover 812A, which faces in the +Z direction, through a duct 734A. The pressure control device 732A may be connected to an inactive gas cylinder 731A through a duct 735A. The pressure control device 732A may be electrically connected to the target controller 71A. Based on a signal sent from the target controller 71A, the pressure control device 732A may control the pressure of an inactive gas supplied from the inactive gas cylinder 731A to adjust the pressure inside the target generator 8A.

The pressure sensor 733A may be provided to the duct 734A. The pressure sensor 733A may be electrically connected to the target controller 71A. The pressure sensor 733A may detect the pressure of the inactive gas in the duct 734A, and send a signal corresponding to the detected pressure to the target controller 71A.

The temperature control unit 74A may control the temperature of the target material 270 in the tank 81A. The temperature control unit 74A may include a heater 741A, a heater power source 742A, a temperature sensor 743A and a temperature controller 744A.

The heater 741A may be disposed on an outer circumferential surface of the tank body 811A of the tank 81A.

The heater power source 742A may supply an electric power to the heater 741A so that the heater 741A generates heat based on a signal from the temperature controller 744A. The target material 270 in the tank 81A may be heated by the generated heat transferred through the tank 81A.

The temperature sensor 743A may be disposed on an outer circumferential surface of the tank 81A near the nozzle base portion 82A, or disposed in the tank 81A. The temperature sensor 743A may detect the temperature of the tank 81A mainly at and in the vicinity of the installation position of the temperature sensor 743A, and send a signal corresponding to the detected temperature to the temperature controller 744A. The temperature detected at and in the vicinity of the installation position of the temperature sensor 743A may reflect the temperature of the target material 270 in the tank 81A.

Based on the signal from the temperature sensor 743A, the temperature controller 744A may output a signal for regulating the temperature of the target material 270 to a predetermined temperature to the heater power source 742A.

The target material 270 may contain a foreign substance in the form of particles. The particles may be generated by reaction between the target material 270 and impurities or oxygen, may be contained in a raw material of the target material 270, or may be generated by physical friction between the target material 270 and the tank 81A.

The first filter 75A may include a first porous filter 751A, a second porous filter 752A and a third porous filter 753A. The first, second and third porous filters 751A, 752A, 753A may each be made of a porous material in order to capture the particles contained in the target material 270. The first porous filter 751A may be provided with numerous through-pores with a diameter of, for example, approximately 20 µm. The second porous filter 752A may be provided with numerous through-pores with a diameter of, for example, approximately 10 µm. The third porous filter 753A may be provided with numerous through-pores of which diameter is, for example, approximately 6 µm. As described above, the respective sizes of the through-pores of the first porous filter 751A, the second porous filter 752A, and the third porous filter 753A may be different. Further, the through-pores of the first, second and third porous filters 751A, 752A, 753A may each be bent in various directions to penetrate corresponding one of the porous filters.

The first, second and third porous filters 751A, 752A, 753A may each be substantially in the shape of a circular plate with a diameter larger than the maximum inner diameter of the second through-hole 822A. In the second through-hole 822A, the first, second and third porous filters 751A, 752A, 753A may close the second through-hole 822A and be stacked on one another in the Z-axis direction in the housing portion 823A. Specifically, the first porous filter 751A may be disposed at the farthest side in the +Z direction, while the third porous filter 753A is disposed at the farthest side in the −Z direction. In other words, the porous filters may be disposed in a descending order of the diameter of the through-pores along the output direction of the target material 270.

The first, second and third porous filters 751A, 752A, 753A may each be made of a material unlikely to react with the target material 270. A difference between a linear thermal expansion coefficient of the material of each of the first, second and third porous filters 751A, 752A, 753A and a linear thermal expansion coefficient of the material of the target generator 8A may be smaller than one fifth of the linear thermal expansion coefficient of the material of the target generator 8A.

When the target material 270 is tin, the target generator 8A may be made of molybdenum, which is unlikely to react with tin. When the target generator 8A is made of molybdenum or tungsten, the first, second and third porous filters 751A, 752A, 753A may be made of one of the materials shown in Table 1 below. A linear thermal expansion coefficient of molybdenum is $5.2 \times 10^{-6}$. A linear thermal expansion coefficient of tungsten is $4.6 \times 10^{-6}$.

TABLE 1

| Filter Type | Filter Structure | Material | Linear Thermal Expansion Coefficient ($\times 10^{-6}$) |
|---|---|---|---|
| Glass Porous Filter | Porous Glass | Aluminum oxide•silicon-dioxide glass | 6.0 |
| Ceramic Porous Filter | Porous Ceramics | Silicon carbide | 4.1 |
| | | Tungsten carbide | 5.2 |
| | | Aluminum nitride | 4.8 |
| | | Zirconium boride | 5.9 |
| | | Boron carbide | 5.4 |

The material of the first, second and third porous filters 751A, 752A, 753A may be, for example, shirasu porous glass (SPG) provided by SPG Technology Co., Ltd. SPG may be a porous glass that employs volcanic ash (shirasu) as a raw material. When SPG is used as the material, the first, second and third porous filters 751A, 752A, 753A may be substantially in the shape of a circular plate, a dimension (i.e., thickness) of each of the first, second and third porous filters 751A, 752A, 753A in the Z-axis direction may be, for instance, approximately 3 mm, and a diameter of each of the first, second and third porous filters 751A, 752A, 753A may be, for instance, approximately 20 mm.

The percentage of the components of SPG may serve as shown in Table 2 below.

TABLE 2

| | Component | | | | | | |
|---|---|---|---|---|---|---|---|
| | $SiO_2$ | $B_2O_3$ | $Al_2O_3$ | $NA_2O$ | CaO | MgO | $K_2O$ |
| Percentage | 58 | 9 | 11 | 8 | 4 | 3 | 3 |

When the SPG is used as the material, the first, second and third porous filters 751A, 752A, 753A may be provided with numerous through-pores that have diameters in a range from 6 µm to 20 µm and be bent in various directions.

In the housing portion 823A, the shim 755A may be stacked on a first surface of the first porous filter 751A facing in the +Z direction. For instance, two shims 755A may be stacked in the housing portion 823A. When a plurality of shims 755A are used, the respective thicknesses thereof may be different.

The shim(s) 755A may be made of a material unlikely to react with the target material 270. A difference between a linear thermal expansion coefficient of the material of each of the first, second and third porous filters 751A, 752A, 753A and a linear thermal expansion coefficient of the material of the shim(s) 755A may be smaller than one fifth of the linear thermal expansion coefficient of the material of the shim(s) 755A. For instance, when the first, second and third porous filters 751A, 752A, 753A are SPG filters and the target material 270 is tin, the shim(s) 755A may be made of molybdenum. The shim(s) 755A may be substantially in the shape of an annular plate.

The second filter 76A may be a filter according to the present disclosure. The second filter 76A may be disposed at a position in the −Z direction relative to the first filter 75A to close the third through-hole 832A. The −Z direction may coincide with the output direction of the target material 270. The second filter 76A may capture particles having passed through the third porous filter 753A, and/or particles generated downstream of the third porous filter 753A in the output direction of the target material 270. As shown in FIG. 4, the second filter 76A may include a first member 77A and a second member 78A.

The first and second members 77A, 78A may be made of a material unlikely to react with the target material 270 and be substantially in the shape of a circular plate. When the target material 270 is tin, the material unlikely to react with the target material 270 may be molybdenum or tungsten, or may be any one of the materials shown in Table 1. For instance, the respective thicknesses of the first and second members 77A, 78A may be approximately 300 µm.

The first member 77A may be provided with a substantially circular first through-hole 773A at the center thereof, the first through-hole 773A penetrating in the Z-axis direction. For instance, the diameter of the first through-hole 773A may be 600 µm.

A first surface 771A of the first member 77A facing in the +Z direction may be provided with a channel 774A. The channel 774A may include a plurality of grooves. The channel 774A may be formed in a lattice pattern or a radial pattern. As shown in FIG. 4, the channel 774A may include grooves formed on the first surface 771A in a lattice pattern. The first surface 771A of the first member 77A may be etched to form the channel 774A. A dimension (i.e., depth) of the channel 774A in a direction orthogonal to the first surface 771A may be smaller than the diameter of the particles having passed through the third porous filter 753A. For instance, the depth of the channel 774A may be 3 µm or less. The channel 774A may thus capture the particles. The channel 774A may reach the first through-hole 773A. An end of the channel 774A facing the first through-hole 773A may be defined as a first area 775A. Consequently, the first through-hole 773A may serve as a first passable portion, allowing the target material 270 (fluid) to flow between the first surface 771A and a first space 776A, which is beside a third surface 772A opposite to the first surface 771A, through the first area 775A of the channel 774A. In the first exemplary embodiment, the first through-hole 773A may serve as the first passable portion, allowing the target material 270 flowing into the first area 775A of the channel 774A to be discharged into the first space 776A.

The first member 77A may include a flat portion 777A defined in the first surface 771A at the outside of the channel 774A. The flat portion 777A may be in an annular shape, surrounding the channel 774A. The flat portion 777A may be provided by an unetched area of the first surface 771A. The flat portion 777A and the third surface 772A may be polished.

As shown by the chain double-dashed lines in FIG. 4, the second member 78A may be stacked onto the first member 77A in the −Z direction. When the second member 78A is stacked, a second surface 781A of the second member 78A may cover a part of the channel 774A of the first member 77A.

The second member 78A may be provided with four substantially circular second through-holes 783A penetrating in the Z-axis direction. For instance, the diameter of the second through-holes 783A may be 400 µm. The second through-holes 783A may be spaced from one another substantially at regular intervals along an outer circumferential direction of the second member 78A. The second through-holes 783A may thus be point-symmetric with respect to the center of the second member 78A. The second through-holes 783A may be arranged not to be inside an opening of the first through-hole 773A when the second member 78A is stacked on the first member. At this time, the channel 774A may overlap with the openings of the second through-holes 783A. The part of the channel 774A overlapping with the openings of the second through-holes 783A may be defined as a second area 778A of the channel 774A, which is spaced from the first area 775A. Consequently, the second through-holes 783A may serve as a second passable portion, allowing the target material 270 to flow between the second surface 781A and a second space 784A, which is beside a fourth surface 782A opposite to the second surface 781A, through the second area 778A of the channel 774A. In the first exemplary embodiment, the second through-holes 783A may serve as the second passable portion, allowing the target material 270 in the second space 784A to enter the second area 778A of the channel 774A. The second surface 781A and the fourth surface 782A may be polished.

The target controller 71A may send a signal to the temperature controller 744A to regulate the temperature of the target material 270 in the target generator 8A. The target controller 71A may send a signal to the pressure control device 732A of the pressure control unit 73A to regulate the pressure in the target generator 8A.

3.2.3 Operation

3.2.3.1 Installation of Filter

Description will be made below on installation of the first filter 75A and the second filter 76A into the target generator 8A. The filters may be installed when the target generator 8A is built or when the target generator 8A is subject to maintenance.

First, the first member 77A having been provided with the first through-hole 773A and the channel 774A may be manufactured in advance. The second member 78A having been provided with the second through-holes 783A may be manufactured in advance. The first member 77A and the second member 78A may be manufactured in the same manner as in a second exemplary embodiment (described later). The second member 78A and the first member 77A may be disposed such that the second surface 781A of the second member 78A covers the channel 774A of the first member 77A. At this time, the first member 77A and the second member 78A may be diffusion-bonded to each other. The second filter 76A having the channel 774A with a depth of 3 μm or less may thus be provided. It should be noted that the diffusion bonding of the first member and the second member may be unessential for the first exemplary embodiment.

Next, the second filter 76A may be inserted in the recessed portion 827A of the nozzle base portion 82A. Subsequently, the second projected portion 826A of the nozzle base portion 82A may be inserted in the recessed portion 831A of the nozzle distal portion 83A, and then the bolts 839A may be screwed into the nozzle base portion 82A.

When the bolts 839A are screwed into the nozzle base portion 82A, the nozzle distal portion 83A may be fixed to the nozzle base portion 82A so that the third surface 772A of the first member 77A of the second filter 76A is brought into airtight contact with the nozzle distal portion 83A, and fourth surface 782A of the second member 78A of the second filter 76A is brought into airtight contact with the nozzle base portion 82A. The four second through-holes 783A of the second member 78A may be inside the opening of the second through-hole 822A so that the inside of the second through-hole 822A serves as the second space 784A. The first through-hole 773A of the first member 77A may be inside the opening of the third through-hole 832A facing in the +Z direction so that the inside of the third through-hole 832A serves as the first space 776A.

The first filter 75A and the shim(s) 755A may be set in the housing portion 823A of the nozzle base portion 82A. Next, the first projected portion 821A of the nozzle base portion 82A may be fitted in the recessed portion 813A of the tank body 811A. Subsequently, the bolts 829A may be screwed into the tank body 811A.

The installation of the first filter 75A and the second filter 76A in the target generator 8A may thus be completed.

3.2.3.2 Operation of Target Supply Device

Description will be made below on an operation of the target supply device 7A.

When the target material 270 in a solid state is contained in the containing space 810A, the target controller 71A may heat the target generator 8A to the melting point of the target material 270 or higher. Subsequently, the target controller 71A may regulate the pressure in the target generator 8A to a first pressure.

The regulation of the pressure may allow target material 270 in a liquid state to pass through the first porous filter 751A. When the target material 270 passes through the first porous filter 751A, the first porous filter 751A may capture particles with a diameter larger than the diameter of the through-pores thereof.

After passing through the first porous filter 751A, the target material 270 may pass through the second porous filter 752A. When the target material 270 passes through the second porous filter 752A, the second porous filter 752A may capture particles with a diameter larger than the diameter of the through-pores thereof.

After passing through the second porous filter 752A, the target material 270 may pass through the third porous filter 753A. When the target material 270 passes through the third porous filter 753A, the third porous filter 753A may capture particles with a diameter larger than the diameter of the through-pores thereof.

Subsequently, the target material 270 may pass through the second filter 76A.

At this time, the target material 270 having reached the second filter 76A may contain particles. The particles may include particles having adhered to the first, second and third porous filters 751A, 752A, 753A since when the first, second and third porous filters 751A, 752A, 753A are manufactured or attached to the nozzle base portion 82A, and/or particles having passed through the first, second and third porous filters 751A, 752A, 753A. The second filter 76A may capture such particles.

The target material 270 having reached the second filter 76A may enter the second through-holes 783A of the second member 78A in a direction indicated by arrows 710A (the −Z direction). After entering the second through-holes 783A, the target material 270 may pass through the channel 774A. At this time, the channel 774A may capture particles with a diameter larger than the depth of the channel 774A. The target material 270 may then pass through the first through-hole 773A to pass through the second filter 76A in a direction indicated by an arrow 710B (the −Z direction), and enter the third through-hole 832A.

Subsequently, the target controller 71A may regulate the pressure in the target generator 8A to a second pressure to output the target material 270 as the droplet 27 through the nozzle hole 833A.

In the first exemplary embodiment, the second filter 76A capable of capturing fine particles may be easily provided only by setting the second member 78A such that the second surface 781A covers the channel 774A of the first member 77A. The channel 774A capable of capturing fine particles may be easily made as compared with an instance where the channel 774A is bored. The channel 774A with the same shape can be stably made as compared with an instance where the channel 774A is bored.

Since the first through-hole 773A serves as the first passable portion, allowing the target material 270 having entered the first area 775A of the channel 774A to be discharged into the first space 776A, the first passable portion can be provided simply by boring the first member 77A.

Since the second through-hole 783A serves as the second passable portion, allowing the target material 270 in the second area 778A to enter the second area 778A of the channel 774A, the second passable portion may be provided simply by boring the second member 78A.

Since the channel 774A includes the grooves provided to the first surface 771A, the channel 774A may be provided by a simple technique such as etching.

3.3 Second Exemplary Embodiment

3.3.1 Overview

A filter of a second exemplary embodiment of the present disclosure may include a first member, which is roll-pressed substantially into a plate shape and provided with a channel extending in a direction intersecting with a roll-press direction of the first member.

3.3.2 Configuration

Figure 5A:
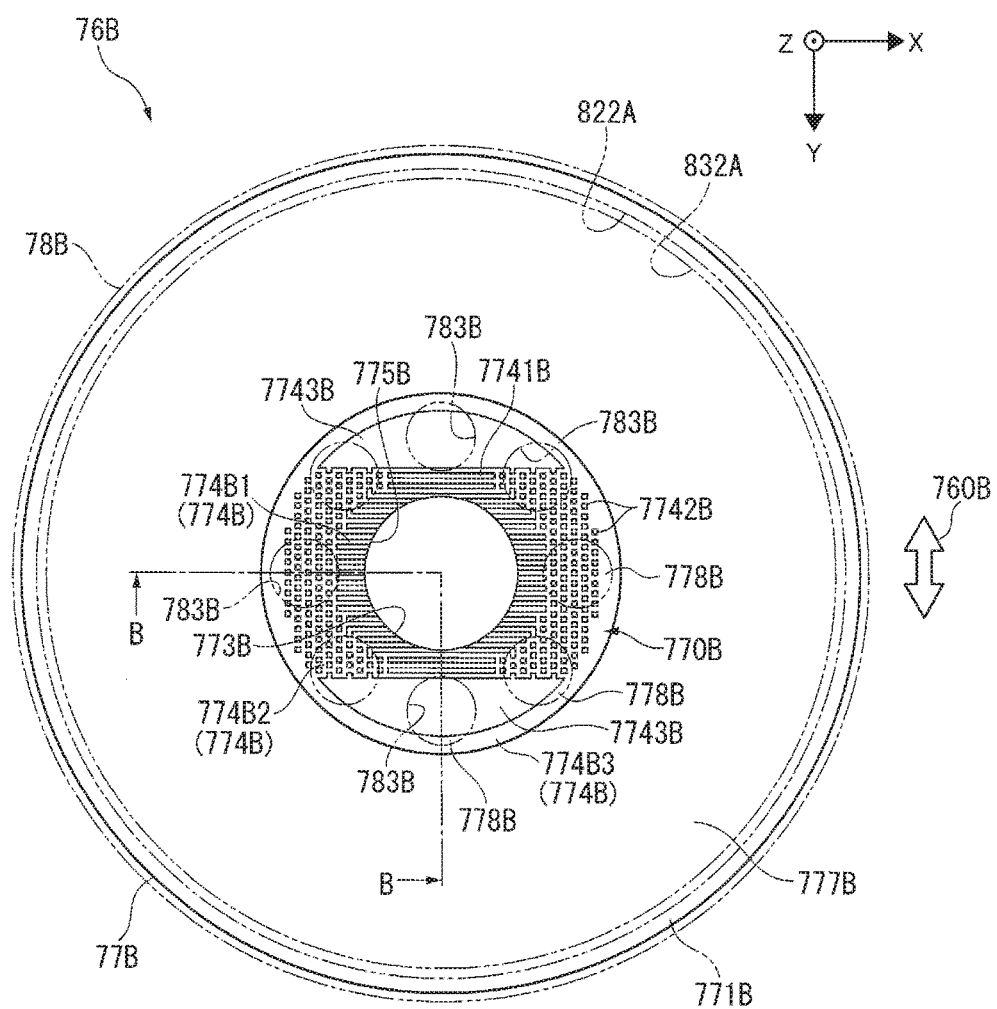
FIG. 5A schematically illustrates a second filter according to a second exemplary embodiment in a +Z direction.

FIG. 5A schematically illustrates a second filter according to the second exemplary embodiment in the +Z direction. FIG. 5B is a sectional view taken along the line B-B in FIG. 5A. FIG. 5A schematically illustrates a channel in the second filter in the +Z direction.

A target supply device of the second exemplary embodiment may be the same as the target supply device 7A of the first exemplary embodiment except a configuration of a second filter 76B.

The second filter 76B may be a filter according to the present disclosure. As shown in FIGS. 5A and 5B, the second filter 76B may include a first member 77B and a second member 78B.

The first and second members 77B, 78B may be made of a material unlikely to react with a target material and be substantially in the shape of a circular plate. When the target material is tin, the material unlikely to react with the target material may be molybdenum or tungsten, or may be any one of the materials shown in Table 1. For instance, the respective thicknesses of the first and second members 77B, 78B may be approximately 300 μm. For instance, the respective diameters of the first and second members 77B, 78B may be approximately 5 mm.

The first member 77B may be provided with a substantially circular first through-hole 773B at the center thereof, the first through-hole 773B penetrating in the Z-axis direction. For instance, the diameter of the first through-hole 773B may be 900 μm. A first surface 771B of the first member 77B facing in the +Z direction may be provided with a groove 770B recessed in a circle. For instance, the diameter of the groove 770B may be 2.1 mm. Further, for instance, the depth of the groove 770B may be 3 μm or less.

In the groove 770B, a plurality of first spacers 7741B, a plurality of second spacers 7742B and a plurality of third spacers 7743B may be provided. The groove 770B and the first, second and third spacers 7741B, 7742B, 7743B may be made by etching the first surface 771B of the first member 77B.

The first spacers 7741B may be arranged in a substantially annular area around the first through-hole 773B. When seen in the +Z direction, the first spacers 7741B may be substantially rectangular. When seen in the +Z direction, the first spacers 7741B may extend in a direction substantially orthogonal to a roll-press direction 760B of the first member 77B. The first spacers 7741B may be arranged side by side in the roll-press direction 760B. The first spacers 7741B may reach the first through-hole 773B.

The second spacers 7742B may be arranged in areas adjacent to the first spacers 7741B in a +X direction and a −X direction. When seen in the +Z direction, the second spacers 7742B may be substantially square. The second spacers 7742B may be dotted in the X- and Y-axis directions.

The third spacers 7743B may be arranged in the first spacers 7741B in a +Y direction and a −Y direction. When seen in the +Z direction, the third spacers 7743B may have a substantially linear side facing the first through-hole 773B and a substantially arc side opposite to the side facing the first through-hole 773B.

In the groove 770B, areas between adjacent ones of the first spacers 7741B may be defined as a first channel 774B1 extending in the direction substantially orthogonal to the roll-press direction 760B. In the groove 770B, an area between each of the third spacers 7743B and one of the first spacers 7741B adjacent thereto may be defined as the first channel 774B1. The first channel 774B1 may be disposed adjacent to the first through-hole 773B in the +X direction, the −X direction, the +Y direction and the −Y direction. It should be noted that the first channel 774B1 may extend in a direction not substantially orthogonal to but intersecting with the roll-press direction 760B. The angle between the direction where the first channel 774B1 extends and the roll-press direction 760B may be not approximately 90 degrees but, for instance, approximately 45 or 60 degrees, as long as the angle is larger than approximately 0 degrees.

In the groove 770B, areas between adjacent ones of the second spacers 7742B may be defined as a second channel 774B2 in a lattice pattern. In the groove 770B, an area between each of the third spacers 7743B and one of the second spacers 7742B adjacent thereto may be defined as the second channel 774B2, which linearly extends.

In the groove 770B, an area at the outside of the third spacers 7743B and the second spacers 7742B may be defined as a third channel 774B3. The third channel 774B3 may be substantially in an annular shape coaxial with the first through-hole 773B.

The first channel 774B1, the second channel 774B2 and the third channel 774B3 may define a channel 774B.

For instance, the respective widths of the first and second channels 774B1, 774B2 may be approximately 30 μm. The respective widths of the first and second channels 774B1, 774B2 may be different. Further, for instance, the width of the third channel 774B3 may be 200 μm.

The respective depths of the first, second and third channels 774B1, 774B2, 774B3 may be the same as the depth of the groove 770B. The respective depths of the first, second and third channels 774B1, 774B2, 774B3 may be defined in a direction orthogonal to the first surface 771B. The respective depths of the first, second and third channels 774B1, 774B2, 774B3 may be smaller than the diameter of particles having passed through a third porous filter 753A. The channel 774B may thus capture the particles.

An end of the first channel 774B1 of the channel 774B facing the first through-hole 773B may be defined as a first area 775B. Thus, as shown in FIG. 5B, the first through-hole 773B may serve as a first passable portion, allowing a target material (fluid) to flow between the first surface 771B and a first space 776B, which is beside a third surface 772B opposite to the first surface 771B, through the first area 775B of the channel 774B. In the second exemplary embodiment, the first through-hole 773B may serve as the first passable portion, allowing the target material flowing into the first area 775B of the channel 774B to be discharged into the first space 776B.

The first member 77B may include a flat portion 777B defined in the first surface 771B at the outside of the channel 774B. The flat portion 777B may be in an annular shape, surrounding the channel 774B. The flat portion 777B may be provided by an unetched area of the first surface 771B. The flat portion 777B and the third surface 772B may be polished.

As shown in FIGS. 5A and 5B, the second member 78B may be stacked on the first member 77B. When the second member 78B is stacked, a second surface 781B of the second member 78B may cover the channel 774B of the first member 77B.

The second member 78B may be provided with eight substantially circular second through-holes 783B penetrating in the Z-axis direction. For instance, the diameter of the second through-holes 783B may be 40 µm. The second through-holes 783B may be spaced from one another substantially at regular intervals along an outer circumferential direction of the second member 78B. The second through-holes 783B may thus be point-symmetric with respect to the center of the second member 78B. The second through-holes 783B may be arranged not to be inside an opening of the first through-hole 773B when the second member 78B is stacked on the first member 77B. At this time, the channel 774B may overlap with the openings of the second through-holes 783B. The part of the channel 744B overlapping with the second through-holes 783B may be defined as a second area 778B of the channel 774B. The second area 778B may include the third channel 774B3. Consequently, the second through-holes 783B may serve as a second passable portion, allowing the target material to flow between the second surface 781B and a second space 784B, which is beside a fourth surface 782B opposite to the second surface 781B, through the second area 778B of the channel 774B. In the second exemplary embodiment, the second through-holes 783B may serve as the second passable portion, allowing the target material in the second space 784B to enter the second area 778B of the channel 774B. The second surface 781B and the fourth surface 782B may be polished.

3.3.3 Operation

Next, description will be made on a manufacturing method of the filter, installation of the filter, and an operation of the target supply device.

The same operation as that of the first exemplary embodiment will not be explained below.

3.3.3.1 Manufacturing Method of Filter and Installation of Filter

Figure 7:
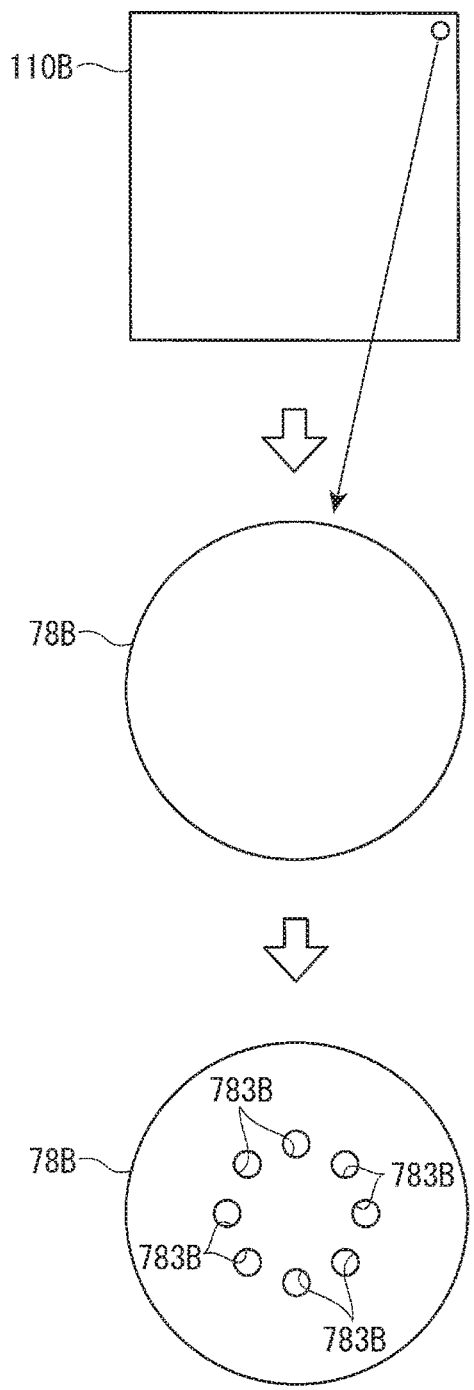
FIG. 7 schematically illustrates a manufacturing method of a second member.

FIG. 6 schematically illustrates a manufacturing method of the first member. FIG. 7 schematically illustrates a manufacturing method of the second member. Description will be first made on the manufacturing method of the first member 77B.

As shown in FIG. 6, a plate 100B made of molybdenum may be prepared. The plate 100B may be made by roll-pressing a bulk of molybdenum. A top-bottom direction shown in FIG. 6 may substantially coincide with the roll-press direction 760B of the plate 100B. For instance, the plate 100B may be in a square with sides of 100 mm.

Masking may be provided to a first surface 101B of the plate 100B to make the channel 774B. The masking may be designed to make the channels 774B of a plurality of first members 77B. The first surface 101B of the plate 100B may be wet-etched. The first surface 101B may thus be provided with the first channels 774B1 as shown in FIG. 5C, or a plurality of channels 774B. A marker 102B in a cross shape may be provided substantially at the center of the channel(s) 774B.

The plurality of first members 77B may be cut out from the plate 100B. The first member(s) 77B may be bored substantially at the center thereof to make the first through-hole 773B. At this time, the marker 102B may be used as a mark for boring.

Both surfaces of the first member(s) 77B may be polished and washed. Manufacturing of the first member(s) 77B may thus be completed. Both surfaces of the first member(s) 77B may be polished prior to the etching and the boring. The boring may be followed by the etching.

The first channel 774B1 of the channel 774B may extend in the direction substantially orthogonal to the roll-press direction 760B. When the plate 100B is wet-etched, an etched surface of the plate 100B may be provided with surface roughness due to a texture of the plate 100B having dependency on the roll-press direction 760B. A bottom surface of the first channel 774B1 may have a fine groove extending along the roll-press direction 760B due to the surface roughness. The depth of a part of the first channel 774B1 with the fine groove may be larger than that of a part without the fine groove.

When an extending direction of the first channel 774B1 is parallel with the roll-press direction 760B, the fine groove of the bottom surface may be continuous along the extending direction of the first channel 774B1. Consequently, particles that may be captured by the part of the first channel 774B1 without the fine groove may enter the first through-hole 773A through the part with the fine groove.

When the extending direction of the first channel 774B1 is substantially orthogonal to or intersects with the roll-press direction 760B, the fine groove of the bottom surface, which extends from one side to the other side in a width direction of the bottom surface, may be prevented from being continuous along the extending direction of the first channel 774B1. Consequently, particles that may be captured by the part of the first channel 774B1 without the fine groove may be prevented from entering the first through-hole 773A.

Description will be made on the manufacturing method of the second member 78B.

As shown in FIG. 7, a plate 110B made of molybdenum may be prepared. The plate 110B may be made in the same manner as the plate 100B. For instance, the plate 110B may be in a square with sides of 100 mm.

The plurality of second members 78B may be cut out from the plate 110B. The second member(s) 78B may be bored at a plurality of spots to make the second through-holes 783B.

Both surfaces of the second member(s) 78B may be polished and washed. Manufacturing of the second member(s) 78B may thus be completed.

Description will be made on the manufacturing method of the second filter 76B.

The second member 78B may be stacked on the first member 77B with the second surface 781B of the second member 78B covering the channel 774B of the first member 77B. At this time, the first member 77B and the second member 78B may be diffusion-bonded to each other. The second filter 76B having the channel 774B with a depth of 3 μm or less may thus be manufactured. At this time, since the second through-holes 783B are point-symmetric with respect to the center of the second member 78B, the third channels 774B3 may be inside the openings of the second through-holes 783B to allow the target material to pass through the second filter 76B irrespective of a positional deviation of the second member 78B in a rotation direction relative to the first member 77B. Since the first and second surfaces 771B, 781B are polished, a gap between the first surface 771B and the second surface 781B may be reduced. It should be noted that the diffusion bonding of the first member and the second member may be unessential for the second exemplary embodiment.

Next, description will be made on the installation of the second filter 76B in the target generator 8A.

The second filter 76B may be attached between the nozzle base portion 82A and the nozzle distal portion 83A.

The eight second through-holes 783B of the second member 78B may thus be inside the opening of the second through-hole 822A so that the inside of the second through-hole 822A serves as the second space 784B. The first through-hole 773B of the first member 77B may be inside the opening of the third through-hole 832A facing in the +Z direction so that the inside of the third through-hole 832A serves as the first space 776B.

3.3.3.2 Operation of Target Supply Device

When the target generator 8A is heated to the melting point of the target material or higher, and the pressure in the target generator 8A is regulated, the target material, from which particles have been eliminated through the first filter 75A, may pass through the second filter 76B.

When reaching the second filter 76B, the target material may enter the second through-holes 783B of the second member 78B. After entering the second through-holes 783B, the target material may pass through the third channel 774B3, the second channel 774B2 and the first channel 774B1 of the channel 774B in this order. At this time, the channel 774B may capture particles with a diameter larger than the depth of the channel 774B. Since the respective upper ends of the first, second and third spacers 7741B, 7742B, 7743B are in contact with the second surface 781B, the channel 774B may be prevented from being deformed even when a pressure acts on the fourth surface 782B. Subsequently, the target material may enter the third through-hole 832A through the first through-hole 773B.

In the second exemplary embodiment, since the extending direction of the first channel 774B1 is substantially orthogonal to or intersects with the roll-press direction 760B as described above, fine particles may be captured as compared with an instance where the extending direction is parallel with the roll-press direction 760B.

3.4 Third Exemplary Embodiment

3.4.1 Configuration

Figure 8A:
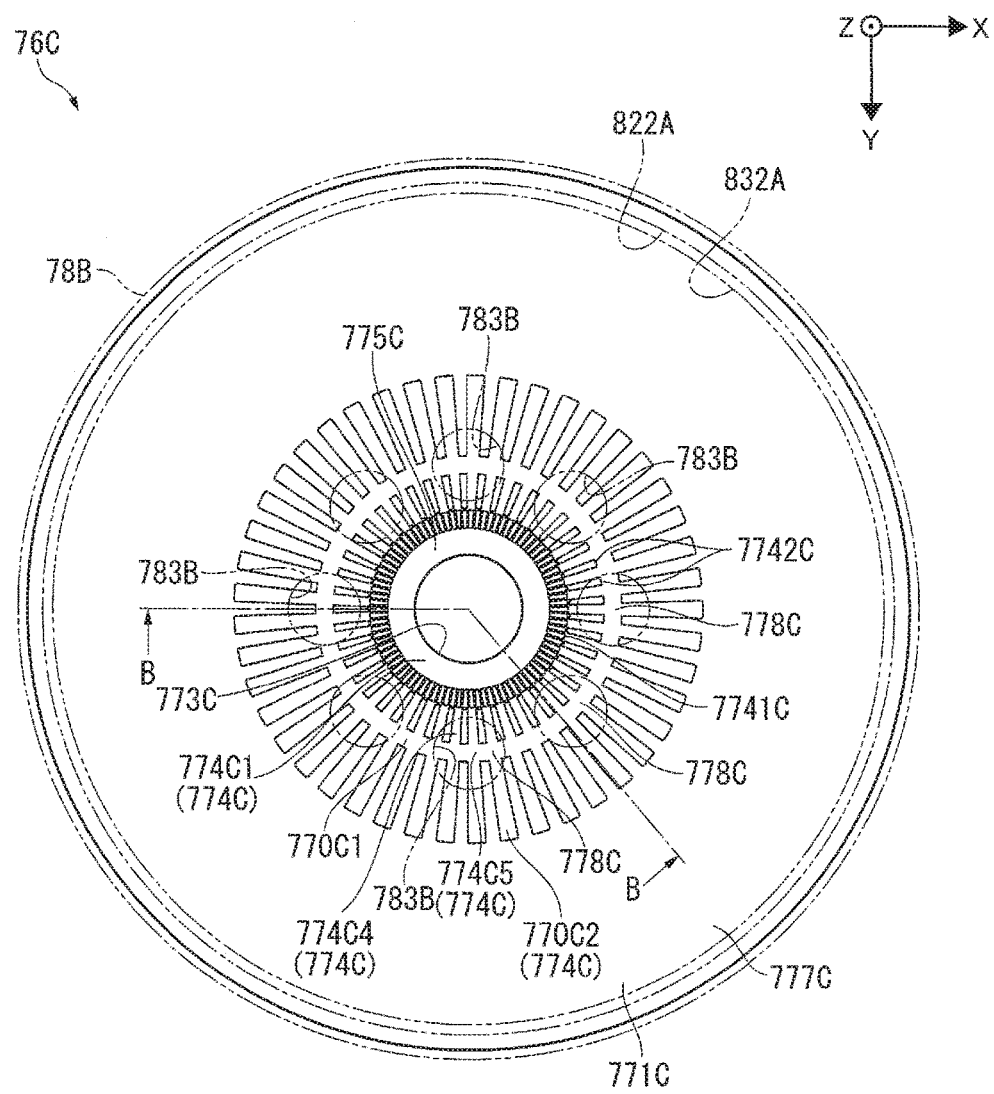
FIG. 8A schematically illustrates a second filter according to a third exemplary embodiment in the +Z direction.
Figure 8B:
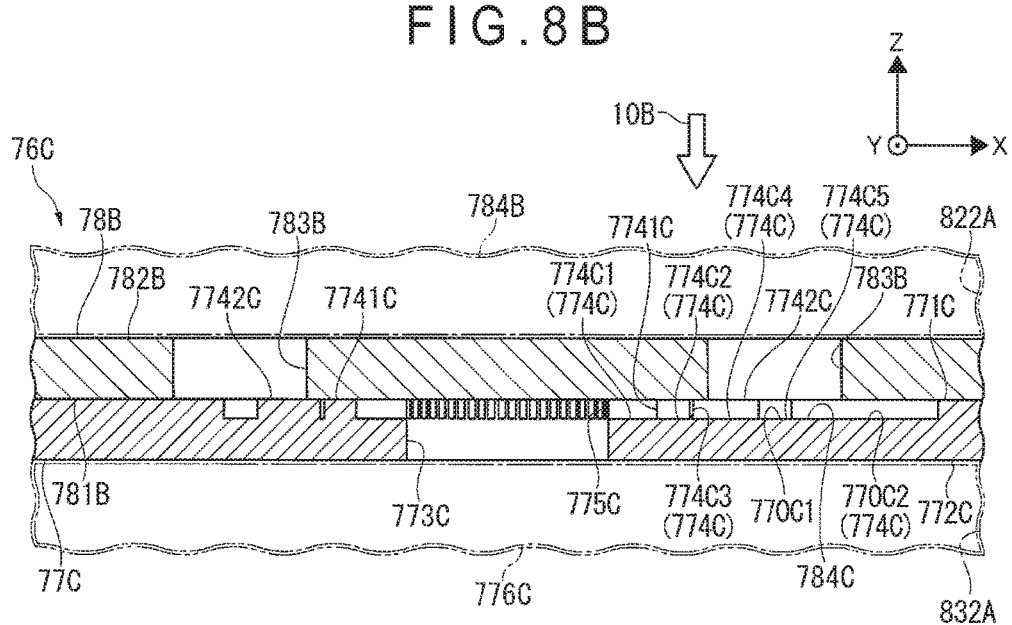
FIG. 8B is a sectional view taken along the line B-B in FIG. 8A.
Figure 8C:
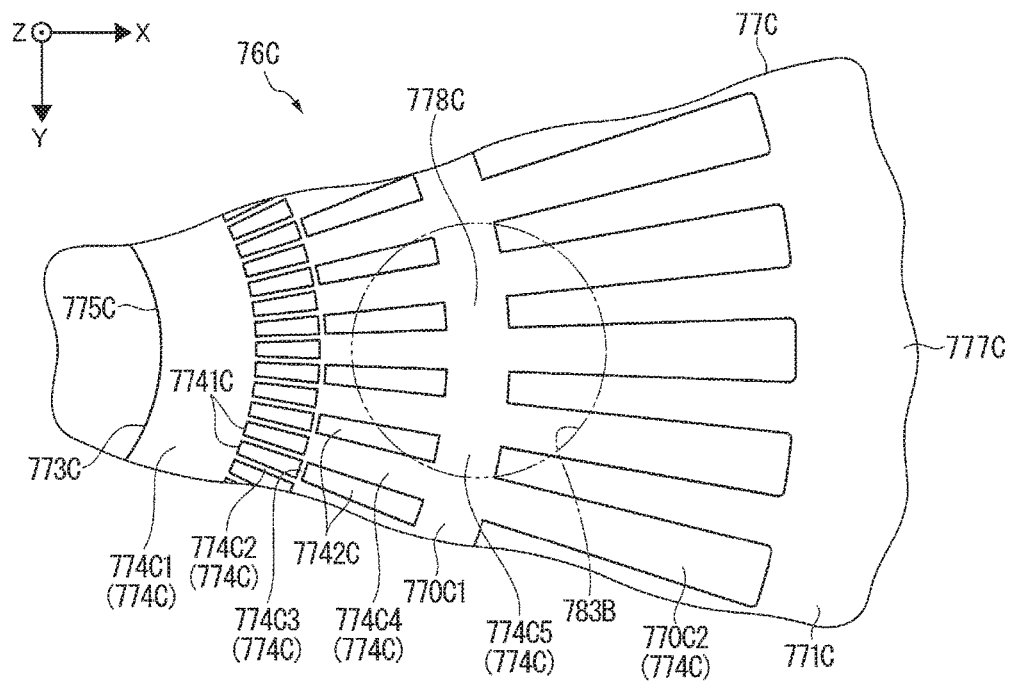
FIG. 8C schematically illustrates a channel in the second filter in the +Z direction.

FIG. 8A schematically illustrates a second filter according to a third exemplary embodiment in the +Z direction. FIG. 8B is a sectional view taken along the line B-B in FIG. 8A. FIG. 8C schematically illustrates a channel in the second filter in the +Z direction.

A target supply device of the third exemplary embodiment may be the same as the target supply device 7A of the first exemplary embodiment except a configuration of a second filter 76C.

The second filter 76C may be a filter according to the present disclosure. As shown in FIGS. 8A and 8B, the second filter 76C may include a first member 77C and the second member 78B.

Similarly to the first member 77B, the first member 77C may be made of a material unlikely to react with a target material and be substantially in the shape of a circular plate. For instance, the thickness of the first member 77C may be approximately 300 μm. For instance, the diameter of the first member 77C may be approximately 5 mm.

The first member 77A may be provided with a substantially circular first through-hole 773C at the center thereof, the first through-hole 773C penetrating in the top-bottom direction. For instance, the diameter of the first through-hole 773C may be 600 μm. A first surface 771C of the first member 77C facing in the +Z direction may be provided with a first groove 770C1 and a second groove 770C2. The first groove 770C1 may be in the shape of a circle with a diameter of, for instance, 2.6 mm. The second groove 770C2 may include grooves radially extending from an outer periphery of the first groove 770C1. The grooves as the second groove 770C2 may be spaced from one another substantially at regular intervals along an outer circumferential direction of the first groove 770C1. For instance, the respective depths of the first and second grooves 770C1, 770C2 may be approximately 3 μm or less.

At the inside of the first groove 770C1, a plurality of first spacers 7741C and a plurality of second spacers 7742C may be provided. The first and second grooves 770C1, 770C2 and the first and second spacers 7741C, 7742C may be made by etching the first surface 771C of the first member 77C.

The first spacers 7741C may be arranged in a substantially annular area around the first through-hole 773C. The first spacers 7741C may radially extend from a position spaced from the first through-hole 773C at a predetermined distance. The first spacers 7741C may be arranged substantially at regular intervals along an outer circumferential direction of the first through-hole 773C.

The second spacers 7742C may be arranged in a substantially annular area surrounding the first spacers 7741C. The second spacers 7742C may radially extend from a position spaced from the first spacers 7741C at a predetermined distance. The second spacers 7742C may be arranged substantially at regular intervals along the outer circumferential direction of the first through-hole 773C.

In the first groove 770C1, a substantially annular area close to the first through-hole 773C relative to the first spacers 7741C may be defined as a first channel 774C1. In the first groove 770C1, areas between adjacent ones of the first spacers 7741C may be defined as a radial second channel 774C2. In the first groove 770C1, an area between the adjacent first spacers 7741C and second spacers 7742C may be defined as a substantially circular third channel 774C3. In the first groove 770C1, areas between adjacent ones of the second spacers 7742C may be defined as a radial fourth channel 774C4. In the first groove 770C1, a substantially annular area at the outside of the second spacers 7742C may serve as a fifth channel 774C5.

The second groove 770C2 and the first to fifth channels 774C1, 774C2, 774C3, 774C4 and 774C5 may define a channel 774C.

For instance, the width of the second groove 770C2 may be in a range from 70 μm to 100 μm. For instance, the width of the first channel 774C1 may be 150 μm. For instance, the respective widths of the second and third channels 774C2, 774C3 may be 10 μm. For instance, the width of the fourth channel 774C4 may be in a range from 40 μm to 60 μm. For instance, the width of the fifth channel 774C5 may be 100 μm.

The depth of the second groove 770C2 and the respective depths of the first to fifth channels 774C1 to 774C5 may be the same as the depth of the first groove 770C1. The respective depths of the first to fifth channels 774C1 to 774C5 may be smaller than the diameter of particles having passed through the third porous filter 753A. The channel 774C may thus capture fine particles.

The first channel 774C1 of the channel 774C may be defined as a first area 775C. Consequently, as shown in FIG. 8C, the first through-hole 773C may serve as a first passable portion, allowing the target material (fluid) to flow between the first surface 771C and a first space 776C, which is beside a third surface 772C opposite to the first surface 771C, through the first area 775C of the channel 774C. In the third exemplary embodiment, the first through-hole 773C may serve as the first passable portion, allowing the target material flowing into the first area 775C of the channel 774 to be discharged into the first space 776C.

As shown in FIG. 8C, the first member 77C may include a flat portion 777C defined in the first surface 771C at the outside of the channel 774C. The flat portion 777C may include an annular portion and a portion radially extending from an inner periphery of the annular portion. The flat portion 777C may be provided by an unetched area of the first surface 771C. The flat portion 777C and the third surface 772C may be polished.

The second through-holes 783B may be arranged not to be inside an opening of the first through-hole 773C when the second member 78B is stacked on the first member 77C. At this time, the channel 744B may overlap with openings of the second through-holes 783B. The part of the channel 774C overlapping with the second through-holes 783B may be defined as a second area 778C of the channel 774C. The second groove 770C2 and fourth and fifth channels 774C4, 774C5 may be partly included in the second area 778C. Consequently, the second through-holes 783B may serve as a second passable portion, allowing the target material to flow between the second surface 781B and the second space 784B, which is beside the fourth surface 782B opposite to the second surface 781B, through the second area 778C of the channel 774C. In the third exemplary embodiment, the second through-holes 783B may serve as the second passable portion comparable to that of the second exemplary embodiment.

3.4.2 Operation

Next, description will be made on a manufacturing method of the filter, installation of the filter, and an operation of the target generator.

The same operation as that of the first and second exemplary embodiments will not be explained below.

3.4.2.1 Manufacturing Method of Filter and Installation of Filter

First, the first member 77C provided with the first through-hole 773C and the channel 774C and the second member 78B provided with the second through-holes 783B may be manufactured. The first member 77C may be manufactured in the same manner as the first member 77B except that a dry-etching technique is used in place of a wet-etching technique. The second member 78B may be stacked on the first member 77C with the second surface 781B of the second member 78B covering the channel 774C of the first member 77C. At this time, the first member 77C and the second member 78B may be diffusion-bonded to each other. The second filter 76C having the channel 774C with a depth of 3 μm or less may thus be provided. At this time, since the second through-holes 783B are point-symmetric with respect to the center of the second member 78B, the second groove 770C2 and the fourth and fifth channels 774C4, 774C5 may overlap with the openings of the second through-holes 783B to allow the target material to pass through the second filter 76C irrespective of a positional deviation of second member 78B in the rotation direction relative to the first member 77C. Since the first and second surfaces 771C, 781B are polished, a gap between the first surface 771C and the second surface 781B may be reduced. It should be noted that the diffusion bonding of the first member and the second member may be unessential for the third exemplary embodiment.

Next, description will be made on the installation of the second filter 76C in the target generator 8A. The second filter 76C may be attached between the nozzle base portion 82A and the nozzle distal portion 83A.

The eight second through-holes 783B of the second member 78B may be inside the opening of the second through-hole 822A so that the inside of the second through-hole 822A serves as the second space 784B. The first through-hole 773C of the first member 77C may be disposed in the opening of the third through-hole 832A facing in the +Z direction so that the inside of the third through-hole 832A serves as the first space 776A.

3.4.2.2 Operation of Target Supply Device

When the target generator 8A is heated to the melting point of the target material or higher, and the pressure in the target generator 8A is regulated, the target material, from which particles have been eliminated through the first filter 75A, may pass through the second filter 76C.

When reaching the second filter 76C, the target material may enter the second through-holes 783B of the second member 78B. After entering the second through-holes 783B, the target material may pass through the second groove 770C2, the fifth channel 774C5, the fourth channel 774C4, the third channel 774C3, the second channel 774C2 and the first channel 774C1 of the channel 774C in this order. At this time, the channel 774C may capture particles with a diameter larger than the depth of the channel 774C. Since the respective upper ends of the first and second spacers 7741C, 7742C are in contact with the second surface 781B, the channel 774C may be prevented from being deformed even when a pressure acts on the fourth surface 782B. Subsequently, the target material may enter the third through-hole 832A through the first through-hole 773C.

3.5 Fourth Exemplary Embodiment

3.5.1 Overview

A filter of a fourth exemplary embodiment of the present disclosure may include columnar spacers provided to a first surface thereof, and a channel defined by areas between adjacent ones of the columnar spacers.

In the filter of the fourth exemplary embodiment of the present disclosure, a first member of the filter may have the first surface partly projecting from a second surface of the filter, the channel may reach a position corresponding to an outer periphery of a second member, and a second passable portion may be provided by the part of the first surface projecting from the second surface and a side space facing the outer periphery of the second member.

3.5.2 Configuration

Figure 9A:
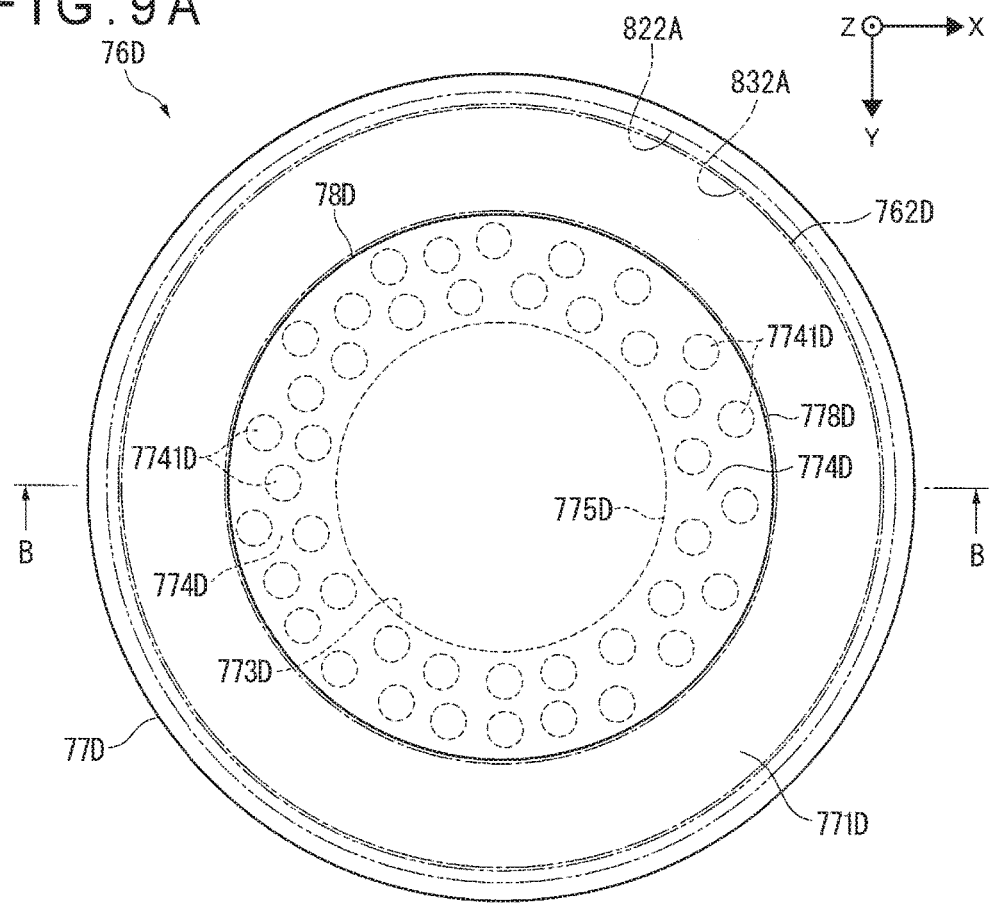
FIG. 9A schematically illustrates a second filter according to a fourth exemplary embodiment in the +Z direction.
Figure 9B:
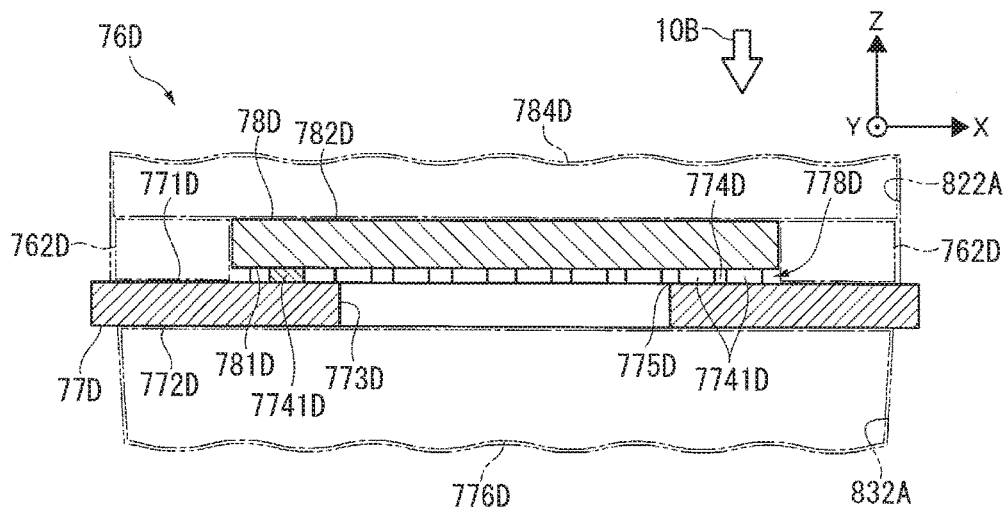
FIG. 9B is a sectional view taken along the line B-B in FIG. 9A.

FIG. 9A schematically illustrates a second filter according to the fourth exemplary embodiment in the +Z direction. FIG. 9B is a sectional view taken along the line B-B in FIG. 9A.

A target supply device of the fourth exemplary embodiment may be the same as the target supply device 7A of the first exemplary embodiment except a configuration of a second filter 76D.

The second filter 76D may be a filter according to the present disclosure. As shown in FIGS. 9A and 9B, the second filter 76D may include a first member 77D and a second member 78D.

The first and second members 77D, 78D may be made of a material unlikely to react with a target material and be substantially in the shape of a circular plate. For instance, the respective thicknesses of the first and second members 77D, 78D may be approximately 300 μm.

For instance, the diameter of the first member 77D may be approximately 5 mm. The first member 77D may be provided with a substantially circular first through-hole 773D at the center thereof, the first through-hole 773D penetrating in the top-bottom direction. A plurality of spacers 7741D may be arranged on a first surface 771D of the first member 77D facing in the +Z direction. The spacers 7741D may be columnar. The spacers 7741D may be independent of the first member 77D, or may be integral with the first member 77D. The spacers 7741D may be dotted in a substantially annular area around the first through-hole 773D.

Areas between adjacent ones of the spacers 7741D on the first surface 771D of the first member 77D may be defined as a channel 774D. For instance, the width of the channel 774D may be in a range from 10 μm to 150 μm. For instance, the depth of the channel 774D may be 3 μm or less. The channel 774D may thus capture fine particles. The first surface 771D and a third surface 772D of the first member 77D may be polished.

The diameter of the second member 78D may be smaller than the diameter of the first member 77D. The first member 77D may thus be disposed with the first surface 771D partly projecting from a second surface 781D of the second member 78D. When the second member 78D is stacked on the spacers 7741D of the first member 77D, the second surface 781D facing in the −Z direction may be in contact with the plurality of spacers 7741D.

An end of the channel 774D facing the first through-hole 773D may be defined as a first area 775D. Consequently, as shown in FIG. 9B, the first through-hole 773D may serve as a first passable portion, allowing the target material (fluid) to flow between the first surface 771D and a first space 776D, which is beside the third surface 772C opposite to the first surface 771D, through the first area 775D of the channel 774D. In the fourth exemplary embodiment, the first through-hole 773D may serve as the first passable portion, allowing the target material flowing into the first area 775D of the channel 774D to be discharged into the first space 776D.

An end of the channel 774D facing an outer periphery of the second member 78D may be defined as a second area 778D. Consequently, a combination of the part of the first surface 771D projecting outward from the second surface 781D and a side space 762D facing the outer periphery of the second member 78D may serve as a second passable portion, allowing the target material to flow between the second surface 781D and a second space 784D, which is beside a fourth surface 782D opposite to the second surface 781D, through the second area 778D of the channel 774D. In the fourth exemplary embodiment, the side space 762D may serve as the second passable portion, allowing the target material in the second space 784D to enter the second area 778D of the channel 774D. The second surface 781D and the fourth surface 782D may be polished.

3.5.3 Operation

Next, description will be made on a manufacturing method of the filter, installation of the filter, and an operation of the target generator.

The same operation as that of the first and second exemplary embodiments will not be explained below.

3.5.3.1 Manufacturing Method of Filter and Installation of Filter

First, the first member 77D provided with the first through-hole 773D may be manufactured. The plurality of spacers 7741D may be provided to the first surface 771D of the first member 77D to define the channel 774D. The second member 78D may be manufactured. The second member 78D may be stacked on the first member 77D with the second surface 781D of the second member 78D covering the channel 774D of the first member 77D. At this time, the first member 77D and the second member 78D may be diffusion-bonded to each other. The second filter 76D having the channel 774D with a depth of, for instance, 3 μm or less may thus be provided.

Next, description will be made on the installation of the second filter 76D in the target generator 8A. The second filter 76D may be attached between the nozzle base portion 82A and the nozzle distal portion 83A.

Consequently, the side space 762D of the second filter 76D may be inside an opening of the second through-hole 822A so that the inside of the second through-hole 822A serves as the second space 784D. The first through-hole 773D of the first member 77D may be inside an opening of the third through-hole 832A facing in the +Z direction so that the inside of the third through-hole 832A serves as the first space 776D.

3.5.3.2 Operation of Target Supply Device

When the target generator 8A is heated to the melting point of the target material or higher, and the pressure in the target generator 8A is regulated, the target material, from which particles have been eliminated through the first filter 75A, may pass through the second filter 76D.

When reaching the second filter 76D, the target material may enter the channel 774D through the side space 762D. At this time, the channel 774D may capture particles with a diameter larger than the depth of the channel 774D. Since the respective upper ends of the spacers 7741D are in contact with the second surface 781D, the channel 774D may be prevented from being deformed even when a pressure acts on the fourth surface 782D. Subsequently, the target material may enter the third through-hole 832A through the first through-hole 773D.

In the fourth exemplary embodiment, since the areas between adjacent ones of the spacers 7741D is defined as the channel 774D, the channel 774D may be easily provided without the necessity of boring of the first member 77D.

Since the second passable portion is provided by a combination of the part of the first surface 771D projecting outward from the second surface 781D and the side space 762D facing the outer periphery of the second member 78D, the second member 78D may be easily provided without the necessity of boring.

3.6 Fifth Exemplary Embodiment

3.6.1 Overview

In a filter of the fifth exemplary embodiment of the present disclosure, a second through-hole may penetrate through a substantial center of a second member.

In the filter of the fifth exemplary embodiment of the present disclosure, the second member may have a second surface partly projecting from a first surface of the filter, a channel may reach an outer periphery of the first member, and a first passable portion may be provided by the part of the second surface projecting from the first surface and a side space facing the outer periphery of the first member.

3.6.2 Configuration

Figure 10A:
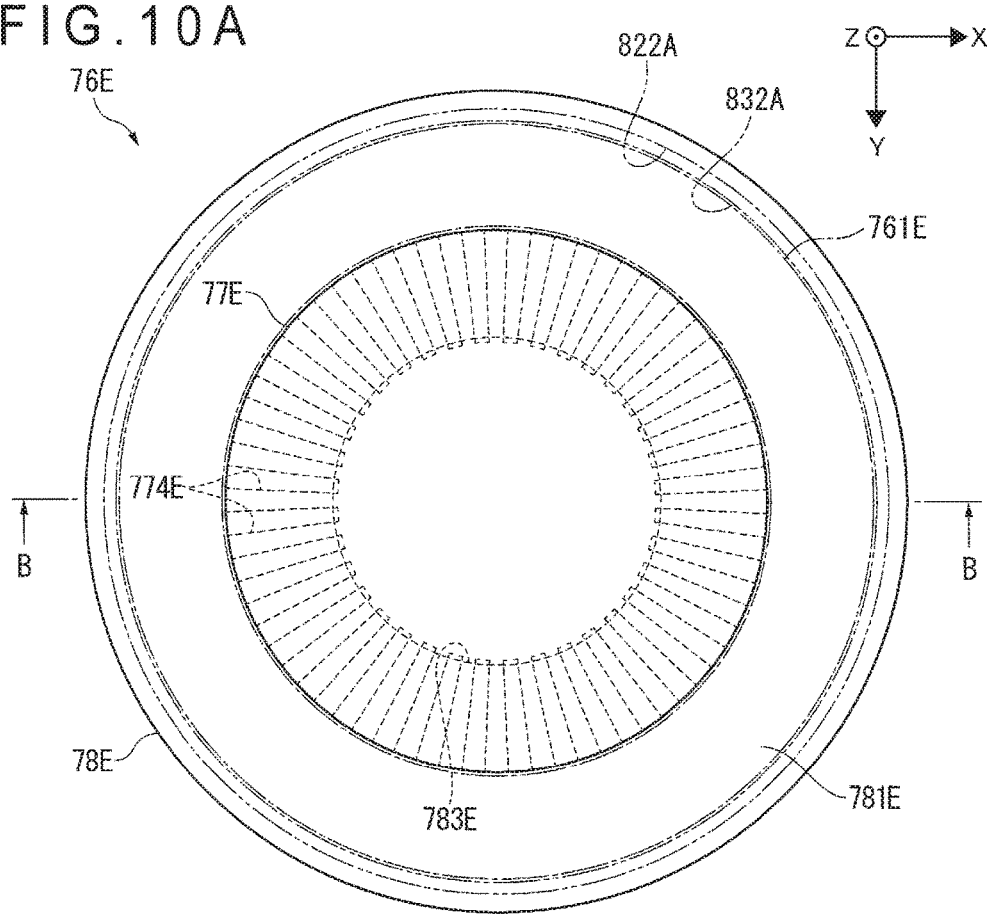
FIG. 10A schematically illustrates the second filter according to a fifth exemplary embodiment in the +Z direction.
Figure 10B:
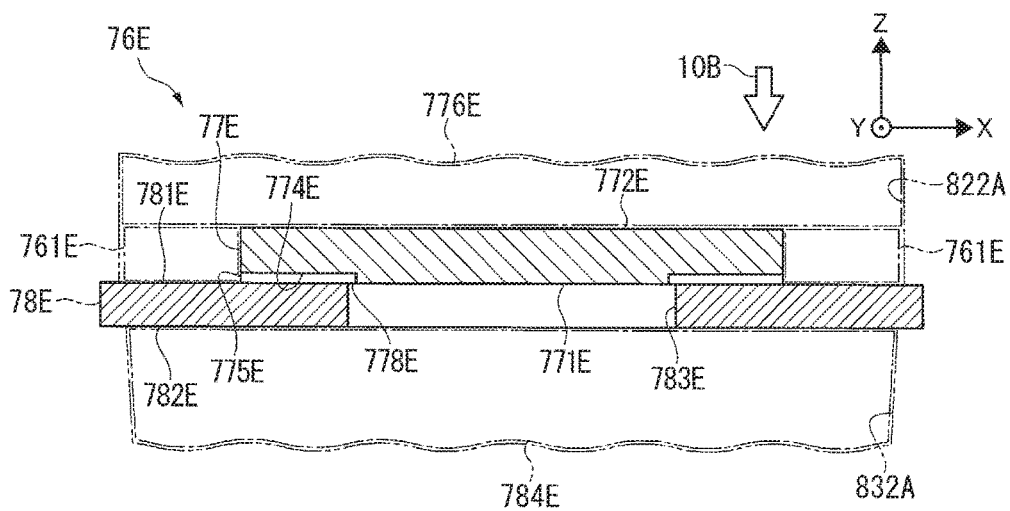
FIG. 10B is a sectional view taken along the line B-B in FIG. 10A.

FIG. 10A schematically illustrates a second filter according to the fifth exemplary embodiment in the +Z direction. FIG. 10B is a sectional view taken along the line B-B in FIG. 10A.

A target supply device of the fifth exemplary embodiment may be the same as the target supply device 7A of the first exemplary embodiment except a configuration of a second filter 76E.

The second filter 76E may be a filter according to the present disclosure. As shown in FIGS. 10A and 10B, the second filter 76E may include a first member 77E and a second member 78E. The first member 77E and the second member 78E may be substantially in the shape of a circular plate.

A plurality of channels 774E may be provided to a first surface 771E of the first member 77E facing in the –Z direction. The channels 774E may be grooves provided to the first surface 771E. The channels 774E may be provided to bring an outer periphery of the first member 77E in communication with a through-hole 783E (described later). The channels 774E may be radially arranged. For instance, the depth of the channels 774E may be 3 m or less. The channels 774E may thus capture particles.

The diameter of the second member 78E may be larger than the diameter of the first member 77E. The second member 78E may thus be set with a second surface 781E thereof partly projecting from the first surface 771E. The second member 78E may be stacked on a lower side of the first member 77E. The second member 78E may be set with the second surface 781E thereof covering the channels 774E. The substantially circular through-hole 783E may be provided at the center of the second member 78E. The through-hole 783E may serve as a second through-hole of the present disclosure.

Ends of the channels 774E facing an outer periphery of the second member 78E may be defined as a first area 775E. Consequently, the part of the second surface 781E projecting outward from the first surface 771E and a side space 761E facing the outer periphery of the first member 77E may serve as a first passable portion, allowing a target material to flow between the first surface 771E and a first space 776E, which is beside a third surface 772E opposite to the first surface 771E, through the first area 775E of the channels 774E. In the fifth exemplary embodiment, the side space 761E may serve as the first passable portion, allowing the target material in the first space 776E to enter the first area 775E of the channels 774E.

Ends of the channels 774E facing the through-hole 783E may be defined as a second area 778E. Consequently, the through-hole 783E may serve as a second passable portion, allowing the target material to flow between the second surface 781E and a second space 784E, which is beside the fourth surface 782E opposite to the second surface 781E, through the second area 778E of the channels 774E. In the fifth exemplary embodiment, the through-hole 783E may serve as the second passable portion, allowing the target material flowing into the second area 778E of the channels 774E to be discharged into the second space 784E.

3.6.3 Operation

Next, description will be made on a manufacturing method of the filter, installation of the filter, and an operation of the target generator.

The same operation as that of the first and second exemplary embodiments will not be explained below.

3.6.3.1 Manufacturing Method of Filter and Installation of Filter

First, the first member 77E provided with the channels 774E may be manufactured. The second member 78E provided with the through-hole 783E may be manufactured. The first member 77E may be stacked on the second member 78E with the second surface 781E of the second member 78E covering the channels 774E of the first member 77E. At this time, the first member 77E and the second member 78E may be diffusion-bonded to each other. The second filter 76E having the channels 774E with a depth of, for instance, 3 μm or less may thus be provided.

Next, description will be made on the installation of the second filter 76E in the target generator 8A. The second filter 76E may be attached between the nozzle base portion 82A and the nozzle distal portion 83A.

Consequently, the side space 761E of the second filter 76E may be inside an opening of the second through-hole 822A so that the inside of the second through-hole 822A serves as the first space 776E. The through-hole 783E of the second member 78E may be inside an opening of the third through-hole 832A facing in the +Z direction so that the inside of the third through-hole 832A serves as the second space 784E.

3.6.3.2 Operation of Target Supply Device

When the target generator 8A is heated to the melting point of the target material or higher, and the pressure in the target generator 8A is regulated, the target material, from which particles have been eliminated through the first filter 75A, may pass through the second filter 76E.

When reaching the second filter 76E, the target material may enter the channels 774E through the side space 761E.

At this time, the channels 774E may capture particles with a diameter larger than the depth of the channels 774E. Subsequently, the target material may enter the through-hole 783E through the third through-hole 832A.

In the fifth exemplary embodiment, since the first passable portion is provided by a combination of the part of the second surface 781E projecting outward from the first surface 771E and the side space 761E facing the outer periphery of the first member 77E, the first passable portion may be easily provided without the necessity of boring the first member 77E.

3.7 Sixth Exemplary Embodiment

3.7.1 Overview

In a filter of the sixth exemplary embodiment of the present disclosure, a first member may include a first plate-shaped member and a second plate-shaped member stacked on the first plate-shaped member, and a channel may be provided by a third through-hole penetrating through the second plate-shaped member.

3.7.2 Configuration

Figure 11A:
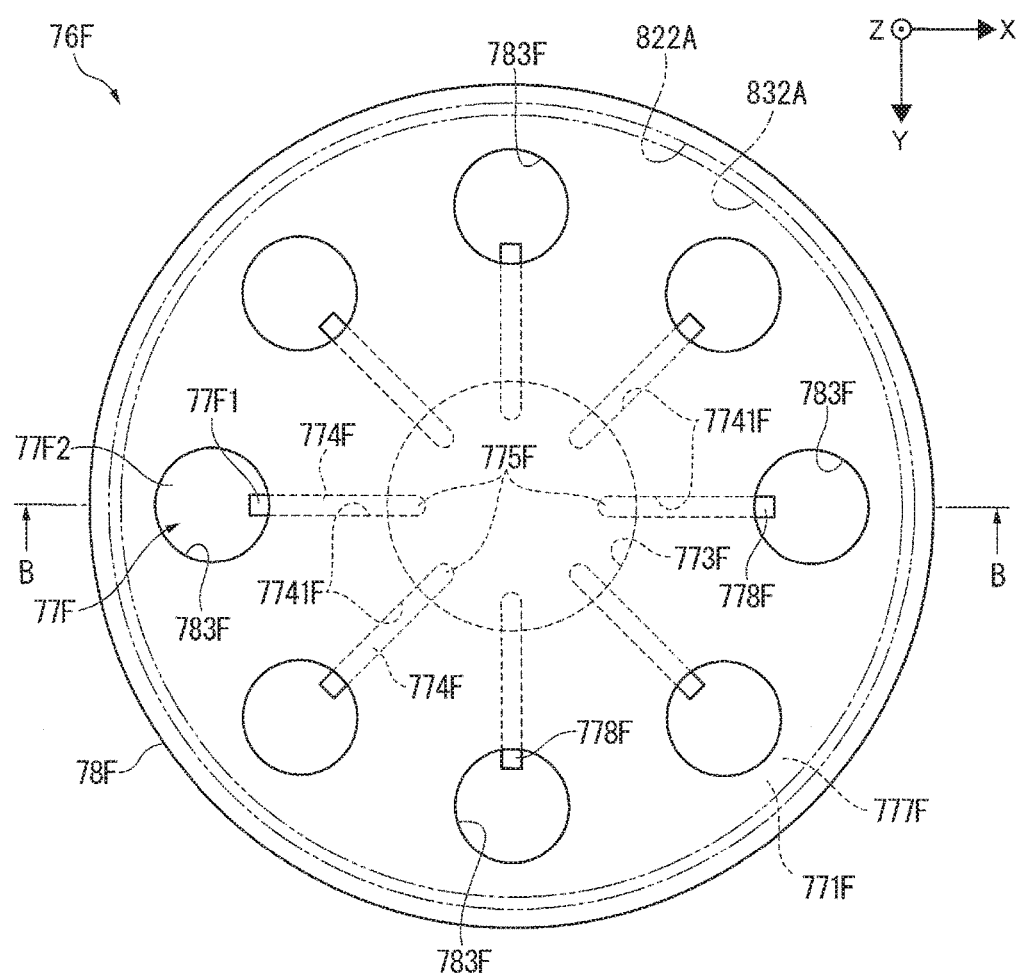
FIG. 11A schematically illustrates a second filter according to a sixth exemplary embodiment in the +Z direction.
Figure 11B:
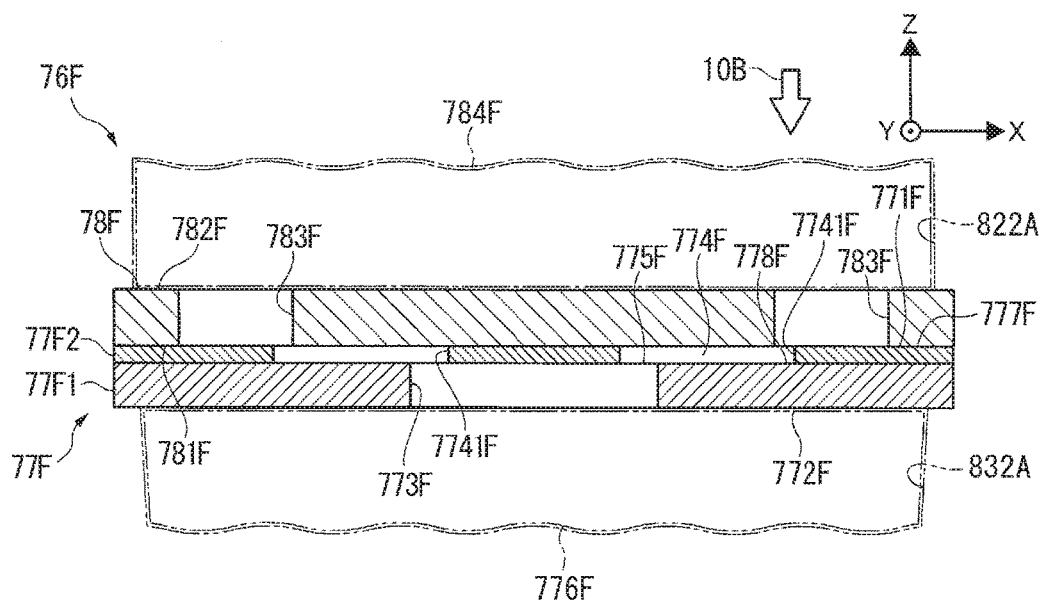
FIG. 11B is a sectional view taken along the line B-B in FIG. 11A.

FIG. 11A schematically illustrates a second filter according to the sixth exemplary embodiment in the +Z direction. FIG. 11B is a sectional view taken along the line B-B in FIG. 11A. FIG. 11 schematically illustrates a modification of a channel in the second filter.

A target supply device of the sixth exemplary embodiment may be the same as the target supply device 7A of the first exemplary embodiment except a configuration of a second filter 76F.

The second filter 76F may be a filter according to the present disclosure. As shown in FIGS. 11A and 11B, the second filter 76F may include a first member 77F and a second member 78F.

The first and second members 77F, 78F may be made of a material unlikely to react with a target material and be substantially in the shape of a circular plate. For instance, the respective thicknesses of the first and second members 77F, 78F may be approximately 300 μm. For instance, the respective diameters of the first and second members 77F, 78F may be approximately 5 mm.

The first member 77F may include a first plate-shaped member 77F1 and a second plate-shaped member 77F2.

For instance, the thickness of the first plate-shaped member 77F1 may be smaller than that of the second member 78F. A first through-hole 773F may be provided at the center of the first plate-shaped member 77F1, the first through-hole 773F penetrating in the top-bottom direction.

For instance, the thickness of the second plate-shaped member 77F2 may be approximately 3 μm or less. The second plate-shaped member 77F2 may be provided with, for instance, eight slit-shaped third through-holes 7741F penetrating in the top-bottom direction. The third through-holes 7741F may radially extend from a position spaced from the center of the second plate-shaped member 77F2 at a predetermined distance. The third through-holes 7741F may be arranged substantially at regular intervals along an outer circumferential direction of the second plate-shaped member 77F2. The third through-holes 7741F may thus be point-symmetric with respect to the center of the second plate-shaped member 77F2.

The second plate-shaped member 77F2 may be set on a surface of the first plate-shaped member 77F1 facing the +Z direction. The third through-holes 7741F may thus define channels 774F with a depth of, for instance, 3 μm or less. The channels 774F may capture particles.

Ends of the channels 774F facing the center of the second plate-shaped member 77F2 may be defined as a first area 775E. Consequently, the first through-hole 773F may serve as a first passable portion, allowing a target material to flow between a first surface 771F of the first member 77F and a first space 776F, which is beside a third surface 772F opposite to the first surface 771F, through the first area 775F of the channels 774F. In the sixth exemplary embodiment, the first through-hole 773F may serve as the first passable portion, allowing the target material flowing into the first area 775F of the channels 774F to be discharged into the first space 776F.

A flat portion 777F may be provided to the first surface 771F of the first member 77F at the outside of the channels 774F.

The second member 78F may be stacked on an upper side of the first member 77F. The second member 78F may be set with a second surface 781E thereof covering the channels 774F of the first member 77F.

The second member 78F may be provided with eight substantially circular second through-holes 783F penetrating in the top-bottom direction. The second through-holes 783F may be arranged substantially at regular intervals along an outer circumferential direction of the second member 78F. The second through-holes 783F may thus be point-symmetric with respect to the center of the second member 78F. The second through-holes 783F may be arranged not to be inside an opening of the first through-hole 773F when the second member 78F is stacked on the first member 77F. At this time, the channels 774F may overlap with openings of the second through-holes 783F. The part of the channels 774F overlapping with the second through-holes 783F may be defined as a second area 778F. Consequently, the second through-holes 783F may serve as a second passable portion, allowing the target material to flow between the second surface 781F and a second space 784F, which is beside a fourth surface 782F opposite to the second surface 781F, through the second area 778F of the channels 774F. In the sixth exemplary embodiment, the second through-holes 783F may serve as the second passable portion, allowing the target material in the second space 784F to enter the second area 778F of the channels 774F.

Figure 11C:
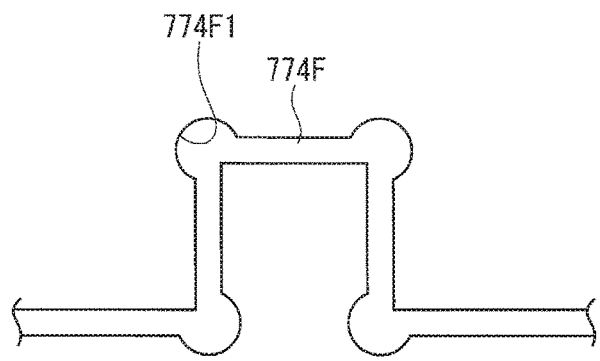
FIG. 11C schematically illustrates a modification of a channel in the second filter.

It should be noted that the channels 774F may each be in the shape of a crank as shown in FIG. 11C. Corners 774F1 of the channels 774F may project outward substantially in a circle. Particles may thus be captured at the corners 774F1 to restrain the channels 774F from being clogged with the particles.

3.7.3 Operation

Next, description will be made on a manufacturing method of the filter, installation of the filter, and an operation of the target generator.

The same operation as that of the first and second exemplary embodiments will not be explained below.

3.7.3.1 Manufacturing Method of Filter and Installation of Filter

Figure 12:
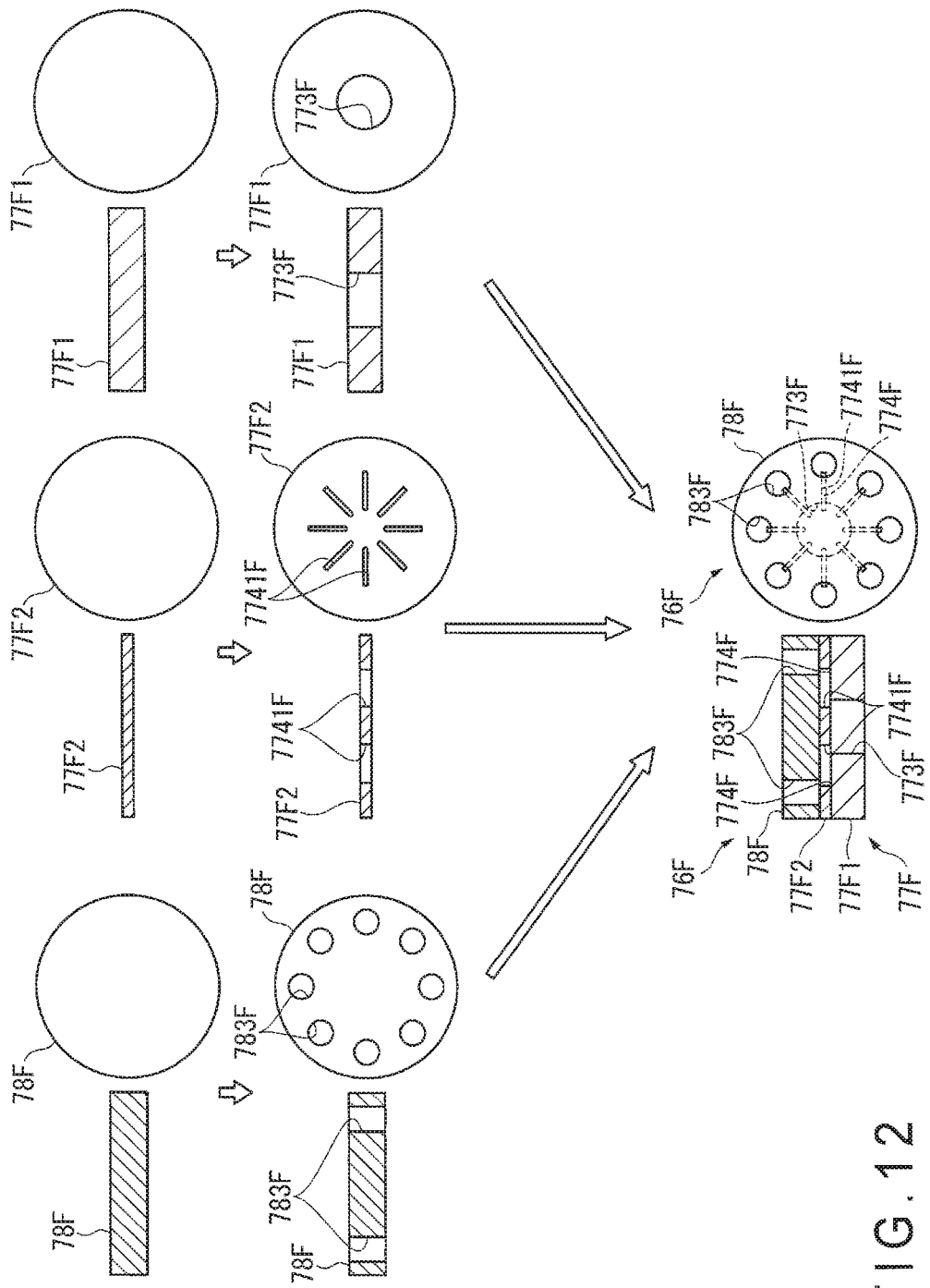
FIG. 12 schematically illustrates a manufacturing method of the second filter.

FIG. 12 schematically illustrates a manufacturing method of the second filter.

As shown in FIG. 12, the first plate-shaped member 77F1 made of molybdenum may be prepared. The first plate-shaped member 77F1 may be cut out of a plate large enough that a plurality of first plate-shaped members 77F1 can be cut out in the same manner as the first member 77F of the second exemplary embodiment. It should be noted that the second plate-shaped member 77F2 (described later) and the second member 78F may also be cut out of such a large plate. The first through-hole 773F may be provided by boring the first plate-shaped member 77F1 substantially at the center thereof.

Both surfaces of the first plate-shaped member 77F1 may be polished and washed. Manufacturing of the first plate-shaped member 77F1 may thus be completed.

The second plate-shaped member 77F2 made of molybdenum may be prepared. The third through-holes 7741F may be provided by boring the second plate-shaped member 77F2 at a plurality of spots.

Both surfaces of the second plate-shaped member 77F2 may be polished and washed. Manufacturing of the second plate-shaped member 77F2 may thus be completed.

The second member 78F made of molybdenum may be prepared. The second through-holes 783F may be provided by boring the second member 78F at a plurality of spots.

Both surfaces of the second member 78F may be polished and washed. Manufacturing of the second member 78F may thus be completed.

The second plate-shaped member 77F2 may be stacked on the first plate-shaped member 77F1 to provide the first member 77F.

The second member 78F may be stacked on the first member 77F with the second surface 781F of the second member 78F covering the channels 774F of the first member 77F. At this time, the first member 77F and the second member 78F may be diffusion-bonded to each other. The second filter 76F having the channels 774F with a depth of 3 μm or less may thus be manufactured. At this time, since the second through-holes 783F are point-symmetric with respect to the center of the second member 78F, the channels 774F may overlap with the openings of the second through-holes 783F to allow the target material to pass through the second filter 76F irrespective of a slight positional deviation of the second member 78F in the rotation direction relative to the first member 77F. Since the first and second surfaces 771F, 781F are polished, a gap between the first and second plate-shaped members 77F1, 77F2 may be reduced. Since the respective contact surfaces of the first and second plate-shaped members 77F1, 77F2 are polished, the gap between the first and second plate-shaped members 77F1, 77F2 may be reduced. It should be noted that the diffusion bonding of the first member and the second member may be unessential for the sixth exemplary embodiment.

Next, description will be made on the installation of the second filter 76F in the target generator 8A. The second filter 76F may be attached between the nozzle base portion 82A and the nozzle distal portion 83A.

The eight second through-holes 783F of the second member 78F may be inside the opening of the second through-hole 822A so that the inside of the second through-hole 822A serves as the second space 784F. The second through-hole 773F of the first member 77F may be inside an opening of the third through-hole 832A facing in the +Z direction so that the inside of the third through-hole 832A serves as the first space 776F.

3.7.3.2 Operation of Target Supply Device

When the target generator 8A is heated to the melting point of the target material or higher, and the pressure in the target generator 8A is regulated, the target material, from which particles have been eliminated through the first filter 75A, may pass through the second filter 76F.

When reaching the second filter 76F, the target material may enter the second through-holes 783F of the second member 78F. After entering the second through-holes 783F, the target material may pass through the channels 774F. At this time, the channels 774F may capture particles with a diameter larger than the depth of the channels 774F. Subsequently, the target material may enter the third through-hole 832A through the first through-hole 773F.

In the sixth exemplary embodiment, since the channels 774E are provided by the third through-holes 7741F penetrating through the second plate-shaped member 77F2, the channels 774E may be easily provided as compared with an instance where grooves are made.

3.8 Seventh Exemplary Embodiment

3.8.1 Overview

In a target supply device according to a seventh exemplary of the present disclosure, a second member may be disposed downstream of a first member in an output direction of a target material, a second passable portion may be provided by a second through-hole penetrating through the second member, and an opening of the second through-hole facing in the output direction may be defined as a nozzle hole.

3.8.2 Configuration

Figure 13A:
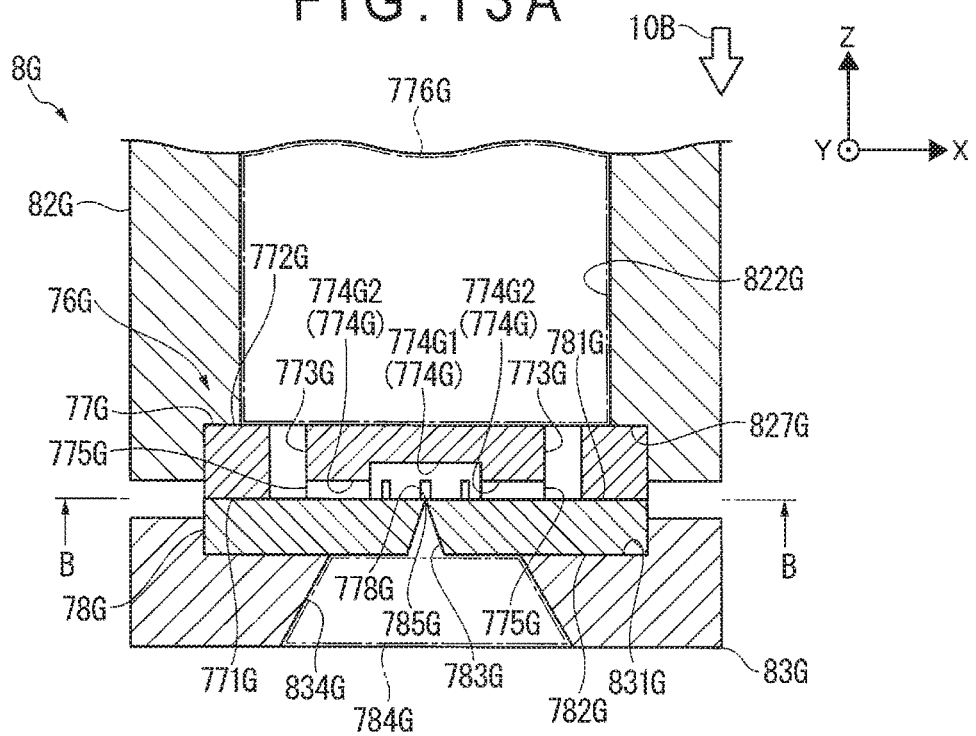
FIG. 13A schematically illustrates a relevant part of a target supply device according to a seventh exemplary embodiment.
Figure 13B:
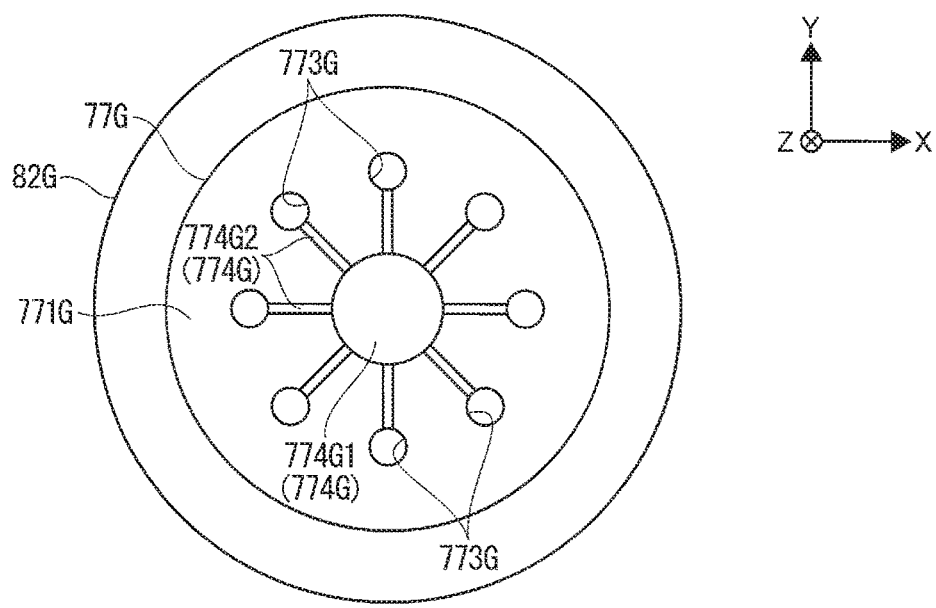
FIG. 13B is a sectional view taken along the line B-B in FIG. 13A.

FIG. 13A schematically illustrates a relevant part of a target supply device according to the seventh exemplary embodiment. FIG. 13B is a sectional view taken along the line B-B in FIG. 13A.

The target supply device of the seventh exemplary embodiment may be the same as the target supply device 7A of the first exemplary embodiment except configurations of a target generator 8G and a filter 76G.

The target generator 8G may include the first filter 75A or not. As shown in FIGS. 13A, 13B, the target generator 8G may include a nozzle base portion 82G attached to an end of a tank (not shown), and a nozzle distal portion 83G. The nozzle base portion 82G and the nozzle distal portion 83G may be made of a material unlikely to react with a target material.

The nozzle base portion 82G may be provided with a 20 second through-hole 822G at the center thereof, the second through-hole 822G penetrating in the Z-axis direction. For instance, the inner diameter of the second through-hole 822G may be 3 mm. The nozzle base portion 82G may be provided with a recessed portion 827G.

The nozzle distal portion 83G may be substantially cylindrical, and have a flat portion with an outline larger than the diameter of the second through-hole 822G. An upper surface of the nozzle distal portion 83G may be provided with a recessed portion 831G. A conical hole 843G penetrating in the top-bottom direction may be provided in the middle of the nozzle distal portion 83G. The conical hole 834G may be in a conical shape with a diameter increased in the −Z direction.

The filter 76G may be attached to an end of the nozzle base portion 82G to close the second through-hole 822G. The filter 76G may include a first member 77G and a second member 78G.

The first and second members 77G, 78G may be made of a material unlikely to react with a target material and be substantially in the shape of a circular plate. The respective diameter of the first and second members 77G, 78G may be larger than the diameter of the second through-hole 822G.

The first member 77F may be provided with, for instance, eight substantially circular first through-holes 773G penetrating in the top-bottom direction. The first through-holes 773G may be arranged substantially at regular intervals along an outer circumferential direction of the first member 77G. The first through-holes 773G may thus be point-symmetric with respect to the center of the first member 77G. A substantially circular first channel 774G1 may be provided to a first surface 771G of the first member 77G facing in the −Z direction. The first channel 774G1 may be provided at the center of the first surface 771G. Second channels 774G2 may be provided to the first surface 771G. The second channels 774G2 may radially extend from an outer periphery of the first channel 774G1 toward the first through-holes 773G. The first and second channels 774G1, 774G2 may be grooves provided to the first surface 771G. The second channels 774G2 may be arranged substantially at regular intervals along an outer circumferential direction of the first member 77G. The second channels 774G2 may thus be point-symmetric with respect to the center of the first member 77G. The first and second channels 774G1, 774G2 may define a channel 774G. The depth of the second channels 774G2 may be smaller than that of the first channel 774G1. For instance, the depth of the second channels 774G2 may be approximately 3 µm or less. The channel 774G may thus capture particles.

An end of the channel 774G facing the first through-holes 773G may be defined as a first area 775G. Consequently, the first through-hole 773F may serve as a first passable portion, allowing a target material (fluid) to flow between the first surface 771G of the first member 77G and a first space 776G, which is beside a third surface 772G opposite to the first surface 771G, through the first area 775G of the channel 774G. In the seventh exemplary embodiment, the first through-holes 773G may serve as the first passable portion, allowing the target material in the first space 776G to enter the first area 775G of the channel 774G. The first surface 771G and the third surface 772G may be polished.

The second member 78G may be stacked on the first member 77G. The second member 78G may be set with a second surface 781G thereof facing in the +Z direction covering the channel 774G of the first member 77G.

The second member 78G may be provided with a second through-hole 783G at the center thereof, the second through-hole 783G penetrating in the Z-axis direction. The second through-hole 783G may be in a conical shape with a diameter increased in the −Z direction. An upper opening of the second through-hole 783G may be defined as a nozzle hole 785G. For instance, the diameter of the nozzle hole 785G may be in a range from 1 µm to 3 µm. The second through-hole 783G may be disposed not to be inside openings of the first through-holes 773G when the second member 78G is stacked on the first member 77G. At this time, the channel 774G may overlap with an opening of the nozzle hole 785G defined by the second through-hole 783G. The part of the channel 774G overlapping with the opening of the second through-hole 783G may be defined as a second area 778G. Consequently, the second through-hole 783G may serve as a second passable portion, allowing the target material to flow between the second surface 781G and a second space 784G, which is beside a fourth surface 782G opposite to the second surface 781G, through the second area 778G of the channel 774G. In the seventh exemplary embodiment, the second through-hole 783G may serve as the second passable portion, allowing the target material flowing into the second area 778G of the channel 774G to be discharged into the second space 784G. The second surface 781G and the fourth surface 782G may be polished.

3.8.3 Operation

Next, description will be made on installation of the filter, and an operation of the target supply device.

The same operation as that of the first and second exemplary embodiments will not be explained below.

3.8.3.1 Installation of Filter

First, the first member 77G and the second member 78G may be diffusion-bonded with the channel 774G of the first member 77G being covered by the second surface 781G of the second member 78G. The filter 76G with the channel 774G may thus be provided, the channel 774G having a depth of 3 m or less at the shallowest portion therein. Since the first and second surfaces 771G, 781G are polished, a gap therebetween may be reduced. It should be noted that the diffusion bonding of the first member and the second member may be unessential for the seventh exemplary embodiment.

Next, the filter 76G may be inserted in the recessed portion 831G of the nozzle distal portion 83G, and the nozzle distal portion 83G may be attached to the nozzle base portion 82G with a bolt (not shown). At this time, the first member 77G may be inserted in the recessed portion 827G. The second member 78G may be disposed at a −Z side of the first member 77G.

Consequently, the eight first through-holes 773G of the first member 77G may be inside the opening of the second through-hole 822G so that the inside of the second through-hole 822G serves as the first space 776G. The second through-hole 783G of the second member 78G may be inside an opening of the conical hole 834G facing in the +Z direction so that the inside of the conical hole 834G serves as the second space 784G.

3.8.3.2 Operation of Target Supply Device

When the target generator 8G is heated to the melting point of the target material or higher, and the pressure in the target generator 8G is regulated, the target material is allowed to pass through the filter 76G.

When reaching the filter 76G, the target material may pass through the channel 774G from the first through-holes 773G. At this time, the channel 774G may capture particles with a diameter larger than the depth of the channel 774G.

Subsequently, the target controller may regulate the pressure in the target generator 8G to output the target material as the droplet 27 through the nozzle hole 785G.

In the seventh exemplary embodiment, the opening of the second through-hole 783G facing in the output direction of the target material defines the nozzle hole 785G, so that the filter 76G may have a particle-capturing function and a nozzle function.

3.9 Eighth Exemplary Embodiment

3.9.1 Configuration

Figure 14:
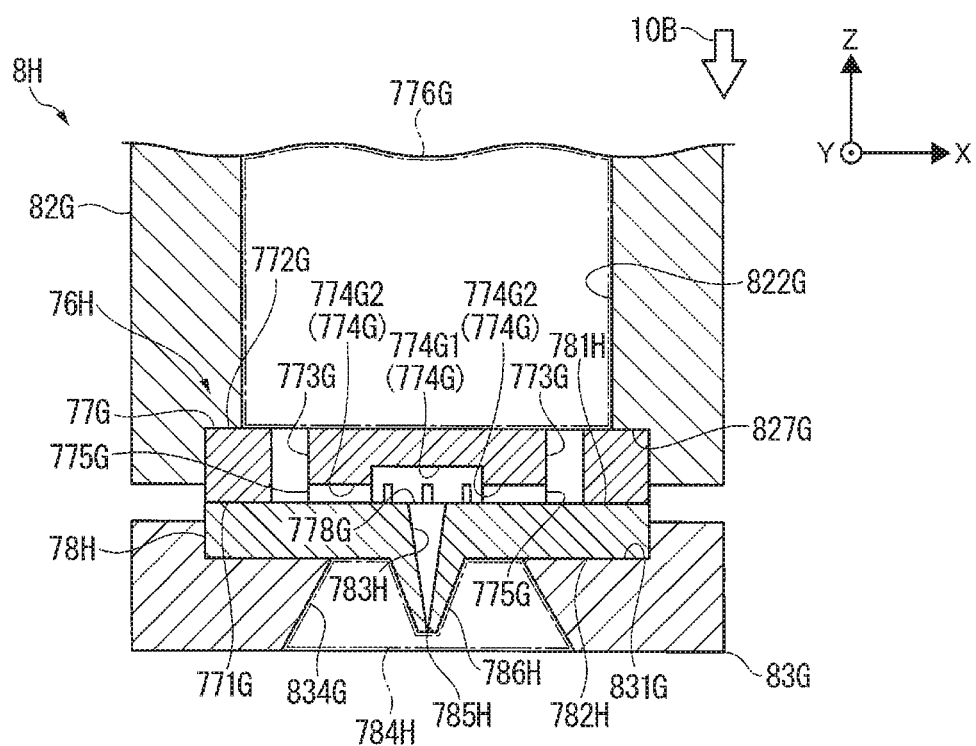
FIG. 14 schematically illustrates a relevant part of a target supply device according to an eighth exemplary embodiment.

FIG. 14 schematically illustrates a relevant part of a target supply device according to an eighth exemplary embodiment.

The target supply device of the eighth exemplary embodiment may be the same as the target supply device of the seventh exemplary embodiment except a configuration of a second member 78H of a filter 76H of a target generator 8H.

As shown in FIG. 14, the second member 78H of the filter 76H may be made of a material unlikely to react with a target material and be substantially in the shape of a circular plate. The second member 78H may be set with a second surface 781H thereof facing in the +Z direction covering the channel 774G of the first member 77G.

A projection 786H in the shape of a truncated cone may be provided to a fourth surface 782H of the second member 78H facing in the −Z direction at the center of the fourth surface 782H. When an electric field is used to generate a droplet, the electric field may tend to concentrate on the projection 786H. The second member 78H may be provided with a second through-hole 783H at the center thereof, the second through-hole 783H penetrating in the Z-axis direction. The second through-hole 783H may be in a conical shape with a diameter reduced in the −Z direction. An opening of the second through-hole 783H facing in the −Z direction, i.e., an opening at the center of an end of the projection 786H, may be defined as a nozzle hole 785H. For instance, the diameter of the nozzle hole 785H may be in a range from 1 μm to 3 μm. The second through-hole 783H may be disposed not to be inside openings of the first through-holes 773G when the second member 78H is stacked on the first member 77G. At this time, the channel 774G may overlap with an opening of the second through-hole 783H. The part of the channel 774G overlapping with the opening of the second through-hole 783H may be defined as the second area 778G. Consequently, the second through-hole 783H may serve as a second passable portion, allowing the target material to flow between the second surface 781H and a second space 784H, which is beside the fourth surface 782H opposite to the second surface 781H, through the second area 778G of the channel 774G. In the eighth exemplary embodiment, the second through-hole 783H may serve as the second passable portion, allowing the target material flowing into the second area 778G of the channel 774G to be discharged into the second space 784H. The second surface 781H and the fourth surface 782H may be polished.

3.9.2 Operation

Next, description will be made on installation of the filter, and an operation of the target generator.

The same operation as one described in the first exemplary embodiment will not be explained below.

3.9.2.1 Installation of Filter

First, the first member 77G and the second member 78H may be diffusion-bonded with the channel 774G of the first member 77G being covered by the second surface 781H of the second member 78H. The filter 76H with the channel 774G may thus be provided, the channel 774G having a depth of 3 μm or less at the shallowest portion therein. Since the first and second surfaces 771G, 781H are polished, a gap therebetween may be reduced.

Next, the filter 76H may be attached to be held between the nozzle base portion 82G and the nozzle distal portion 83G. The second member 78H may be disposed at a −Z side of the first member 77G.

Consequently, the second through-hole 783H of the second member 78H may be disposed in the conical hole 834G so that the inside of the conical hole 834G serves as the second space 784H.

3.9.2.2 Operation of Target Supply Device

When the target generator 8H is heated to the melting point of the target material or higher, and the pressure in the target generator 8H is regulated, the target material may pass through the second filter 76H.

When reaching the filter 76H, the target material may pass through the channel 774G from the first through-holes 773G. At this time, the channel 774G may capture particles with a diameter larger than the depth of the channel 774G.

Subsequently, the target controller may regulate the pressure in the target generator 8H to output the target material as the droplet 27 through the nozzle hole 785.

3.10 Ninth Exemplary Embodiment

3.10.1 Configuration

Figure 15A:
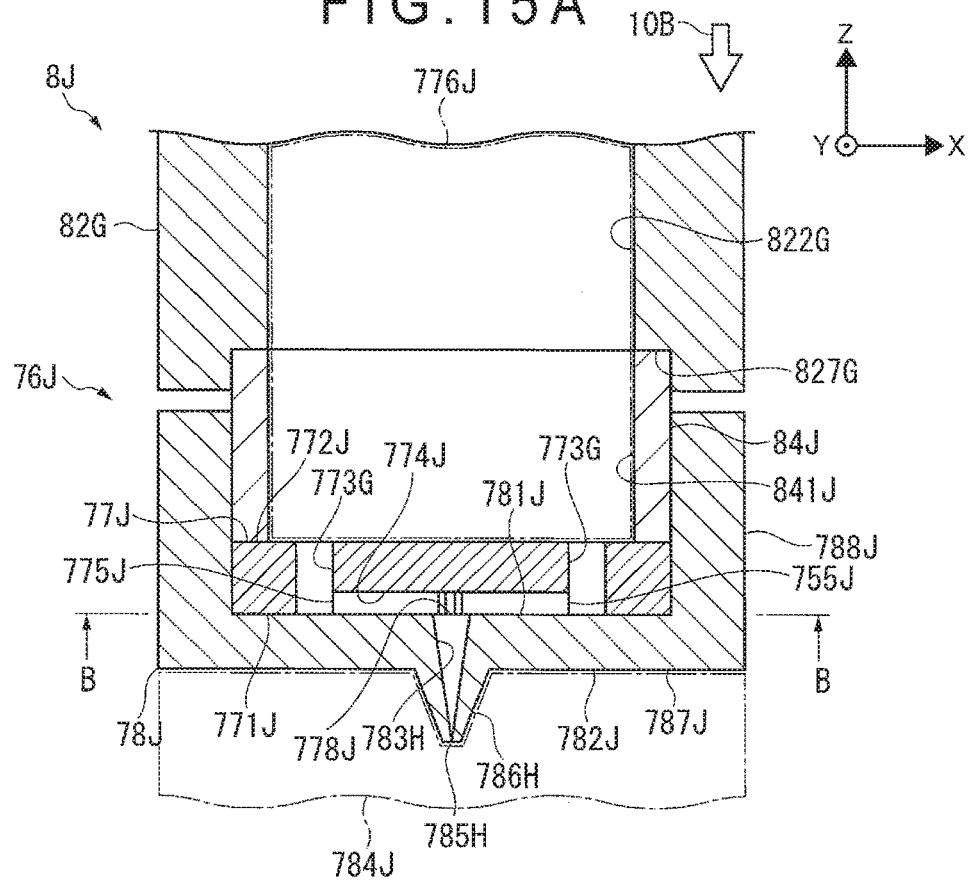
FIG. 15A schematically illustrates a relevant part of a target supply device according to a ninth exemplary embodiment.
Figure 15B:
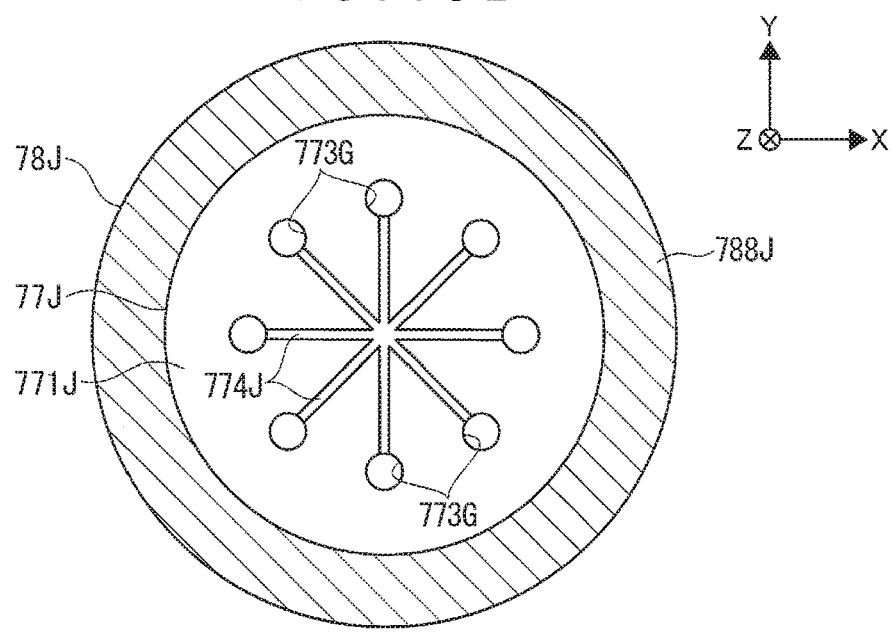
FIG. 15B is a sectional view taken along the line B-B in FIG. 15A.

FIG. 15A schematically illustrates a relevant part of a target supply device according to the ninth exemplary embodiment. FIG. 15B is a sectional view taken along the line B-B in FIG. 15A.

The target supply device of the ninth exemplary embodiment may be the same as the target supply device of the seventh exemplary embodiment except a configuration of a filter 76J of a target generator 8J.

The target generator 8J may include the nozzle base portion 82G and a pipe 84J. The pipe 84J may be made of a material unlikely to react with a target material. The inner diameter of a through-hole 841J of the pipe 84J may be substantially the same as that of the second through-hole 822G of the nozzle base portion 82G. A +Z side end of the pipe 84J may be inserted in the recessed portion 827G of the nozzle base portion 82G. A +Z side end surface of the pipe 84J and a surface of the recessed portion 827G of the nozzle base portion 82G may be polished so that these surfaces can be sealed with each other when the pipe 84J is inserted in the recessed portion 827G.

The filter 76J may close the through-hole 841J at an end of the pipe 84J. The filter 76J may include a first member 77J and a second member 78J.

The first and second members 77J, 78J may be made of a material unlikely to react with a target material. The respective outlines of the first and second members 77J, 78J may be larger than the diameter of the through-hole 841J.

The first member 77J may be provided with, for instance, eight first through-holes 773G. A first surface 771J of the first member 77J facing in the −Z direction may be provided with a channel 774J. The channel 774J may be in the form of grooves provided to the first surface 771J. The channel 774J may radially extend from the center of the first surface 771J toward the first through-holes 773G. For instance, the depth of the channel 774J may be 3 μm or less. The channel 774J may thus capture particles.

An end of the channel 774J facing the first through-holes 773G may be defined as a first area 775J. Consequently, the first through-holes 773G may serve as a first passable portion, allowing the target material (fluid) to flow between the first surface 771J of the first member 77J and a first space 776J, which is beside a third surface 772J opposite to the first surface 771J, through the first area 775J of the channel 774J. In the ninth exemplary embodiment, the first through-holes 773G may serve as a second passable portion, allowing the target material in the first space 776J to enter the first area 775J of the channel 774J. The first surface 771J and the third surface 772J may be polished.

The second member 78J may include a plate-shaped portion 787J and a cylindrical portion 788J. The plate-shaped portion 787J may be substantially in the shape of a circular plate. The outer diameter of the plate-shaped portion 787J may be larger than that of the first member 77J. A fourth surface 782J of the plate-shaped portion 787J facing in the −Z direction may be provided with the projection 786H at the center thereof. The second through-hole 783H may be provided at the center of the plate-shaped portion 787J. A lower opening of the second through-hole 783H may be defined as the nozzle hole 785H.

The cylindrical portion 788J may be provided to an outer periphery of the plate-shaped portion 787J in a plan view.

In the second member 78J, the first member 77J may be disposed with the channels 774J of the first member 77J being covered by a second surface 781J of the second member 78J facing in the +Z direction. At this time, an outer circumferential surface of the first member 77J may be sealed with an inner circumferential surface of the cylindrical portion 788J. The first surface 771J and the second surface 781J may be sealed with each other. The second through-hole 783H may be disposed not to be inside openings of the first through-holes 773G when the first member 77J is disposed in the second member 78J. At this time, the channels 774J may overlap with an opening of the second through-hole 783H. The part of the channels 744J overlapping with the second through-hole 783H may be defined as a second area 778J. Consequently, the second through-hole 783H may serve as the second passable portion, allowing the target material to flow between the second surface 781J and a second space 784J, which is beside the fourth surface 782J opposite to the second surface 781J, through the second area 778J of the channels 774J. In the ninth exemplary embodiment, the second through-hole 783H may serve as the second passable portion, allowing the target material flowing into the second area 778J of the channels 774J to be discharged into the second space 784J. The pipe 84J may be disposed on the third surface 772J of the first member 77J. At this time, an outer circumferential surface of the pipe 84J may be sealed with the inner circumferential surface of the cylindrical portion 788J. The third surface 772J and the second surface 781J may be polished. A −Z-side end surface of the pipe 84J may be polished. An inner circumferential surface of the fourth surface 782J may be polished. An inner circumferential surface of the cylindrical portion 788J may be polished.

3.10.2 Operation

Next, description will be made on installation of the filter.

The same operation as that of the first and second exemplary embodiments will not be explained below.

First, the first member 77J may be set in the second member 78J with the channels 774J of the first member 77J being covered by the second surface 781J of the second member 78J. The filter 76J having the channels 774J with a depth of 3 m or less may thus be provided.

Next, the pipe 84J may be set in the second member 78J. The second member 78J of the filter 76J may be attached to the nozzle base portion 82G with a bolt (not shown). At this time, the pipe 84J may be inserted in the recessed portion 827G. The second member 78J may be disposed at a −Z side of the first member 77J.

The eight first through-holes 773G of the first member 77J may thus be inside the opening of the through-hole 841J so that the inside of the through-hole 841J serves as the first space 776J. The second through-hole 783H of the second member 78J may be disposed at a −Z side of the plate-shaped portion 787J so that a space at the side facing in the −Z direction serves as the second space 784J.

3.11 Tenth Exemplary Embodiment 3.11.1 Overview

In a target supply device according to a tenth exemplary of the present disclosure, a first member may be disposed downstream of a second member in an output direction of a target material, a first passable portion may be provided by a first through-hole penetrating through the first member, and an opening of the first through-hole facing in the output direction may be defined as a nozzle hole.

3.11.2 Configuration

Figure 16:
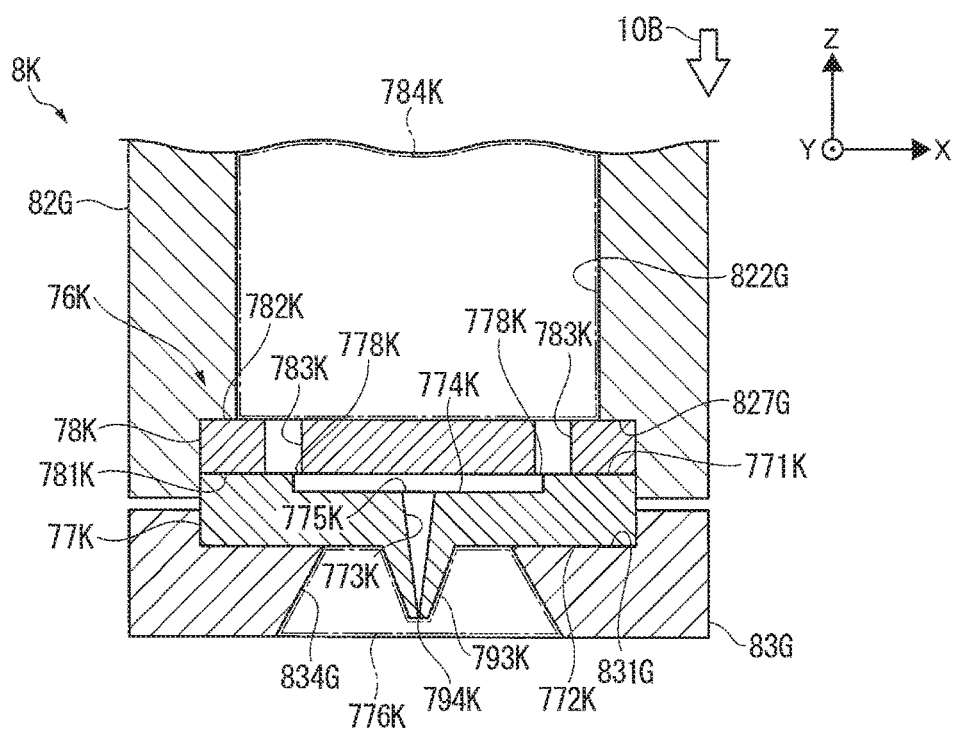
FIG. 16 schematically illustrates a relevant part of a target supply device according to a tenth exemplary embodiment.

FIG. 16 schematically illustrates a relevant part of a target supply device according to the tenth exemplary embodiment.

The target supply device of the tenth exemplary embodiment may be the same as the target supply device of the seventh exemplary embodiment except a configuration of a filter 76K of a target generator 8K.

As shown in FIG. 16, the filter 76K may include a first member 77K and a second member 78K. The first member 77K and the second member 78K may be substantially in the shape of a circular plate.

A projection 793K in the shape of a truncated cone may be provided at the center of a third surface 772K of the first member 77K facing in the −Z direction. A first through-hole 773K may be provided at the center of the first member 77K. An opening of the first through-hole 773K facing in the −Z direction, i.e., an opening at the center of an end of the projection 793K, may be defined as a nozzle hole 794K. For instance, the diameter of the nozzle hole 794K may be in a range from 1 μm to 3 μm.

A first surface 771K of the first member 77K facing in the +Z direction may be provided with, for instance, eight channels 774K. The channels 774K may be grooves provided to the first surface 771K. Similarly to the channels 774F shown in FIG. 11A, the channels 774K may radially extend from the center of the first surface 771K. The channels 774K may be arranged substantially at regular intervals along an outer circumferential direction of the first member 77K. For instance, the depth of the channels 774K may be 3 μm or less.

A portion of the channels 774K that is in communication with the first through-hole 773K may be defined as a first area 775K. Consequently, the first through-hole 773K may serve as a first passable portion, allowing the target material to flow between the first surface 771K of the first member 77K and a first space 776K, which is beside the third surface 772K opposite to the first surface 771K, through the first area 775K of the channels 774K. In the tenth exemplary embodiment, the first through-hole 773K may serve as the first passable portion, allowing the target material flowing into the first area 775K of the channels 774K to be discharged into the first space 776K.

The second member 78K may be stacked on an upper side of the first member 77K. The second member 78K may be set with a second surface 781K thereof covering the channels 774K.

The second member 78K may be provided with eight substantially circular second through-holes 783K. The second through-holes 783K may be arranged substantially at regular intervals along an outer circumferential direction of the second member 78K. The second through-holes 783K may be disposed not to be inside an opening of the first through-hole 773K. At this time, a second area 778K defined by ends of the channels 774K may be inside openings of the second through-holes 783K. Consequently, the second through-holes 783K may serve as a second passable portion, allowing the target material to flow between the second surface 781K and a second space 784K, which is beside a fourth surface 782K opposite to the second surface 781K, through the second area 778K of the channels 774K. In the tenth exemplary embodiment, the second through-holes 783K may serve as the second passable portion, allowing the target material in the second space 784K to enter the second area 778K of the channels 774K.

3.11.3 Operation

Next, description will be made on installation of the filter.

The same operation as that of the first exemplary embodiment will not be explained below.

First, the first member 77K may be diffusion-bonded to the second member 78K with the channels 774K of the first member 77K being covered by the second surface 781K of the second member 78K. The filter 76K having the channels 774K with a depth of 3 m or less may thus be provided.

Next, the filter 76K may be attached between the nozzle distal portion 83G and the nozzle base portion 82G. The first member 77K may be disposed at a −Z side of the second member 78K.

Consequently, the second through-holes 783K of the second member 78K may be inside the openings of the second through-hole 822G so that the inside of the second through-hole 822G serves as the second space 784K. The first through-hole 773K of the first member 77K may be inside an opening of the conical hole 834G facing in the +Z direction so that the inside of the conical hole 834G serves as the first space 776K.

In the tenth exemplary embodiment, the opening of the first through-hole 773K facing in the output direction of the target material defines the nozzle hole 794K, so that the filter 76K may have a particle-capturing function and a nozzle function.

3.12 Modification(s)

It should be noted that the filter may have the following features. In the following modification, the first and second members may be made of a material unlikely to react with a target material. For instance, the depth of the channels may be 3 μm or less. The −Z direction may coincide with the gravity direction 10B.

3.12.1 First Modification

Figure 17A:
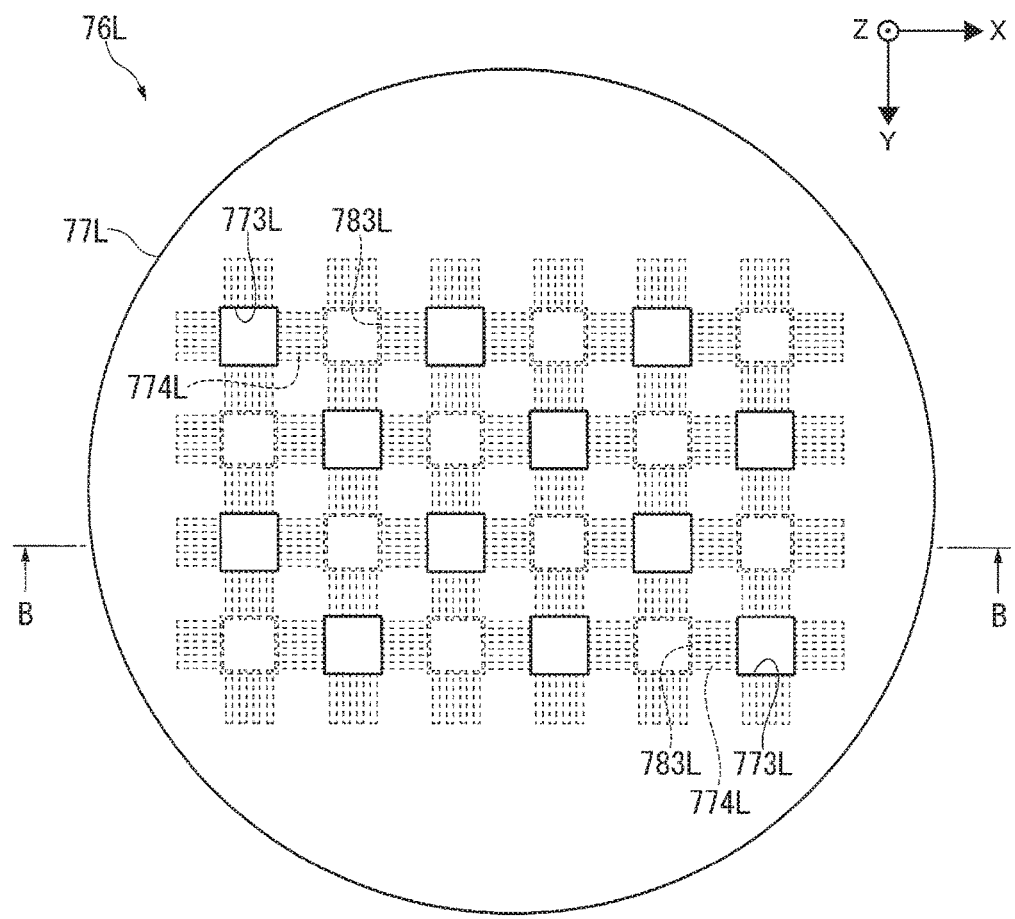
FIG. 17A schematically illustrates a filter according to a first modification in the +Z direction.
Figure 17B:
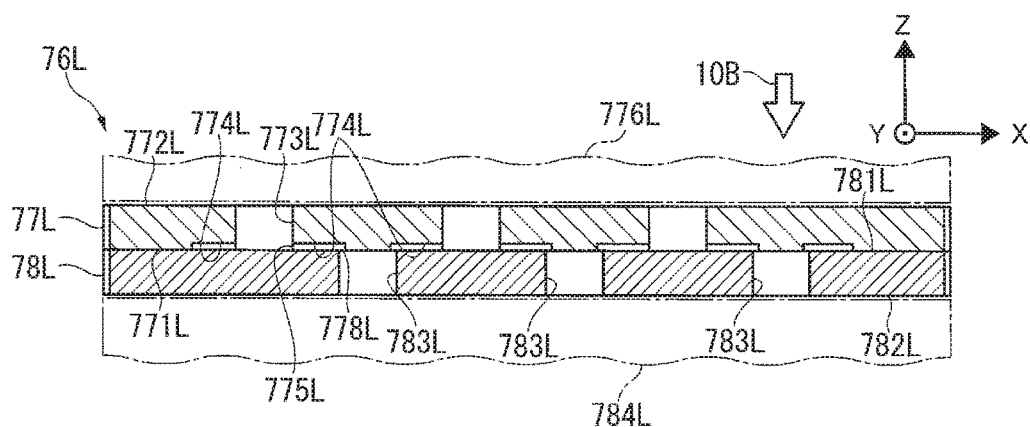
FIG. 17B is a sectional view taken along the line B-B in FIG. 17A.

FIG. 17A schematically illustrates a filter according to a first modification in the +Z direction. FIG. 17B is a sectional view taken along the line B-B in FIG. 17A.

As shown in FIGS. 17A, 17B, a filter 76L may include a first member 77L and a second member 78L. The first member 77L and the second member 77L may be substantially in the shape of a circular plate.

The first member 77L may be provided with a plurality of first through-holes 773L. The first through-holes 773L may be staggered. A channel 774L may be provided to a first surface 771L of the first member 77L facing in the −Z direction. The channel 774L may bring each of the first through-holes 773L in communication with adjacent one of second through-holes 783L (described later). An end of the channel 774L facing the first through-holes 773L may be defined as a first area 775L. Consequently, the first through-holes 773L may serve as a first passable portion, allowing the target material to flow between the first surface 771L and a first space 776L, which is beside a third surface 772L opposite to the first surface 771L, through the first area 775L of the channel 774L.

The second member 78L may be stacked on the first member 77L in the −Z direction. The second member 78L may be set with a second surface 781L thereof covering the channel 774L.

The second member 78L may be provided with a plurality of second through-holes 783L. The second through-holes 783L may be arranged at positions corresponding to spaces between adjacent ones of the first through-holes 773L. The second through-holes 783L may be arranged not to be inside openings of the first through-holes 773L when the first member 77L is stacked on the second member 78L. At this time, a second area 778L of the channel 774L may be inside openings of the second through-holes 783L. Consequently, the second through-holes 783L may serve as a second passable portion, allowing the target material to flow between the second surface 781L and a second space 784L, which is beside a fourth surface 782L opposite to the second surface 781L, through the second area 778L of the channel 774L.

3.12.2 Second Modification

Figure 18A:
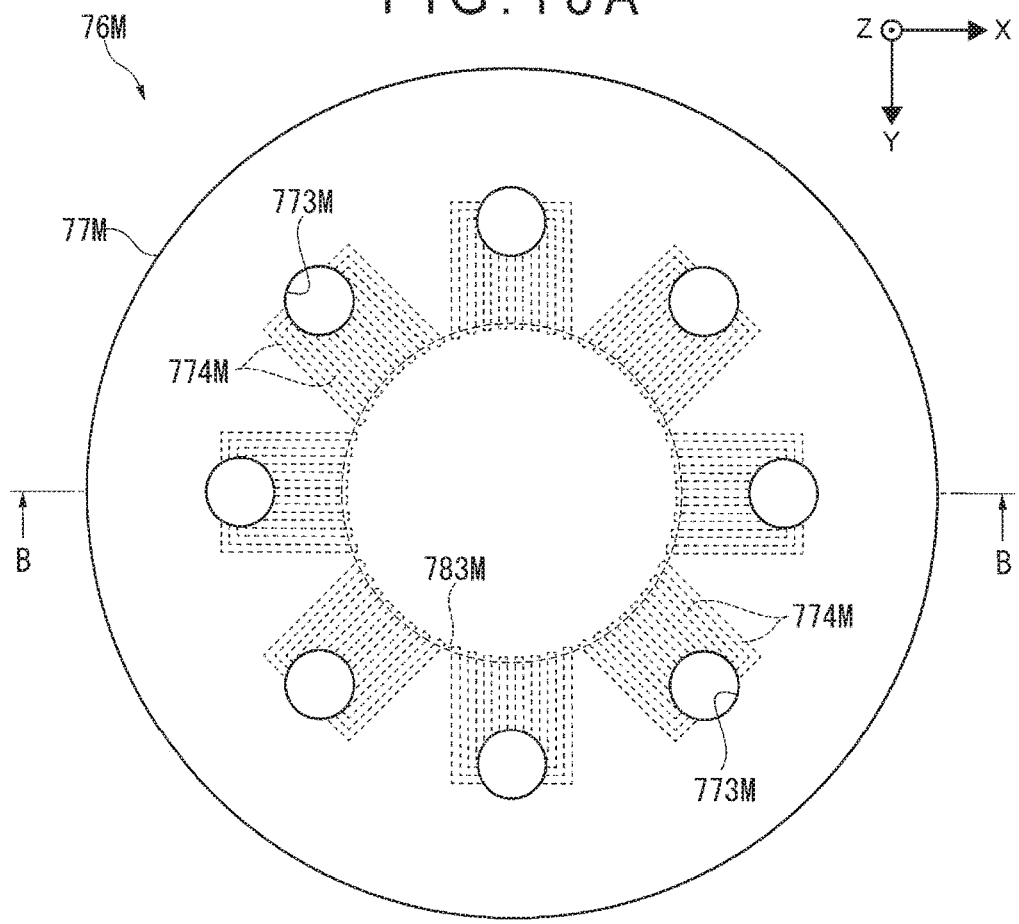
FIG. 18A schematically illustrates a filter according to a second modification in the +Z direction.
Figure 18B:
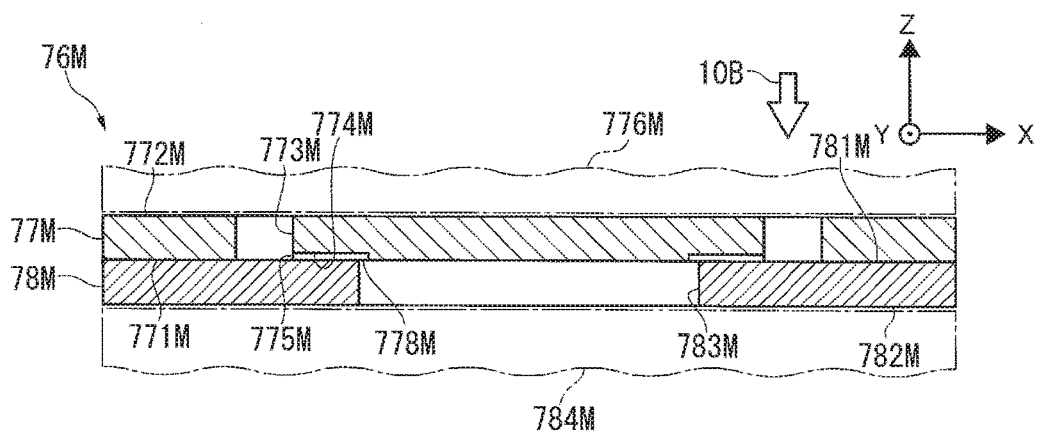
FIG. 18B is a sectional view taken along the line B-B in FIG. 18A.

FIG. 18A schematically illustrates a filter according to a second modification in the +Z direction. FIG. 18B is a sectional view taken along the line B-B in FIG. 18A.

As shown in FIGS. 18A, 18B, the filter 76M may include a first member 77M and a second member 78M. The first member 77M and the second member 77M may be substantially in the shape of a circular plate.

The first member 77M may be provided with, for instance, eight first through-holes 773M. The first through-holes 773M may be arranged substantially at regular intervals along an outer circumferential direction of the first member 77M. Channels 774M may be provided to a first surface 771M of the first member 77M facing in the −Z direction. The channels 774M may be arranged to bring the first through-holes 773M in communication with a second through-hole 783M (described later). Ends of the channels 774M facing the first through-holes 773M may be defined as a first area 775M. Consequently, the first through-holes 773M may serve as a first passable portion, allowing the target material to flow between the first surface 771M and a first space 776M, which is beside a third surface 772M opposite to the first surface 771M, through the first area 775M of the channels 774M.

The second member 78M may be stacked on the first member 77M in the −Z direction. The second member 78M may be set with a second surface 781M thereof covering the channels 774M.

The second through-hole 783M may be provided at the center of the second member 78M. The second through-hole 783L may be disposed not to be inside openings of the first through-holes 773M when the first member 77M is stacked on the second member 78M. At this time, a second area 778M of the channels 774M may be inside an opening of the second through-hole 783M. Consequently, the second through-hole 783M may serve as a second passable portion, allowing the target material to flow between the second surface 781M and a second space 784M, which is beside a fourth surface 782M opposite to the second surface 781M, through the second area 778M of the channels 774M.

3.12.3 Third Modification

Figure 19A:
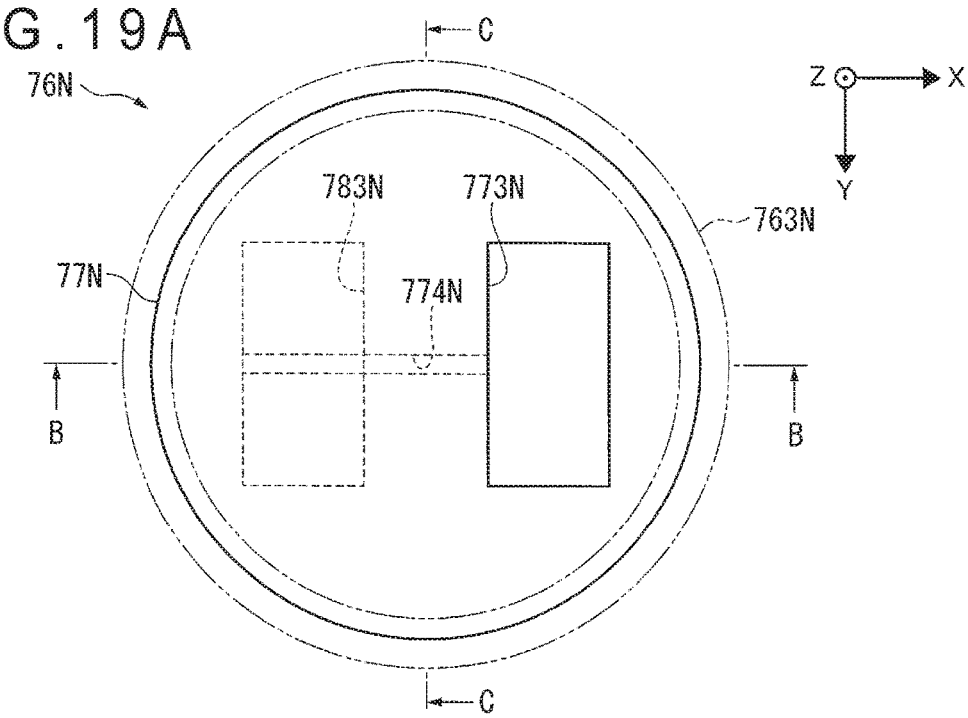
FIG. 19A schematically illustrates a filter according to a third modification in the +Z direction.
Figure 19B:
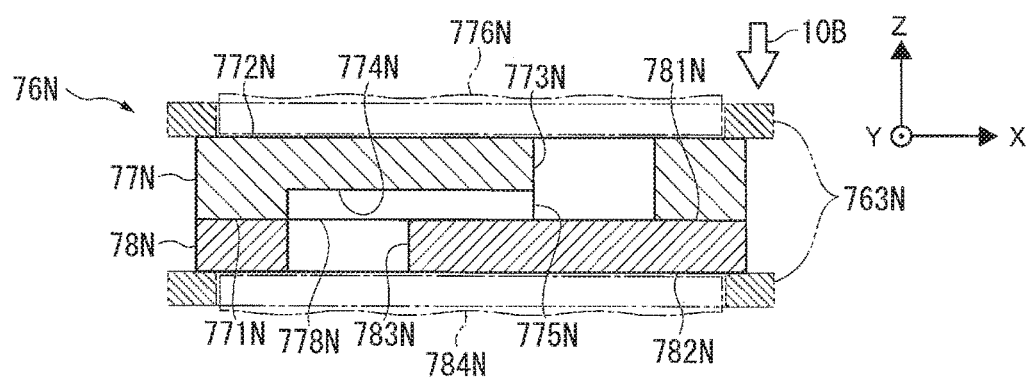
FIG. 19B is a sectional view taken along the line B-B in FIG. 19A.
Figure 19C:
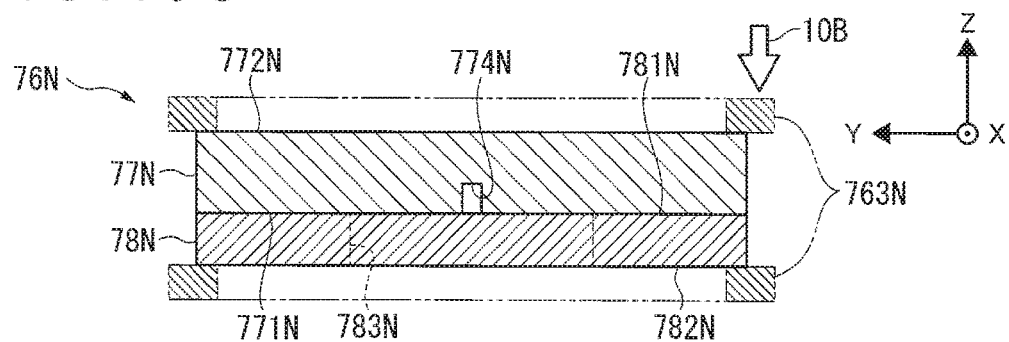
FIG. 19C is a sectional view taken along the line C-C in FIG. 19A.
Figure 20A:
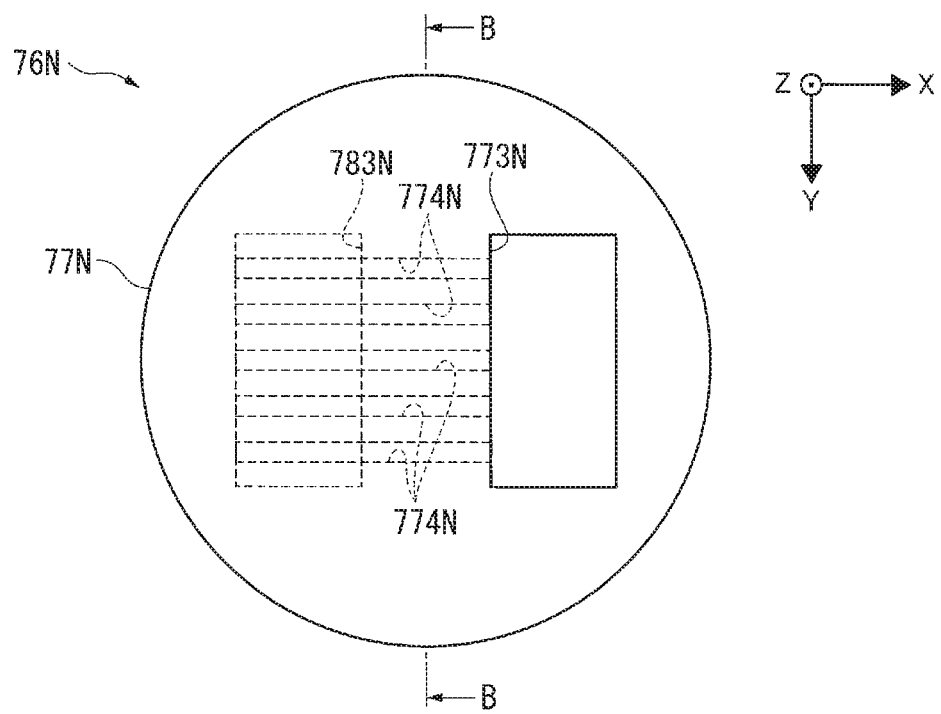
FIG. 20A schematically illustrates another filter according to the third modification in the +Z direction.
Figure 20B:
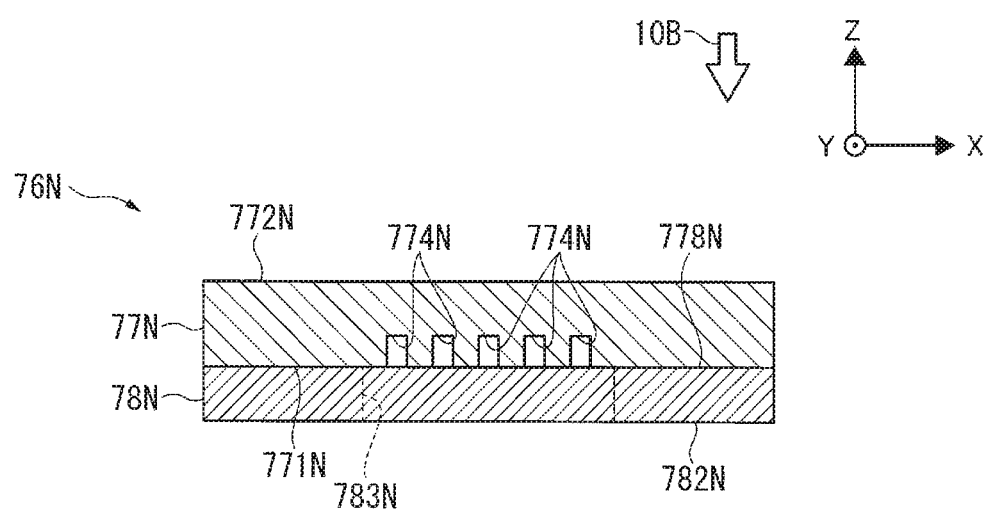
FIG. 20B is a sectional view taken along the line B-B in FIG. 20A.
Figure 21A:
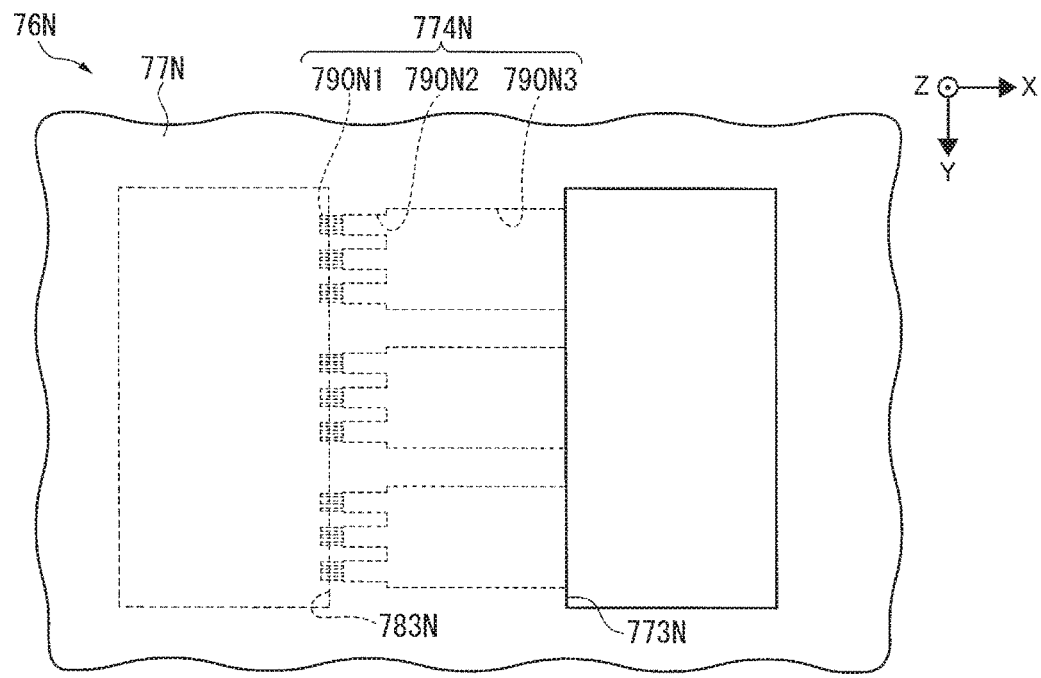
FIG. 21A schematically illustrates still another filter according to the third modification in the +Z direction.
Figure 21B:
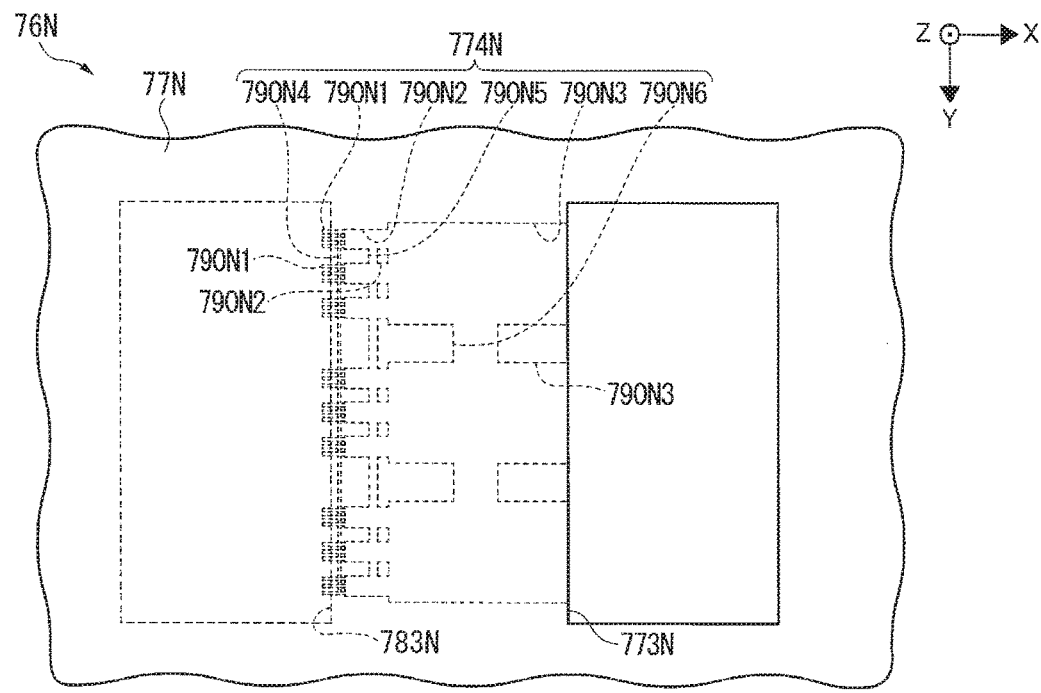
FIG. 21B schematically illustrates yet another filter according to the third modification in the +Z direction.
Figure 21C:
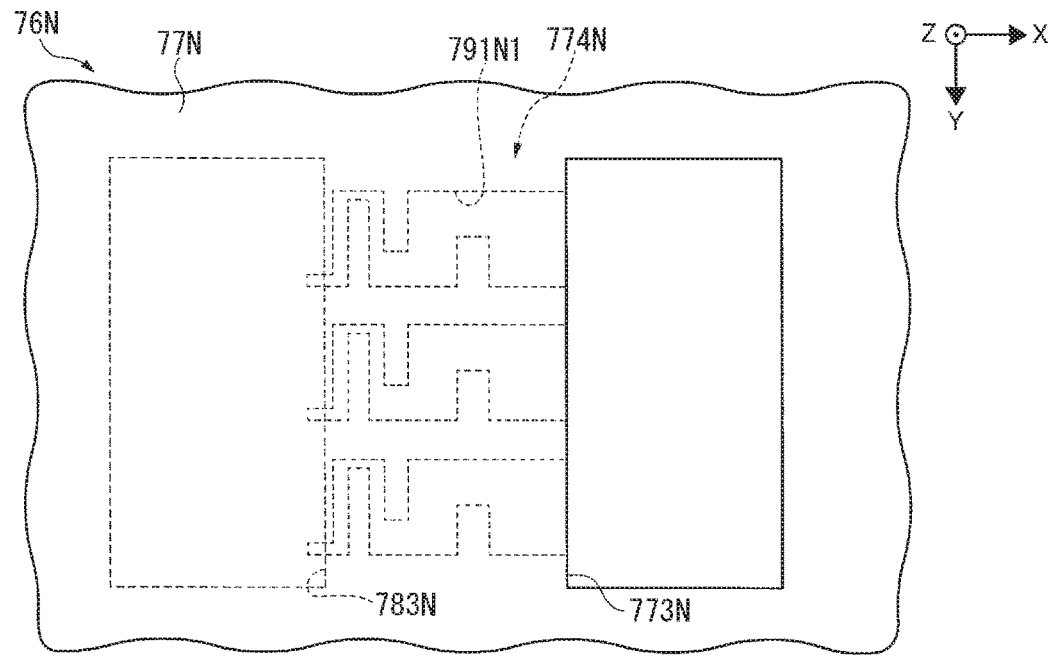
FIG. 21C schematically illustrates further another filter according to the third modification in the +Z direction.
Figure 21D:
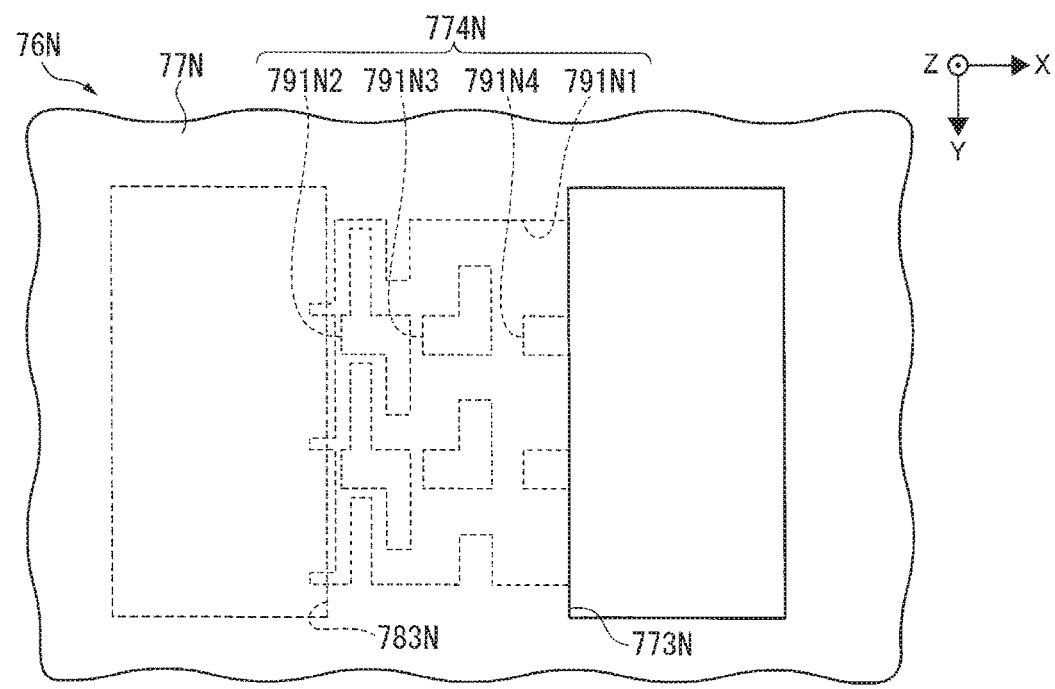
FIG. 21D schematically illustrates still further another filter according to the third modification in the +Z direction.
Figure 21E:
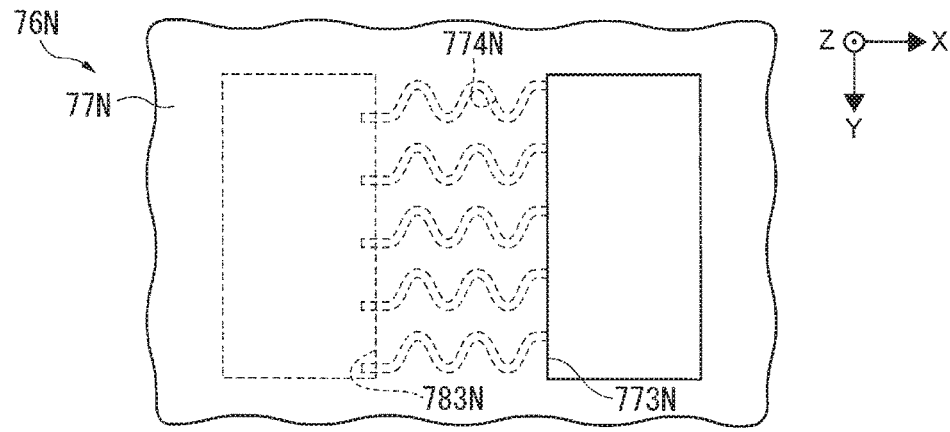
FIG. 21E schematically illustrates yet further another filter according to the third modification in the +Z direction.
Figure 21F:
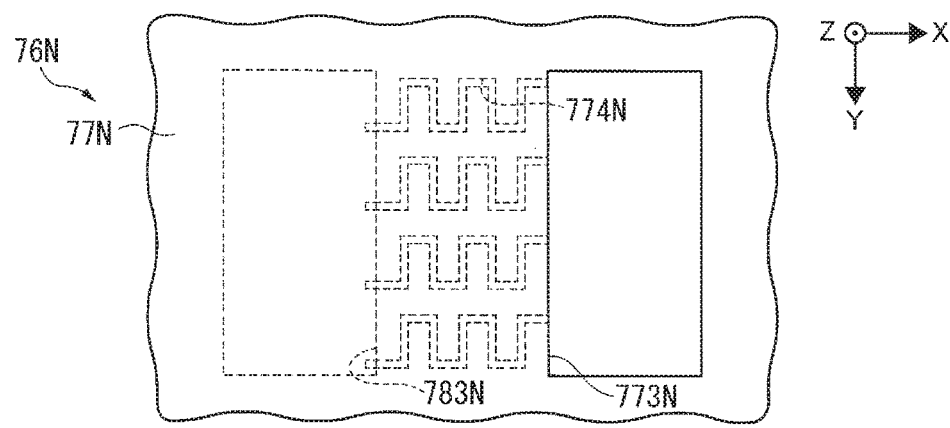
FIG. 21F schematically illustrates yet further another filter according to the third modification in the +Z direction.
Figure 21G:
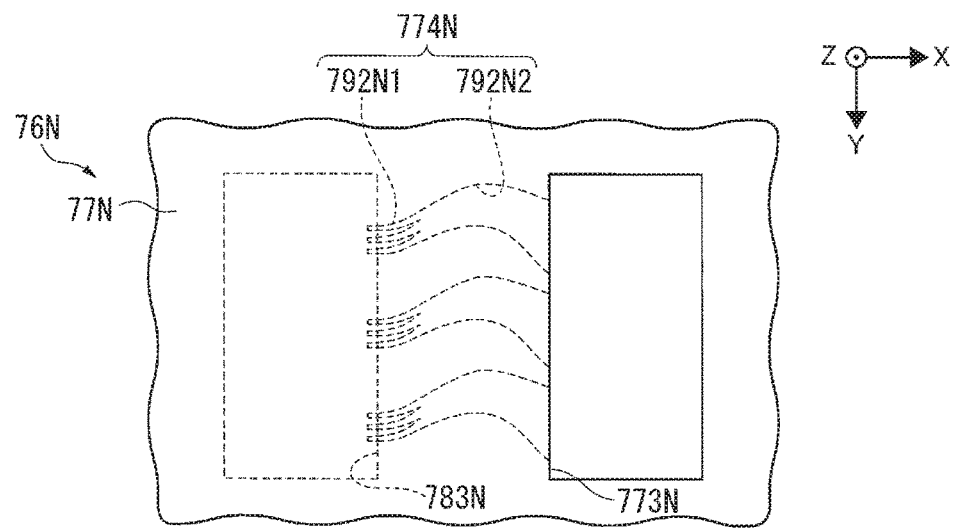
FIG. 21G schematically illustrates yet further another filter according to the third modification in the +Z direction.

FIG. 19A schematically illustrates a filter according to a third modification in the +Z direction. FIG. 19B is a sectional view taken along the line B-B in FIG. 19A. FIG. 19C is a sectional view taken along the line C-C in FIG. 19A. FIG. 20A schematically illustrates another filter according to the third modification in the +Z direction. FIG. 20B is a sectional view taken along the line B-B in FIG. 20A. FIG. 21A schematically illustrates another filter according to the third modification in the +Z direction. FIG. 21B schematically illustrates another filter according to the third modification in the +Z direction. FIG. 21C schematically illustrates another filter according to the third modification in the +Z direction. FIG. 21D schematically illustrates another filter according to the third modification in the +Z direction. FIG. 21E schematically illustrates another filter according to the third modification in the +Z direction. FIG. 21F schematically illustrates another filter according to the third modification in the +Z direction. FIG. 21G schematically illustrates another filter according to the third modification in the +Z direction.

As shown in FIGS. 19A, 19B and 19C, a filter 76N may include a first member 77N and a second member 78N. The first member 77N and the second member 78N may be substantially in the shape of a circular plate.

A first through-hole 773N may be provided to the first member 77N at a position shifted from the center thereof in the +X direction. A first surface 771N of the first member 77N facing in the −Z direction may be provided with a single channel 774N. The channel 774N may linearly extend from the first through-hole 773N in the −X direction. An end of the channel 774N facing the first through-hole 773N may be defined as a first area 775N. Consequently, the first through-hole 773N may serve as a first passable portion, allowing the target material to flow between the first surface 771N and a first space 776N, which is beside a third surface 772N opposite to the first surface 771N, through the second area 775N of the channel 774N.

The second member 78N may be stacked on the first member 77N in the −Z direction. The second member 78N may be set with a second surface 781N thereof covering the channel 774N. At this time, the first member 77N and the second member 78N may be interposed between seal members 763N.

A second through-hole 783N may be provided to the second member 78N at a position shifted from the center thereof in the −X direction. The second through-hole 783N may be disposed not to be inside an opening of the first through-hole 773N when the first member 77N is stacked on the second member 78N. At this time, a second area 778N of the channel 774N may be inside an opening of the second through-hole 783N. Consequently, the second through-hole 783N may serve as a second passable portion, allowing the target material to flow between the second surface 781N and a second space 784N, which is beside a fourth surface 782N opposite to the second surface 781N, through the second area 778N of the channel 774N.

As shown in FIGS. 20A, 20B, the first member 77N of the filter 76N may be provided with a plurality of channels 774N. The number of the channels 774N may be, for instance, five. The five channels 774N may be arranged side by side in the Y-axis direction.

As shown in FIG. 21A, the channels 774N of the filter 76N may each include a first channel 790N1, a second channel 790N2 and a third channel 790N3. The first channel 790N1 may be in communication with the second through-hole 783N. A dimension of the first channel 790N1 in the Y-axis direction (i.e., width) may be smaller than the width of the second channel 790N2. A dimension of the first channel 790N1 in the X-axis direction (i.e., length) may be smaller than the length of the second channel 790N2. The second channel 790N2 may be connected to a +X side of the first channel 790N1. The width of the second channel 790N2 may be smaller than the width of the third channel 790N3. The length of the second channel 790N2 may be smaller than the length of the third channel 790N3. The third channel 790N3 may be connected to a +X side of the second channel 790N2, while being in communication with the first through-hole 773N. When the first to third channels 790N1, 790N2, 790N3 have the above widths, large particles can be captured in the third channel 790N3 to restrain clogging of the first channel 790N1. When the first to third channels 790N1, 790N2, 790N3 have the above lengths, pressure loss may be reduced.

As shown in FIG. 21B, the channels 774N of the filter 76N may each include a fourth channel 790N4, a fifth channel 790N5 and a sixth channel 790N6 in addition to the first to third channels 790N1 to N3 shown in FIG. 21A. The first channel 790N1 may include channels, adjacent ones of which are connected together by the fourth channel 790N4. The second channel 790N2 may include channels, adjacent ones of which are connected together by the fifth channel 790N5. The third channel 790N3 may include channels, adjacent ones of which are connected together by the sixth channel 790N6.

As shown in FIG. 21C, the channels 774N of the filter 76N may each include a first channel 791N1 bent in the shape of a crank. A portion of the first channel 791N1 facing the second through-hole 783N may have a width smaller than the width of a portion facing the first through-hole 773N. When the first channel 791N1 have the above widths, large particles may be captured at the portion of the first channel 791N1 facing the first through-hole 773N to restrain clogging at the portion facing the second through-hole 783N. At this time, the channel 791N, which is bent in the shape of a crank, may capture particles at bent portions.

As shown in FIG. 21D, the channels 774N of the filter 76N may include a second channel 791N2, a third channel 791N3 and a fourth channel 791N4 in addition to the first channel 791N1 shown in FIG. 21C. The second channel 791N2 may be disposed beside the channels 774N to connect the first channels 791N1 of adjacent ones of the channels 774N. The third channel 791N3 may be disposed at a position close to the first through-hole 773N relative to the second channel 791N2 to connect the first channels 791N1 of adjacent ones of the channels 774N. The fourth channel 791N4 may be disposed at a position close to the first through-hole 773N relative to the third channel 791N3 to connect the first channels 791N1 of adjacent ones of the channels 774N.

As shown in FIG. 21E, the channels 774N of the filter 76N may each be bent to meander in the Y-axis direction. Bent portions of the channels 774N may be in an arc shape.

As shown in FIG. 21F, the channels 774N of the filter 76N may be bent in the shape of a crank. Bent portions of the channels 774N may be bent at a right angle.

As shown in FIG. 21G, the channels 774N of the filter 76N may include a first channel 792N1 and a second channel 792N2. The first channel 792N1 may be bent. The first channel 792N1 may be in communication with the second through-hole 783N. The width of the first channel 792N1 may be smaller than the width of the second channel 792N2. The length of the first channel 792N1 may be smaller than the length of the second channel 792N2. The second channel 792N2 may be bent. The first channel 791N1 may include three channels, and the second channel 792N2 may be connected to portions of these three channels facing in the +X direction.

3.12.4 Fourth Modification

Figure 22A:
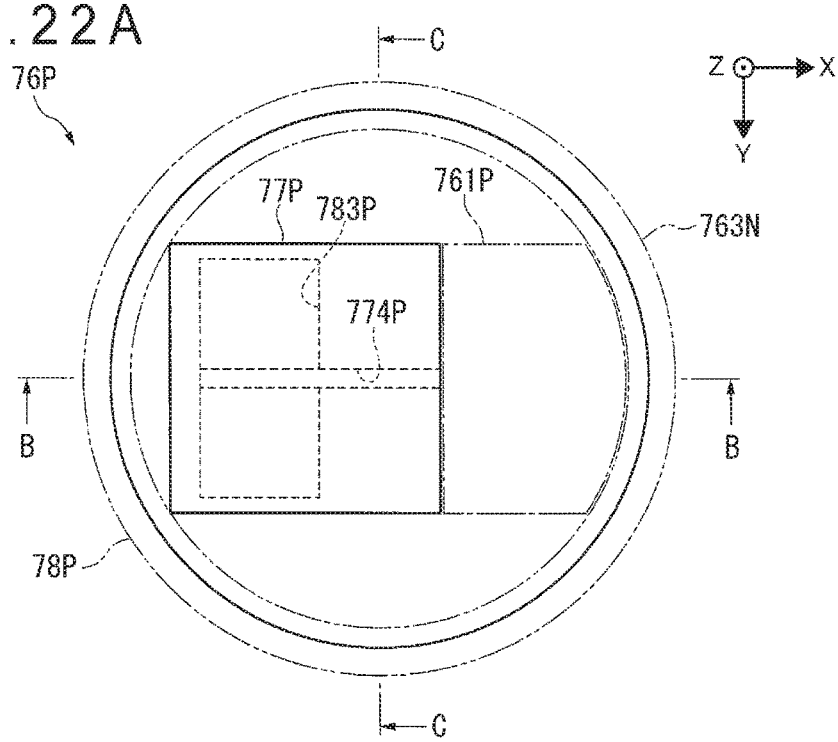
FIG. 22A schematically illustrates a filter according to a fourth modification in the +Z direction.
Figure 22B:
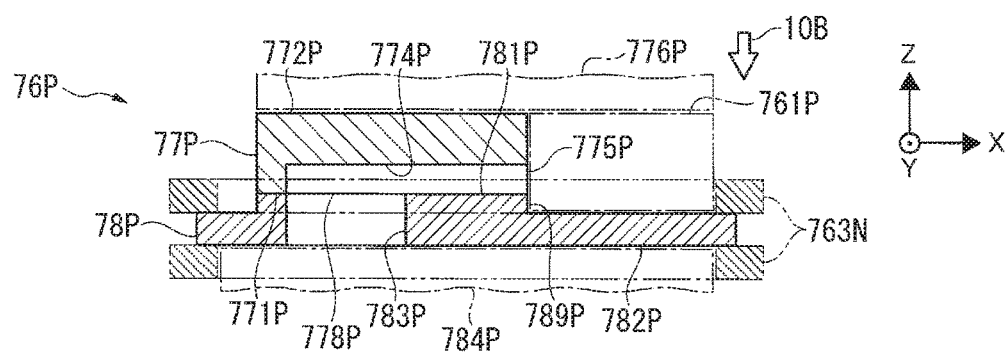
FIG. 22B is a sectional view taken along the line B-B in FIG. 22A.
Figure 22C:
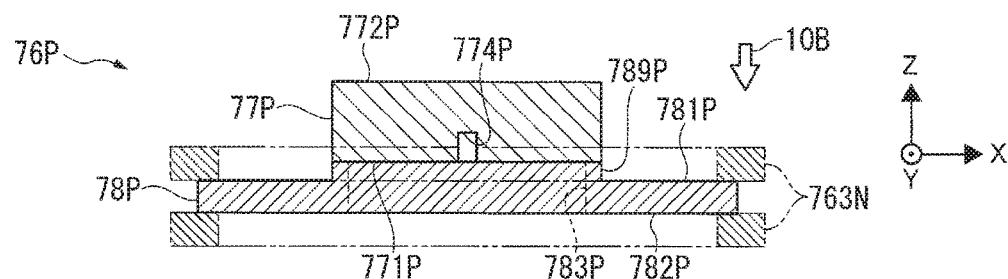
FIG. 22C is a sectional view taken along the line C-C in FIG. 22A.

FIG. 22A schematically illustrates a filter according to a fourth modification in the +Z direction. FIG. 22B is a sectional view taken along the line B-B in FIG. 22A. FIG. 22C is a sectional view taken along the line C-C in FIG. 22A.

As shown in FIGS. 22A, 22B and 22C, a filter 76P may include a first member 77P and a second member 78P.

The first member 77P may be substantially in the shape of a square plate. A linear channel 774P may be provided to a first surface 771P of the first member 77P facing in the −Z direction. The channel 774P may be provided to bring an outer periphery of the first member 77P in communication with a through-hole 783P (described later).

The second member 78P may be substantially in the shape of a circular plate. The outline of the second member 78P may be larger than the outline of the first member 77P. The second member 78P may thus be set with a second surface 781P thereof partly projecting from the first surface 771P. A part of the second surface 781P of the second member 78P, which faces in the +Z direction, may be provided with a projection 789P projecting in the +Z direction. The second member 78P may be stacked on the first member 77P in the −Z direction. The second member 78P may be set with an upper surface of the projection 789P (i.e., the second surface 781P) covering the channel 774P. A portion of the second member 78P provided with the projection 789P may be provided with a through-hole 783P. The through-hole 783P may be a second through-hole of the present disclosure.

An end of the channel 774P facing in the +X direction may be defined as a first area 775P. Consequently, the part of the second surface 781P projecting outward from the first surface 771P and a side space 761P facing an outer periphery of the first member 77P in the +X direction may serve as a first passable portion, allowing the target material to pass between the first surface 771P and a first space 776P, which is beside a third surface 772P opposite to the first surface 771P, through the first area 775P of the channel 774P.

An end of the channel 774P facing the through-hole 783P may serve as a second area 778P. Consequently, the through-hole 783P may serve as a second passable portion, allowing the target material to pass between the second surface 781P and a second space 784P, which is beside a fourth surface 782P opposite to the second surface 781P, through the second area 778P of the channel 774P.

3.12.6 Fifth Modification

Figure 23A:
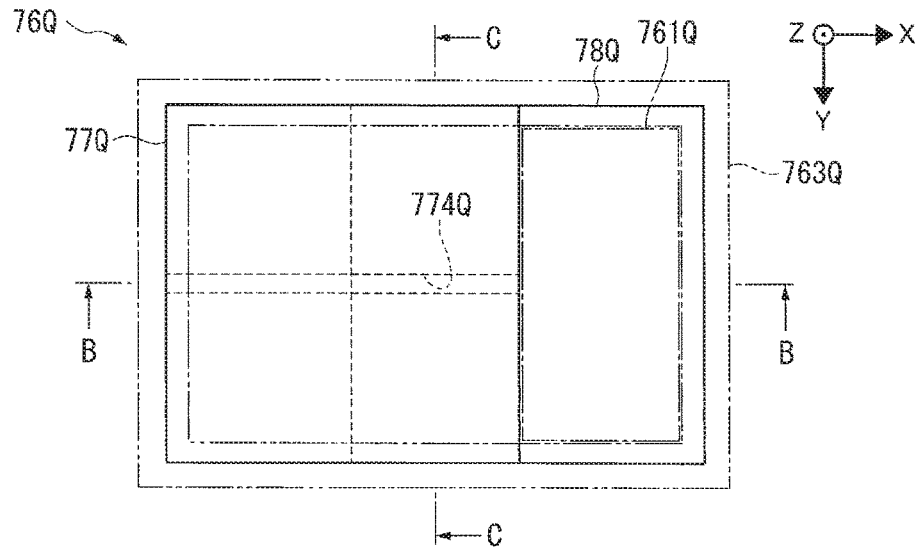
FIG. 23A schematically illustrates a filter according to a fifth modification in the +Z direction.
Figure 23B:
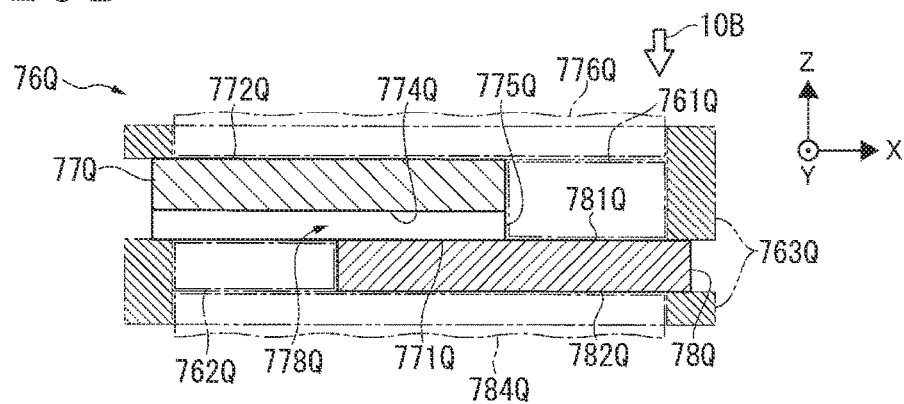
FIG. 23B is a sectional view taken along the line B-B in FIG. 23A.
Figure 23C:
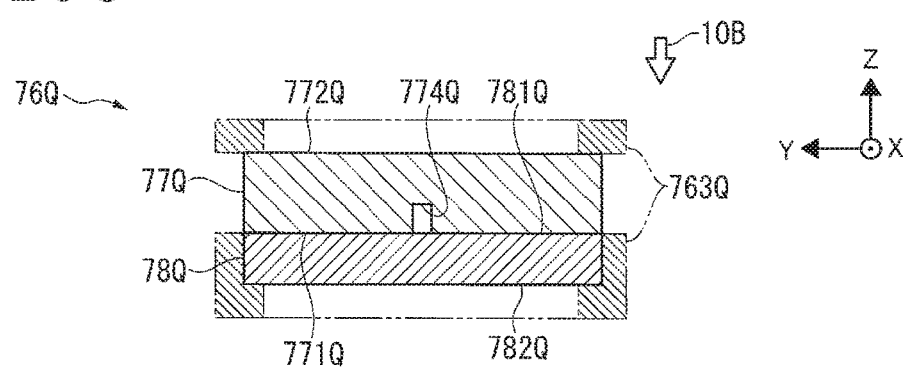
FIG. 23C is a sectional view taken along the line C-C in FIG. 23A.

FIG. 23A schematically illustrates a filter according to a fifth modification in the +Z direction. FIG. 23B is a sectional view taken along the line B-B in FIG. 23A. FIG. 23C is a sectional view taken along the line C-C in FIG. 23A.

As shown in FIGS. 23A, 23B and 23C, a filter 76Q may include a first member 77Q and a second member 78Q.

The first member 77Q may be substantially in the shape of a square plate. A linear channel 774Q may be provided to a first surface 771Q of the first member 77Q facing in the −Z direction. The channel 774Q may extend from an outer periphery of the first member 77Q facing in the +X direction to an outer periphery thereof facing in the −X direction.

The second member 78Q may be substantially in the same shape as that of the first member 77Q. The second member 78Q may be stacked on the first member 77Q in the −Z direction. The second member 78Q may be disposed at a position shifted relative to the first member 77Q in the +X direction. The second member 78Q may thus be set with a second surface 781Q thereof partly projecting from the first surface 771Q. The first member 77Q may be disposed with the first surface 771Q thereof partly projecting from the second surface 781Q. The second member 78Q may be set with the second surface 781Q thereof covering the channel 774Q. At this time, the first member 77Q and the second member 78Q may be interposed between seal members 763Q.

An end of the channel 774Q facing in the +X direction may be defined as a first area 775Q. Consequently, the part of the second surface 781Q projecting outward from the first surface 771Q and a first side space 761Q facing the outer periphery of the first member 77Q facing in the +X direction may serve as a first passable portion, allowing the target material to pass between the first surface 771Q and a first space 776Q, which is beside a third surface 772Q opposite to the first surface 771Q, through the first area 775Q of the channel 774Q.

A portion of the channel 774Q corresponding to an outer periphery of the second member 78Q facing in the −X direction may be defined as a second area 778Q. Consequently, the part of the first surface 771Q projecting outward from the second surface 781Q and a second side space 762Q facing the outer periphery of the second member 78Q facing in the −X direction may serve as a second passable portion, allowing the target material to pass between the second surface 781Q and a second space 784Q, which is beside a fourth surface 782Q opposite to the second surface 781Q, through the second area 778Q of the channel 774Q.

3.12.6 Sixth Modification

Figure 24A:
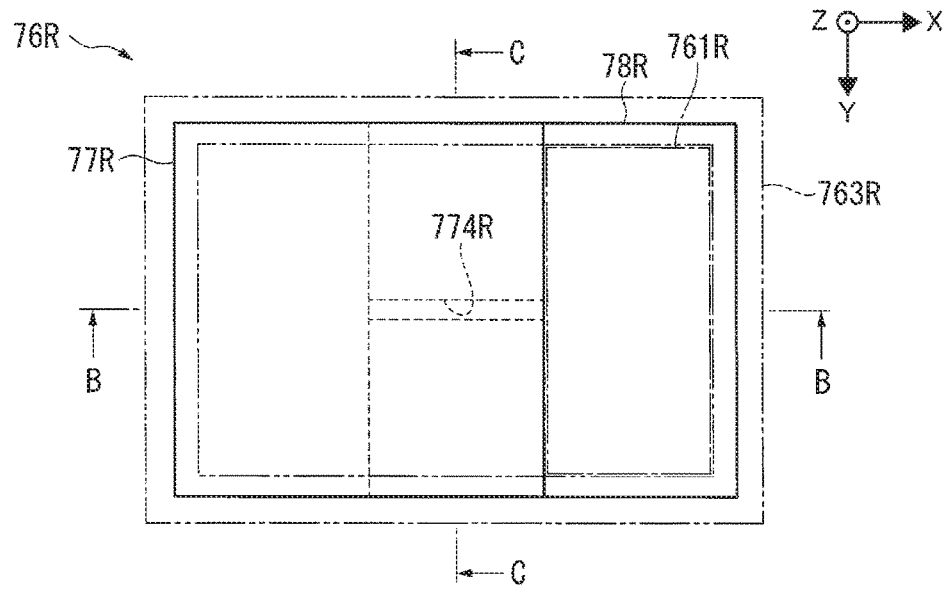
FIG. 24A schematically illustrates a filter according to a sixth modification in the +Z direction.
Figure 24B:
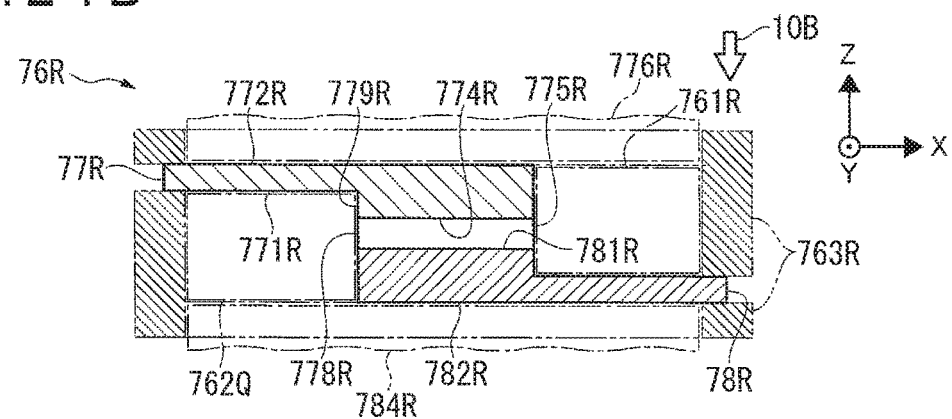
FIG. 24B is a sectional view taken along the line B-B in FIG. 24A.
Figure 24C:
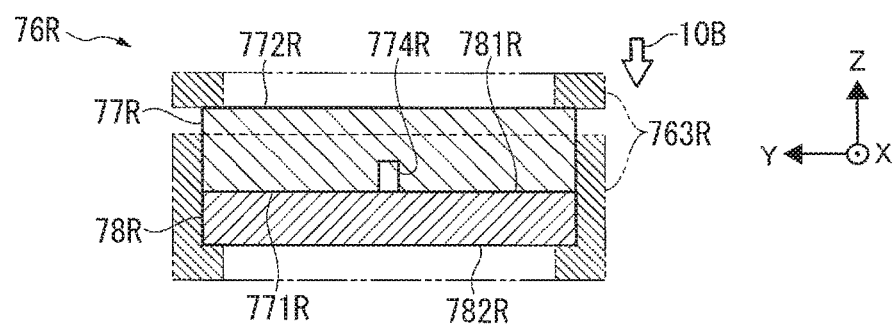
FIG. 24C is a sectional view taken along the line C-C in FIG. 24A.

FIG. 24A schematically illustrates a filter according to a sixth modification in the +Z-direction. FIG. 24B is a sectional view taken along the line B-B in FIG. 24A. FIG. 24C is a sectional view taken along the line C-C in FIG. 24A.

As shown in FIGS. 24A, 24B and 24C, a filter 76R may include a first member 77R and a second member 78R.

The first member 77R may be substantially in the shape of a square plate. A projection 779R projecting in the −Z direction may be provided to a part of a first surface 771R of the first member 77R facing in the +X direction. A linear channel 774R may be provided to a surface of the projection 779R facing in the −Z direction (i.e., the first surface 771R). The channel 774R may extend from an outer periphery of the first member 77R facing in the +X direction to an outer periphery thereof facing in the −X direction.

The second member 78R may be substantially in the same shape as that of the first member 77R. A projection 789R projecting in the +Z direction may be provided to a part of a second surface 781R of the second member 78R facing in the +Z direction. The second member 78R may be stacked on the first member 77R in the −Z direction. The second member 78R may be disposed at a position shifted relative to the first member 77R in the +X direction. The second member 78R may be set such that a surface of the projection 789R facing in the +Z direction (i.e., the second surface 781R) covers the channel 774R. At this time, the first member 77R and the second member 78R may be interposed between seal members 763R.

An end of the channel 774R facing in the +X direction may be defined as a first area 775R. Consequently, the part of the second surface 781R projecting outward from the first surface 771R and a first side space 761R facing the outer periphery of the first member 77R facing in the +X direction may serve as a first passable portion, allowing the target material to pass between the first surface 771R and a first space 776R, which is beside a third surface 772R opposite to the first surface 771R, through the first area 775R of the channel 774R.

An end of the channel 774R facing in the +X direction may be defined as a second area 778R. Consequently, the part of the first surface 771R projecting outward from the second surface 781R and a second side space 762R facing the outer periphery of the second member 78R facing in the −X direction may serve as a second passable portion, allowing the target material to pass between the second surface 781R and a second space 784R, which is beside a fourth surface 782R opposite to the second surface 781R, through the second area 778R of the channel 774R.

3.12.8 Seventh Modification

Figure 25:
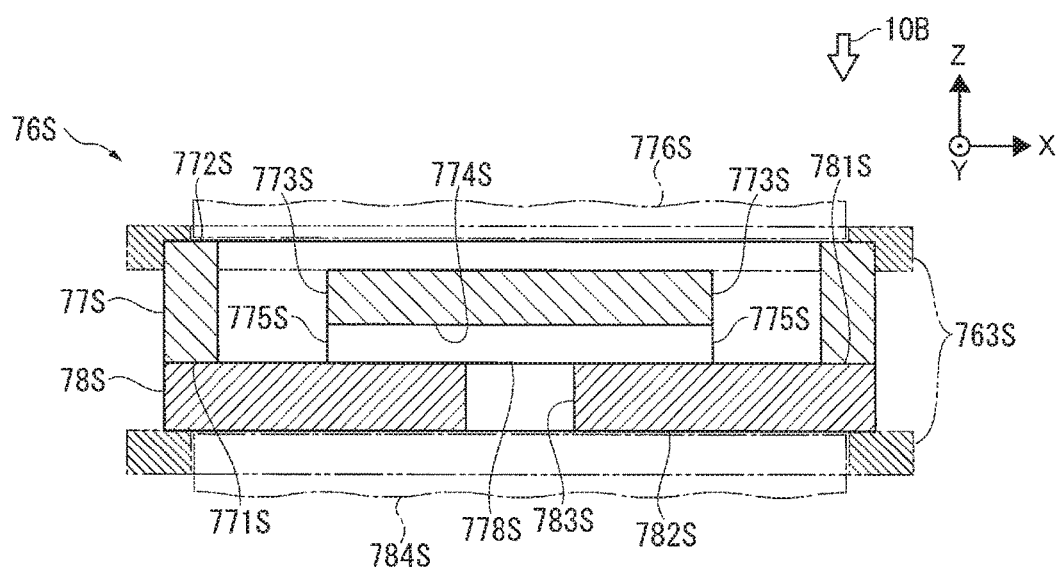
FIG. 25 is a sectional view of a filter according to a seventh modification.

FIG. 25 is a perspective view illustrating a filter according to a seventh modification.

As shown in FIG. 25, a filter 76S may include a first member 77S and a second member 78S.

The first member 77A may be substantially in the shape of a circular plate.

A first through-hole 773S may be provided to the first member 77S at each of positions shifted from the center thereof in the +X direction and the −X direction. The first through-hole 773S may be substantially rectangular. A single channel 774S may be provided to a first surface 771S of the first member 77S facing in the −Z direction. The channel 774S may connect the first through-holes 773S to each other. An end of the channel 774S facing each of the first through-holes 773S may be defined as a first area 775S. Consequently, the first through-holes 773S may serve as a first passable portion, allowing the target material to flow between the first surface 771S and a first space 776S, which is beside a third surface 772S opposite to the first surface 771S, through the second area 775S of the channel 774S.

The second member 78S may be substantially in the same shape as that of the first member 77S. The second member 78S may be stacked on the first member 77S in the −Z direction. The second member 78S may be set with the second surface 781S thereof covering the channel 774S. At this time, the first member 77S and the second member 78S may be interposed between seal members 763S.

A substantially rectangular second through-hole 783S may be provided at the center of the second member 78S. The second through-hole 783S may be disposed not to be inside openings of the first through-holes 773S when the first member 77S is stacked on the second member 78S. At this time, a second area 778S of the channel 774S may be inside an opening of the second through-hole 783S. Consequently, the second through-hole 783S may serve as a second passable portion, allowing the target material to flow between the second surface 781S and a second space 784S, which is beside a fourth surface 782S opposite to the second surface 781S, through the second area 778S of the channel 774S.

3.12.8 Eighth Modification

Figure 26:
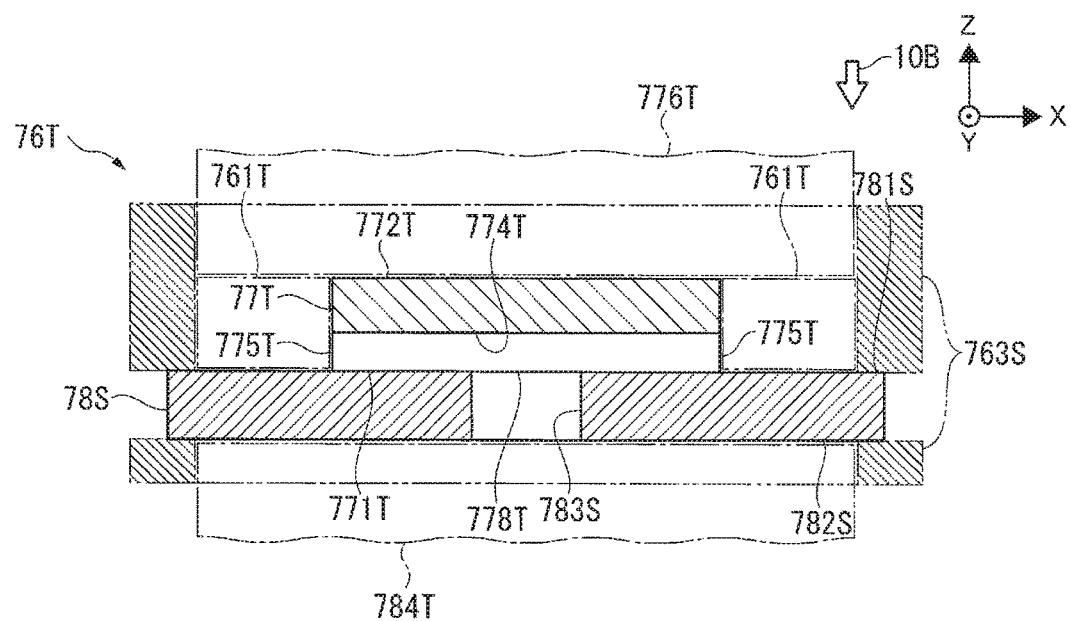
FIG. 26 is a sectional view of a filter according to an eighth modification.

FIG. 26 is a sectional view of a filter according to an eighth modification.

As shown in FIG. 26, a filter 76T may include a first member 77T and the second member 78S.

The first member 77T may be in the shape of a rectangular plate. The outline of the first member 77T may be larger than the outline of the second through-hole 783S of the second member 78S.

A single channel 774T may be provided to a first surface 771T of the first member 77T facing in the −Z direction. The channel 774T may extend from an outer periphery of the first member 77T facing in the +X direction to an outer periphery thereof facing in the −X direction.

The second member 78S may be stacked on the first member 77T in the −Z direction. The second member 78S may be set with the second surface 781S thereof covering the channel 774S. At this time, the first member 77T and the second member 78S may be interposed between seal members 763T.

Ends of the channel 774T facing in the +X direction and the −X direction may be defined as a first area 775T. Consequently, the part of the second surface 781S projecting outward from the first surface 771T and a side space 761E facing the outer periphery of the first member 77T may serve as a first passable portion, allowing the target material to flow between the first surface 771T and a first space 776T, which is beside a third surface 772T opposite to the first surface 771T, through the first area 775T of the channel 774T.

A second area 778T of the channel 774T may be inside an opening of the second through-hole 783S. Consequently, the second through-hole 783S may serve as a second passable portion, allowing the target material to flow between the second surface 781S and a second space 784S, which is beside a fourth surface 782S opposite to the second surface 781S, through the second area 778T of the channel 774T.

3.12.9 Other Modification(s)

In the first to sixth exemplary embodiments and the modifications, the first and second members of the filters 76A, 76B, 76C, 76D, 76E, 76F, 76L, 76M, 76N, 76P, 76Q, 76R, 76S and 76T may each be inversely stacked on each other in use. The filters 76A, 76B, 76C, 76D, 76E, 76F, 76L, 76M, 76N, 76P, 76Q, 76R, 76S and 76T may each be stacked in the target supply device.

In the exemplary embodiments and the modifications, channels may be provided to both of the first and second members.

In the exemplary embodiments and the modifications, a combination of the first and second members may be changed.

The above-described exemplary embodiments and the modifications thereof are merely examples for implementing the present disclosure, and the present disclosure is not limited thereto. It would be obvious for those skilled in the art that various modifications may be made within the scope of the present disclosure.

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" in the specification and claim(s) should be interpreted as "at least one" or "one or more."

What is claimed is:

1. A filter comprising:
a first member having a first surface provided with a plurality of grooves; and
a second member set with a second surface thereof covering the plurality of grooves,
the first member including a first passable portion that allows a fluid to pass between the first surface and a first space, which is defined beside a surface of the first member opposite to the first surface, through a first area of the plurality of grooves,
the second member including a second passable portion that allows the fluid to pass between the second surface and a second space, which is defined beside a surface of the second member opposite to the second surface, through a second area of the plurality of grooves distanced from the first area,
wherein the first member is made of a material selected from molybdenum, tungsten, aluminum oxide, silicon dioxide glass, silicon carbide, tungsten carbide, aluminum nitride, zirconium boride, and boron carbide, and
wherein the second member exposes a part of the plurality of grooves therethrough to the second space.

2. The filter according to claim 1, wherein the first passable portion is defined by a first through-hole penetrating through the first member.

3. The filter according to claim 2, wherein the first through-hole penetrates through a substantial center of the first member.

4. The filter according to claim 3, wherein the plurality of grooves includes a radial portion in which the grooves are formed radially around the first through-hole.

5. The filter according to claim 4, wherein a width of each of the grooves in the radial portion becomes larger as going away from the first through-hole.

6. The filter according to claim 3, wherein the plurality of grooves includes an annular portion in which the grooves are formed concentrically around the first through-hole.

7. The filter according to claim 6, wherein a width of each of the grooves becomes larger as going away from the first through-hole.

8. The filter according to claim 6, wherein the plurality of grooves further includes a radial portion in which the grooves are formed radially around the first through-hole.

9. The filter according to claim 8, wherein the plurality of grooves further includes a crossing portion where a groove in the annular portion and a groove in the radial portion are crossed, and the second member exposes the crossing portion therethrough to the second space.

10. The filter according to claim 1, wherein
the first member is roll-pressed substantially into a plate shape, and the plurality of grooves extend in a direction intersecting with a roll-press direction of the first member.

11. The filter according to claim 1, wherein the first member includes:
a first plate-shaped member; and
a second plate-shaped member stacked on the first plate-shaped member, and the plurality of grooves include a third through-hole penetrating through the second plate-shaped member.

12. The filter according to claim 1, wherein
the second member is disposed with a part of the second surface projecting from the first surface,
the plurality of grooves reach an outer periphery of the first member, and
the first passable portion is defined by the part of the second surface projecting from the first surface and a side space facing the outer periphery of the first member.

13. The filter according to claim 1, wherein
the first member is disposed with a part of the first surface projecting from the second surface,
the plurality of grooves reach an outer periphery of the second member, and
the second passable portion is defined by the part of the first surface projecting from the second surface and a side space facing the outer periphery of the second member.

14. The filter according to claim 1, wherein the second member is made of a material selected from molybdenum, tungsten, aluminum oxide, silicon dioxide glass, silicon carbide, tungsten carbide, aluminum nitride, zirconium boride, and boron carbide.

15. A filter comprising:
a first member having a first surface provided with a plurality of grooves; and
a second member set with a second surface thereof covering the plurality of grooves, the first member including a first passable portion that allows a fluid to pass between the first surface and a first space, which is defined beside a surface of the first member opposite to the first surface, through a first area of the plurality of grooves, the second member including a second passable portion that allows the fluid to pass between the second surface and a second space, which is defined beside a surface of the second member opposite to the second surface, through a second area of the plurality of grooves distanced from the first area,
wherein the first member is made of a material selected from molybdenum, tungsten, aluminum oxide, silicon dioxide glass, silicon carbide, tungsten carbide, aluminum nitride, zirconium boride, and boron carbide,
wherein the second member is made of a material selected from molybdenum, tungsten, aluminum oxide, silicon dioxide glass, silicon carbide, tungsten carbide, aluminum nitride, zirconium boride, and boron carbide, and
wherein the first member and the second member are diffusion-bonded to each other.

16. A filter comprising:
a first member having a first surface provided with a plurality of grooves; and a second member set with a second surface thereof covering the plurality of grooves, the first member including a first passable portion that allows a fluid to pass between the first surface and a first space, which is defined beside a surface of the first member opposite to the first surface, through a first area of the plurality of grooves,
the second member including a second passable portion that allows the fluid to pass between the second surface and a second space, which is defined beside a surface of the second member opposite to the second surface, through a second area of the plurality of grooves distanced from the first area,
wherein the second member is made of a material selected from molybdenum, tungsten, aluminum oxide, silicon dioxide glass, silicon carbide, tungsten carbide, aluminum nitride, zirconium boride, and boron carbide, and wherein the second member exposes a part of the plurality of grooves therethrough to the second space.

17. The filter according to claim 16, wherein the second passable portion is defined by a second through-hole penetrating through the second member.

18. The filter according to claim 17, wherein the second through-hole penetrates through a substantial center of the second member.

19. The filter according to claim 17, wherein the first passable portion is defined by a first through-hole penetrating through the first member.

20. The filter according to claim 19, wherein the first through-hole penetrates through a substantial center of the first member.

21. The filter according to claim 20, wherein the second passable portion is defined by a plurality of the second through-holes disposed circularly around the first through-hole.

22. The filter according to claim 21, wherein the first member and the second member are diffusion-bonded to each other.

* * * * *